US010554540B2

(12) United States Patent
Luo et al.

(10) Patent No.: US 10,554,540 B2
(45) Date of Patent: *Feb. 4, 2020

(54) CONTROLLING ALLOCATIONS FOR INDEPENDENT LINKS

(71) Applicant: QUALCOMM Incorporated, San Diego, CA (US)

(72) Inventors: Tao Luo, San Diego, CA (US); Juan Montojo, San Diego, CA (US); Tamer Kadous, San Diego, CA (US); Junyi Li, Chester, NJ (US); Xiaoxia Zhang, San Diego, CA (US); Jing Sun, San Diego, CA (US); Taesang Yoo, San Diego, CA (US); Siddhartha Mallik, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/659,580

(22) Filed: Jul. 25, 2017

(65) Prior Publication Data

US 2018/0054812 A1 Feb. 22, 2018

Related U.S. Application Data

(60) Provisional application No. 62/378,137, filed on Aug. 22, 2016, provisional application No. 62/447,534, filed on Jan. 18, 2017.

(51) Int. Cl.
*H04W 72/12* (2009.01)
*H04L 12/761* (2013.01)
(Continued)

(52) U.S. Cl.
CPC ............ *H04L 45/16* (2013.01); *H03M 13/09* (2013.01); *H04B 7/216* (2013.01); *H04L 5/0094* (2013.01);
(Continued)

(58) Field of Classification Search
CPC ... H04W 24/02; H04W 24/04; H04W 52/146; H04W 72/0413; H04W 72/044; H04W 72/0493; H04W 72/08; H04W 92/20
See application file for complete search history.

(56) References Cited

U.S. PATENT DOCUMENTS

| 8,693,383 B2 | 4/2014 | Damnjanovic et al. |
| 2008/0013612 A1 | 1/2008 | Miller et al. |

(Continued)

FOREIGN PATENT DOCUMENTS

| EP | 1523132 A2 | 4/2005 |
| EP | 2651167 A1 | 10/2013 |

(Continued)

OTHER PUBLICATIONS

International Search Report and Written Opinion—PCT/US2017/043966—ISA/EPO—Sep. 29, 2017.

*Primary Examiner* — Jean A Gelin
(74) *Attorney, Agent, or Firm* — Loza & Loza LLP

(57) ABSTRACT

Various aspects of the disclosure relate to controlling allocations for independent links. For example, a device may dynamically control the uplink/downlink allocations for different links. In some aspects, the independent links may involve a first device (e.g., a user equipment) communicating via different independent links with different devices (e.g., transmit receive points (TRPs) or sets of TRPs). At least one device may signal the uplink/downlink allocation for the different links. If the isolation between links is high, the links may use different time division duplexed (TDD) or frequency division duplexed (FDD) subframe structures. If the isolation is low or for certain types of information (e.g., control information), the direction of transmission for one link may be constrained to be the same as the direction of transmission for another link (e.g., the links may use the (Continued)

same TDD/FDD frame structures). Also, sounding on different links may be time division multiplexed.

8 Claims, 55 Drawing Sheets

(51) Int. Cl.
| | | |
|---|---|---|
| H03M 13/09 | (2006.01) | |
| H04L 12/18 | (2006.01) | |
| H04W 72/04 | (2009.01) | |
| H04W 72/08 | (2009.01) | |
| H04L 5/00 | (2006.01) | |
| H04B 7/216 | (2006.01) | |
| H04W 52/14 | (2009.01) | |
| H04W 52/16 | (2009.01) | |
| H04W 52/24 | (2009.01) | |
| H04W 52/38 | (2009.01) | |
| H04W 52/42 | (2009.01) | |
| H04W 52/50 | (2009.01) | |
| H04W 52/56 | (2009.01) | |
| H04L 12/24 | (2006.01) | |
| H04W 76/22 | (2018.01) | |
| H04W 24/08 | (2009.01) | |
| H04W 24/02 | (2009.01) | |
| H04W 76/19 | (2018.01) | |
| H04W 24/04 | (2009.01) | |
| H04W 48/08 | (2009.01) | |
| H04W 92/20 | (2009.01) | |

(52) U.S. Cl.
CPC ........ *H04L 12/185* (2013.01); *H04L 41/0668* (2013.01); *H04W 24/08* (2013.01); *H04W 52/146* (2013.01); *H04W 52/16* (2013.01); *H04W 52/241* (2013.01); *H04W 52/386* (2013.01); *H04W 52/42* (2013.01); *H04W 52/50* (2013.01); *H04W 52/56* (2013.01); *H04W 72/044* (2013.01); *H04W 72/0406* (2013.01); *H04W 72/0413* (2013.01); *H04W 72/0493* (2013.01); *H04W 72/08* (2013.01); *H04W 72/1252* (2013.01); *H04W 72/1278* (2013.01); *H04W 72/1284* (2013.01); *H04W 76/22* (2018.02); *H04L 5/003* (2013.01); *H04L 5/0053* (2013.01); *H04L 12/1827* (2013.01); *H04W 24/02* (2013.01); *H04W 24/04* (2013.01); *H04W 48/08* (2013.01); *H04W 72/12* (2013.01); *H04W 76/19* (2018.02); *H04W 92/20* (2013.01)

(56) References Cited

U.S. PATENT DOCUMENTS

| | | | |
|---|---|---|---|
| 2008/0075178 A1* | 3/2008 | Lappetelainen | H04B 7/155 375/260 |
| 2008/0130612 A1 | 6/2008 | Gorokhov et al. | |
| 2008/0279167 A1* | 11/2008 | Cardei | H04W 28/26 370/342 |
| 2009/0325481 A1* | 12/2009 | Mohebbi | H04B 7/1555 455/15 |
| 2010/0177670 A1 | 7/2010 | Hottinen | |
| 2010/0273515 A1 | 10/2010 | Fabien et al. | |
| 2010/0273520 A1 | 10/2010 | Pelletier et al. | |
| 2010/0285811 A1 | 11/2010 | Toda et al. | |
| 2011/0085610 A1 | 4/2011 | Zhuang et al. | |
| 2011/0246068 A1* | 10/2011 | Luo | G01C 21/3407 701/472 |
| 2012/0250558 A1 | 10/2012 | Chung et al. | |
| 2012/0281555 A1 | 11/2012 | Gao et al. | |
| 2012/0287965 A1 | 11/2012 | Sambhwani et al. | |
| 2013/0230112 A1* | 9/2013 | Schwager | H04B 3/542 375/257 |
| 2014/0056248 A1* | 2/2014 | Wang | H04W 72/042 370/329 |
| 2014/0056278 A1 | 2/2014 | Marinier et al. | |
| 2014/0133415 A1 | 5/2014 | Damnjanovic et al. | |
| 2014/0133471 A1 | 5/2014 | Nammi et al. | |
| 2014/0247743 A1 | 9/2014 | Seo | |
| 2014/0269625 A1* | 9/2014 | Surface | H04W 36/0085 370/332 |
| 2014/0286267 A1 | 9/2014 | Hui et al. | |
| 2014/0294106 A1* | 10/2014 | Cordeiro | H04B 7/0452 375/267 |
| 2014/0334473 A1* | 11/2014 | Zhang | H04B 7/0617 370/338 |
| 2015/0016309 A1 | 1/2015 | Fang et al. | |
| 2015/0016555 A1 | 1/2015 | Swope et al. | |
| 2015/0036610 A1 | 2/2015 | Kim et al. | |
| 2015/0282122 A1* | 10/2015 | Kim | H04L 25/03898 370/329 |
| 2015/0351135 A1 | 12/2015 | Schmidt et al. | |
| 2015/0382375 A1 | 12/2015 | Bhushan et al. | |
| 2016/0021548 A1 | 1/2016 | Raghavan et al. | |
| 2016/0050001 A1 | 2/2016 | Kang et al. | |
| 2016/0066195 A1 | 3/2016 | Moon et al. | |
| 2016/0080051 A1 | 3/2016 | Sajadieh et al. | |
| 2016/0087877 A1 | 3/2016 | Ryu et al. | |
| 2016/0127024 A1 | 5/2016 | Morita et al. | |
| 2016/0183203 A1 | 6/2016 | Larsson et al. | |
| 2016/0190707 A1 | 6/2016 | Park et al. | |
| 2016/0219475 A1 | 7/2016 | Kim et al. | |
| 2016/0249198 A1 | 8/2016 | Kim et al. | |
| 2016/0269885 A1 | 9/2016 | Kim et al. | |
| 2017/0070914 A1* | 3/2017 | Chun | H04W 4/70 |
| 2017/0125884 A1* | 5/2017 | Bard | H01Q 9/30 |
| 2017/0142652 A1 | 5/2017 | Liu et al. | |
| 2017/0164310 A1 | 6/2017 | Jeong et al. | |
| 2017/0346544 A1 | 11/2017 | Islam et al. | |
| 2018/0027594 A1 | 1/2018 | Nagaraja et al. | |
| 2018/0054348 A1 | 2/2018 | Luo et al. | |
| 2018/0054382 A1 | 2/2018 | Luo et al. | |
| 2018/0054783 A1 | 2/2018 | Luo et al. | |
| 2018/0054811 A1 | 2/2018 | Luo et al. | |
| 2018/0054830 A1 | 2/2018 | Luo et al. | |
| 2018/0054832 A1 | 2/2018 | Luo et al. | |
| 2019/0075526 A1* | 3/2019 | Nagaraj | H04B 7/0408 |

FOREIGN PATENT DOCUMENTS

| | | |
|---|---|---|
| EP | 2747304 A1 | 6/2014 |
| EP | 2947807 A1 | 11/2015 |
| WO | WO-2011022733 A2 | 2/2011 |
| WO | WO-2013025562 A2 | 2/2013 |
| WO | WO-2013119169 A2 | 8/2013 |
| WO | WO-2015047184 A1 | 4/2015 |
| WO | WO-2016014192 A1 | 1/2016 |
| WO | WO-2016122387 A1 | 8/2016 |
| WO | WO-2016127403 A1 | 8/2016 |

* cited by examiner

CONTROLLING ALLOCATIONS FOR INDEPENDENT LINKS

CROSS-REFERENCE TO RELATED APPLICATION(S)

This application claims priority to and the benefit of provisional patent application No. 62/378,137 filed in the U.S. Patent and Trademark Office on Aug. 22, 2016, and provisional patent application No. 62/447,534 filed in the U.S. Patent and Trademark Office on Jan. 18, 2017, the entire content of each of which is incorporated herein by reference.

INTRODUCTION

Various aspects described herein relate to wireless communication and, more particularly but not exclusively, to controlling allocations for independent links.

Wireless communication networks are widely deployed to provide various communication services such as telephony, video, data, messaging, broadcasts, and so on. Such networks, which are usually multiple access networks, support communication for multiple users (e.g., where a user uses a device such as a user equipment, UE) by sharing the available network resources.

A UE may be served by multiple transmit-receive points (TRPs). For example, coordinate multi-point (CoMP) techniques use joint transmission or dynamic point selection to enable a UE to communicate with different TRPs (e.g., gNodeBs or eNodeBs) on different links. Accordingly, there is a need for techniques that enable devices to effectively communicate via multiple links.

SUMMARY

The following presents a simplified summary of some aspects of the disclosure to provide a basic understanding of such aspects. This summary is not an extensive overview of all contemplated features of the disclosure, and is intended neither to identify key or critical elements of all aspects of the disclosure nor to delineate the scope of any or all aspects of the disclosure. Its sole purpose is to present various concepts of some aspects of the disclosure in a simplified form as a prelude to the more detailed description that is presented later.

In some aspects, the disclosure provides a method for communication including: determining an interaction between a first wireless communication link and a second wireless communication link, wherein communication via the first wireless communication link is independent of communication via the second wireless communication link; and allocating at least one resource for at least one of the first wireless communication link or the second wireless communication link, wherein the allocation is based on the determined interaction.

Another aspect of the disclosure provides an apparatus configured for communication that includes a memory and a processor coupled to the memory. The processor and the memory are configured to: determine an interaction between a first wireless communication link and a second wireless communication link, wherein communication via the first wireless communication link is independent of communication via the second wireless communication link; and allocate at least one resource for at least one of the first wireless communication link or the second wireless communication link, wherein the allocation is based on the determined interaction.

Another aspect of the disclosure provides an apparatus configured for communication. The apparatus including: means for determining an interaction between a first wireless communication link and a second wireless communication link, wherein communication via the first wireless communication link is independent of communication via the second wireless communication link; and means for allocating at least one resource for at least one of the first wireless communication link or the second wireless communication link, wherein the allocation is based on the determined interaction.

Another aspect of the disclosure provides a non-transitory computer-readable medium storing computer-executable code, including code to: determine an interaction between a first wireless communication link and a second wireless communication link, wherein communication via the first wireless communication link is independent of communication via the second wireless communication link; and allocate at least one resource for at least one of the first wireless communication link or the second wireless communication link, wherein the allocation is based on the determined interaction.

These and other aspects of the disclosure will become more fully understood upon a review of the detailed description, which follows. Other aspects, features, and implementations of the disclosure will become apparent to those of ordinary skill in the art, upon reviewing the following description of specific implementations of the disclosure in conjunction with the accompanying figures. While features of the disclosure may be discussed relative to certain implementations and figures below, all implementations of the disclosure can include one or more of the advantageous features discussed herein. In other words, while one or more implementations may be discussed as having certain advantageous features, one or more of such features may also be used in accordance with the various implementations of the disclosure discussed herein. In similar fashion, while certain implementations may be discussed below as device, system, or method implementations it should be understood that such implementations can be implemented in various devices, systems, and methods.

BRIEF DESCRIPTION OF THE DRAWINGS

The accompanying drawings are presented to aid in the description of aspects of the disclosure and are provided solely for illustration of the aspects and not limitations thereof.

DETAILED DESCRIPTION

Figure 1:
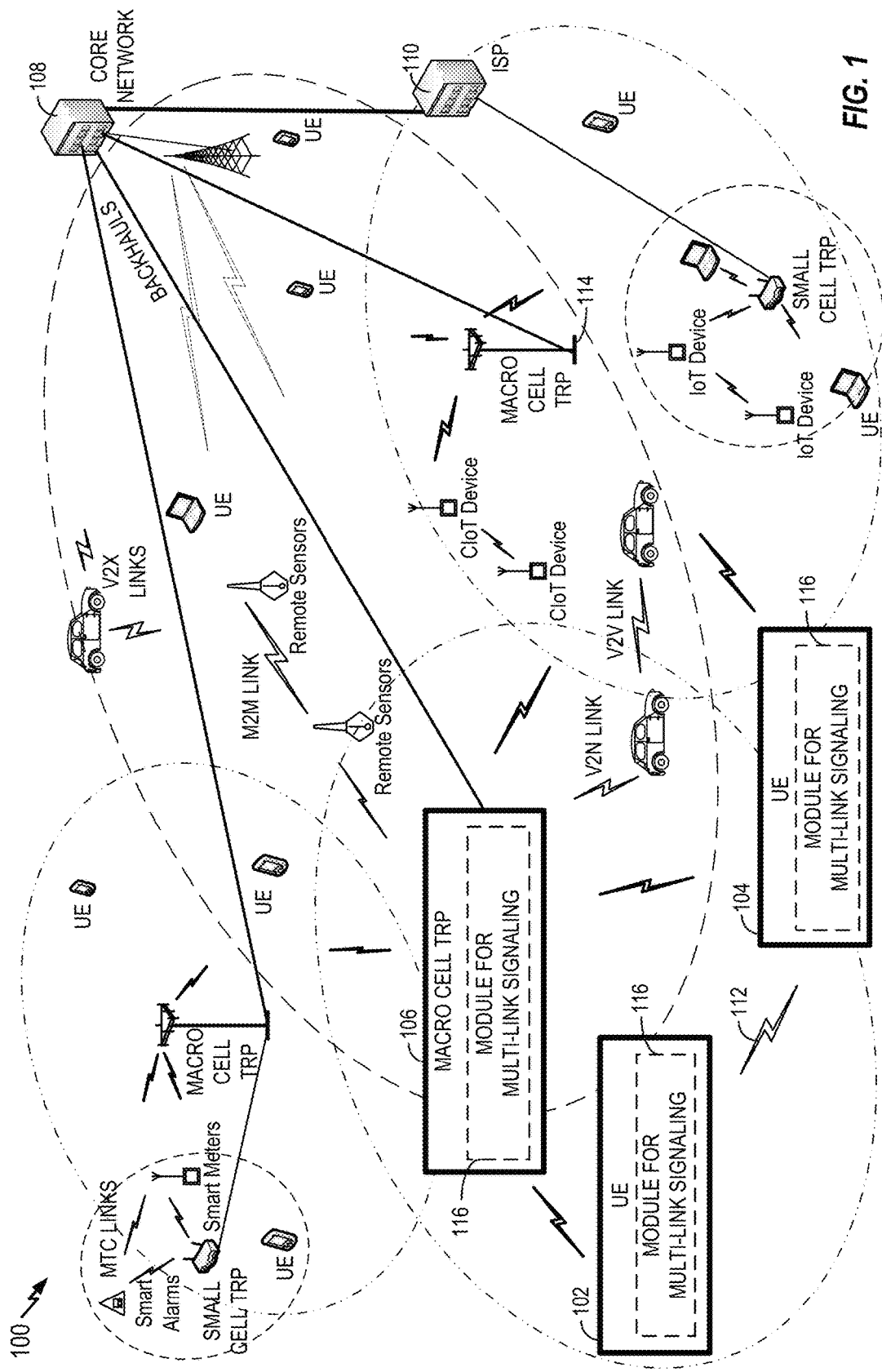
FIG. 1 is a block diagram of an example communication system within which aspects of the disclosure may be implemented.

The disclosure relates in some aspects to communicating via multiple independent links. For example, a user equipment (UE) may communicate via different independent links with different transmit receive points (TRPs) or sets of TRPs. In some aspects, transport blocks carried by a particular one of the independent links are processed independently of the transport blocks carried by any of the other independent links. In some aspects, different links may be associated with different beams.

The disclosure relates in some aspects to different operations for multi-link, multi-beam communication. In a first implementation, links are grouped together as a channel sensing group. In a second implementation, control information for different links is sent over one or more of the links. A third implementation involves dynamically controlling the uplink and downlink allocations for different links. In a fourth implementation, power control at a device is based on transmissions on multiple links. In a fifth implementation, channel state feedback is based on the channel state of multiple links. A sixth implementation involves sending beam information for one link on at least one other link. In a seventh implementation, event triggers are based on measurements from multiple links.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. Moreover, alternate configurations may be devised without departing from the scope of the disclosure. Additionally, well-known elements will not be described in detail or will be omitted so as not to obscure the relevant details of the disclosure.

The various concepts presented throughout this disclosure may be implemented across a broad variety of telecommunication systems, network architectures, and communication standards. For example, the 3rd Generation Partnership Project (3GPP) is a standards body that defines several wireless communication standards for networks involving the evolved packet system (EPS), frequently referred to as long-term evolution (LTE) networks. Evolved versions of the LTE network, such as a fifth-generation (5G) network, may provide for many different types of services or applications, including but not limited to web browsing, video streaming, VoIP, mission critical applications, multi-hop networks, remote operations with real-time feedback (e.g., tele-surgery), etc. Thus, the teachings herein can be implemented according to various network technologies including, without limitation, 5G technology, fourth generation (4G) technology, third generation (3G) technology, and other network architectures. Similarly, various aspects of the disclosure may be extended to networks based on 3rd Generation Partnership Project (3GPP) Long Term Evolution (LTE), LTE-Advanced (LTE-A) (in FDD, TDD, or both modes), Universal Mobile Telecommunications System (UMTS), Global System for Mobile Communications (GSM), Code Division Multiple Access (CDMA), Evolution-Data Optimized (EV-DO), Ultra Mobile Broadband (UMB), IEEE 802.11 (Wi-Fi), IEEE 802.16 (WiMAX), IEEE 802.20, Ultra-Wideband (UWB), Bluetooth, and/or other suitable systems. Also, the techniques described herein may be used for a downlink, an uplink, a peer-to-peer link, or some other type of link.

The actual telecommunication standard, network architecture, and/or communication standard used will depend on the specific application and the overall design constraints imposed on the system. For purposes of illustration, the following may describe various aspects in the context of a 5G system, a millimeter wave (mmW) system, or an LTE system. It should be appreciated, however, that the teachings herein may be used in other systems as well. Thus, references to functionality in the context of 5G, mmW, or LTE terminology should be understood to be equally applicable to other types of technology, networks, components, signaling, and so on.

Example Communication System

FIG. 1 illustrates an example of a wireless communication system 100 where a user equipment (UE) can communicate with other devices via wireless communication signaling. For example, a first UE 102 and a second UE 104 may communicate with a transmit receive point (TRP) 106 using wireless communication resources managed by the TRP 106 and/or other network components (e.g., a core network 108, an internet service provider (ISP) 110, peer devices, and so on). In some implementations, one or more of the components of the system 100 may communicate with each other directedly via a device-to-device (D2D) link 112 or some other similar type of direct link.

Communication of information between two or more of the components of the system 100 may involve multiple independent links. For example, the UE 102 may communicate with the TRP 106 via a first link and communicate with a TRP 114 via a second link. Alternatively, or in addition, some other component of the system 100 may communicate via two or more independent links. Thus, in accordance with the teachings herein, one or more of the UE 102, the UE 104, the TRP 106, or some other component of the system 100 may include a module for multi-link signaling 116.

The components and links of the wireless communication system 100 may take different forms in different implementations. For example, and without limitation, UEs may be cellular devices, Internet of Things (IoT) devices, cellular IoT (CIoT) devices, LTE wireless cellular devices, machine-type communication (MTC) cellular devices, smart alarms, remote sensors, smart phones, mobile phones, smart meters, personal digital assistants (PDAs), personal computers, mesh nodes, and tablet computers.

In some aspects, a TRP may refer to a physical entity that incorporates radio head functionality for a particular physical cell. In some aspects, the TRP may include 5G new radio (NR) functionality with an air interface based on orthogonal frequency division multiplexing (OFDM). NR may support, for example and without limitation, enhanced mobile broadband (eMBB), mission-critical services, and wide-scale deployment of IoT devices. The functionality of a TRP may be similar in one or more aspects to (or incorporated into) the functionality of a CIoT base station (C-BS), a NodeB, an evolved NodeB (eNodeB), radio access network (RAN)

access node, a radio network controller (RNC), a base station (BS), a radio base station (RBS), a base station controller (BSC), a base transceiver station (BTS), a transceiver function (TF), a radio transceiver, a radio router, a basic service set (BSS), an extended service set (ESS), a macro cell, a macro node, a Home eNB (HeNB), a femto cell, a femto node, a pico node, or some other suitable entity. In different scenarios (e.g., NR, LTE, etc.), a TRP may be referred to as a gNodeB (gNB), an eNB, a base station, or referenced using other terminology.

Various types of network-to-device links and D2D links may be supported in the wireless communication system 100. For example, D2D links may include, without limitation, machine-to-machine (M2M) links, MTC links, vehicle-to-vehicle (V2V) links, and vehicle-to-anything (V2X) links. Network-to-device links may include, without limitation, uplinks (or reverse links), downlinks (or forward links), and vehicle-to-network (V2N) links.

Example Independent Links

Figure 2:
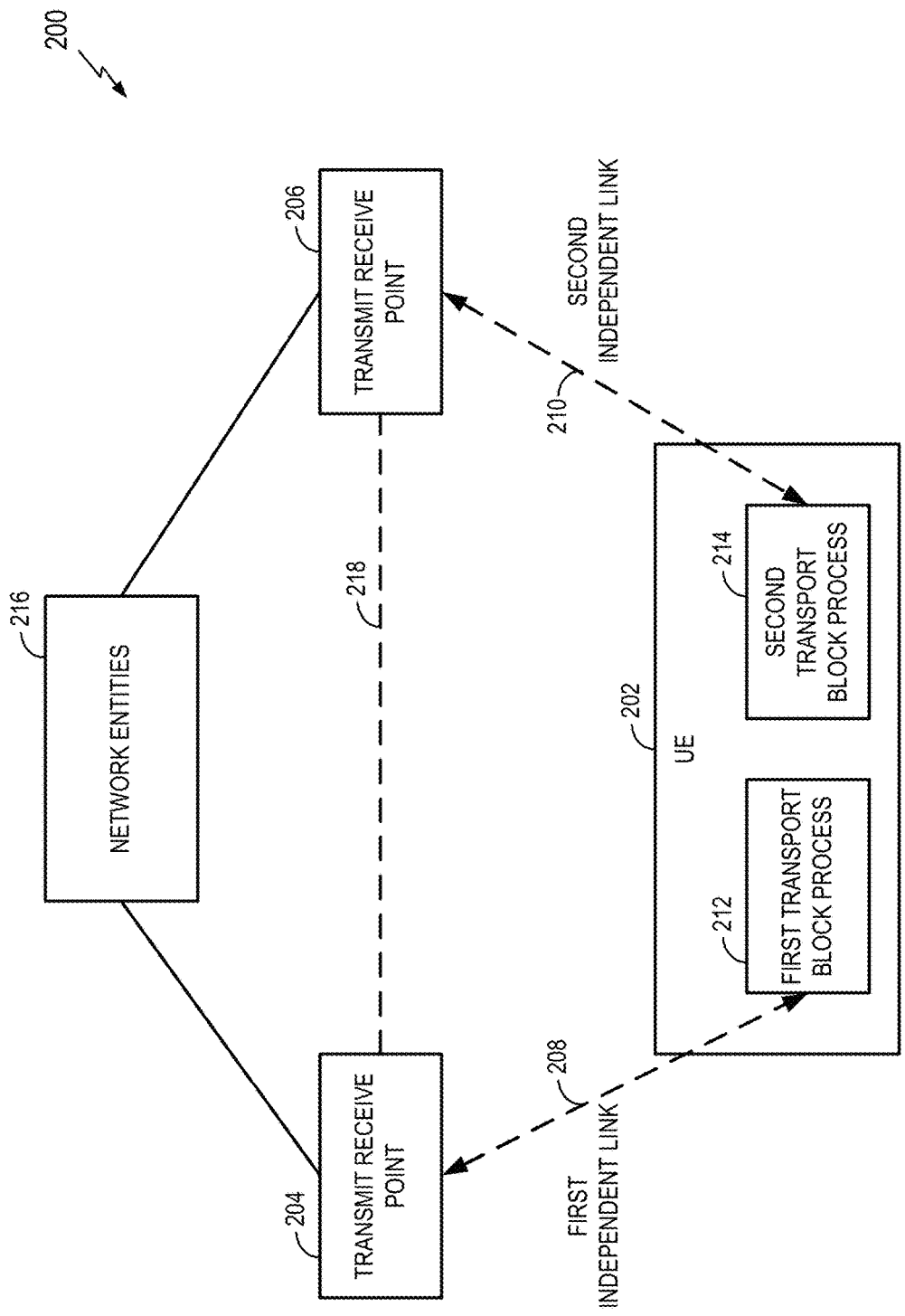
FIG. 2 is a block diagram of an example communication system for communicating via multiple independent links in accordance with some aspects of the disclosure.

FIG. 2 illustrates a communication system 200 where a user equipment (UE) 202 communicates with at least one transmit receive point (TRP) 204 and at least one TRP 206 via independent links 208 and 210, respectively. In different implementations, the TRP 204 may be a single TRP or a set of TRPs. Similarly, the TRP 206 may be a single TRP or a set of TRPs. The number of independent links may be 2, 3, or more. To reduce the complexity of FIG. 2, only two links are shown. In some implementations, the UE 202 may correspond to the UE 102, the UE 104, or some other component of FIG. 1. In some implementations, the TRP 204 or the TRP 206 may correspond to the TRP 106, the TRP 114, or some other component of FIG. 1.

The links 208 and 210 are independent in the sense that UE 202 processes the transport blocks (TBs) for each link independently. For example, a first TB process 212 may process TBs for the link 208 independently of a second TB process 214 that processes TBs for the link 210. In some aspects, this independent processing relates to error checks for the TBs. For example, the TBs for different links may be covered by their own independent cyclic redundancy check (CRC) value. Thus, in this case, a CRC process run by the first TB process 212 is independent of a CRC process run by the second TB process 214.

A TRP may establish multiple independent links for a UE. For example, after establishing a first link with a UE, a TRP may configure at least one other TRP to establish at least one other link with the UE. In some aspects, each link may have its own unique identifier (ID) and use a unique scrambling ID.

In some aspects, a TRP may refer to a physical entity that incorporates radio head functionality for a particular physical cell. This functionality may be similar in one or more aspects to (or incorporated into) the functionality of a NodeB, an eNodeB, a gNodeB, a radio network controller (RNC), a base station (BS), a radio base station (RBS), a base station controller (BSC), a base transceiver station (BTS), a transceiver function (TF), a radio transceiver, a radio router, a basic service set (BSS), an extended service set (ESS), a macro cell, a macro node, a Home eNB (HeNB), a femto cell, a femto node, a pico node, or some other similar entity. The TRPs 204 and 206 of FIG. 2 may communicate with each other via network entities 216, a direct communication link 218, or some other link.

Example Beamforming System

Figure 3:
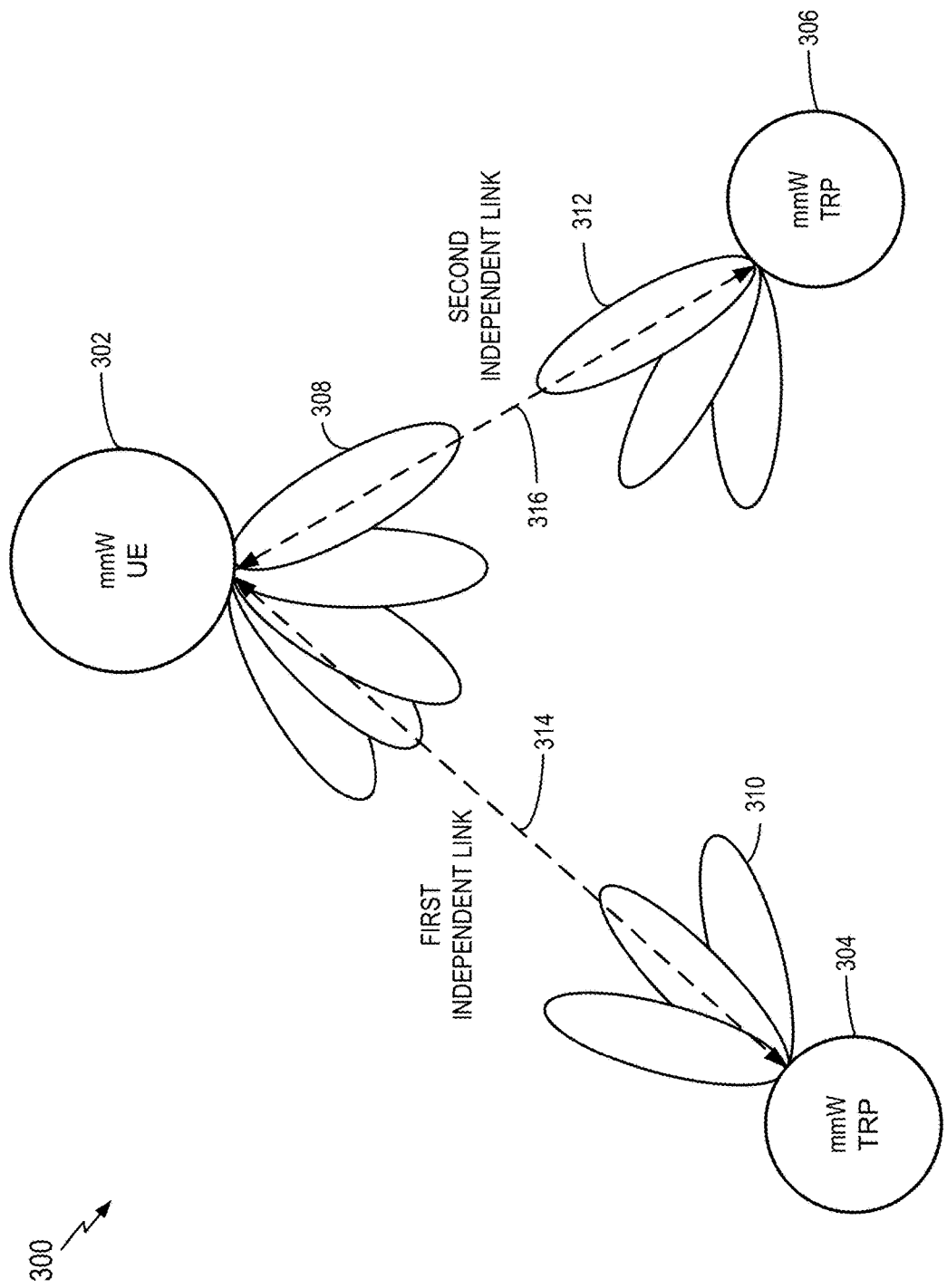
FIG. 3 is a block diagram of an example communication system using beamforming within which aspects of the disclosure may be implemented.

In some implementations, multiple independent links are used by an apparatus equipped with multiple transmit antennas and multiple receive antennas. One example is a millimeter wave (mmW) system where multiple antennas are used for beamforming (e.g., in the range of 30 GHz, 60 GHz, etc.). For example, an apparatus may communicate with other apparatuses in a time-division-multiplexing (TDM) or time-division-duplexing (TDD) manner That is, a particular apparatus may transmit to (or receive from) a first apparatus in a first time interval and then transmit to (or receive from) a second apparatus subsequently in a second time interval FIG. 3 illustrates a communication system 300 where a mmW UE 302 communicates with a first mmW TRP 304 and a second mmW TRP 306 via different beamforming directions. In some aspects, the mmW UE 302, the first mmW TRP 304, and the second mmW TRP 306 may correspond to the UE 202, the at least one TRP 204, and the at least one TRP 206 of FIG. 2, respectively.

As indicated by a set of beams 308, the mmW UE 302 may communicate via any one of a plural of directional beams. As indicated by a set of beams 310, the first mmW TRP 304 may communicate via any one of a plural of directional beams. As indicated by a set of beams 312, the second mmW TRP 306 may communicate via any one of a plural of directional beams. For example, the UE 302 may communicate with the first mmW TRP 304 via a first beamforming direction 314 and communicate with the second mmW TRP 306 via a second beamforming direction 316.

Example Beamforming Apparatus

Figure 4:
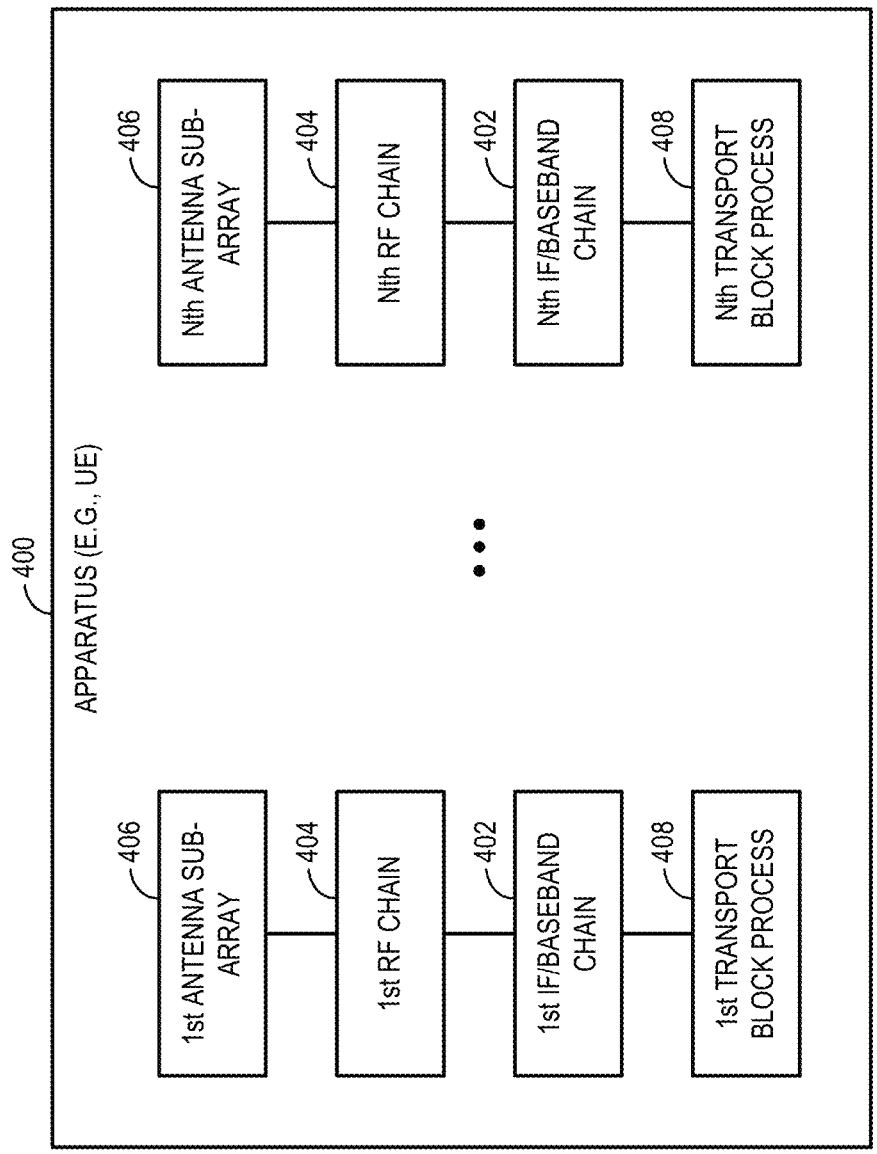
FIG. 4 is a block diagram of an example apparatus that supports independent links in accordance with some aspects of the disclosure.

FIG. 4 illustrates in more detail an apparatus 400 (e.g., a UE) that supports multiple independent links and beams. In some aspects, the apparatus 400 may correspond to the UE 202 of FIG. 2 or the mmW UE 302 of FIG. 3.

The apparatus has "N" intermediate frequency (IF)/baseband chains 402. N could be 2 or more. Each IF chain can be connected to multiple RF chains 404 (M). M may be one or more. Each RF chain may connect to one antenna element (e.g., sub-array) 406. Thus, each IF/baseband chain 402 (e.g., used for a corresponding TB process 408) can be connected to different sub-arrays at the apparatus. Sub-arrays at the apparatus may be used to improve robustness due to the dynamics of a mmW channel (e.g., blocking). That is, antenna diversity may improve communication performance at an apparatus. For example, if one link (or more than one link) is blocked, the apparatus may still communicate via another link or other links.

In a mmW system, multiple sub-arrays may be used at an apparatus to cover different beam directions. In some implementations, rank 2 reception (e.g., for MIMO) at an apparatus may be achieved by dual polarization at one sub-array (e.g., a patch antenna). In some implementations, rank 2 reception at an apparatus may be achieved by {H,H}, {V,V}, {H,V}, {V,H} polarization where the H (horizontal) or V (vertical) polarizations are at different sub-arrays (e.g., dipole antennas).

Due to physical limitations, dual polarization may be difficult to achieve for some placements of the sub-array in an apparatus (e.g., a phone). For example, dual polarization may be difficult to achieve for a sub-array locating at the edges or tops of a phone.

Figure 5:
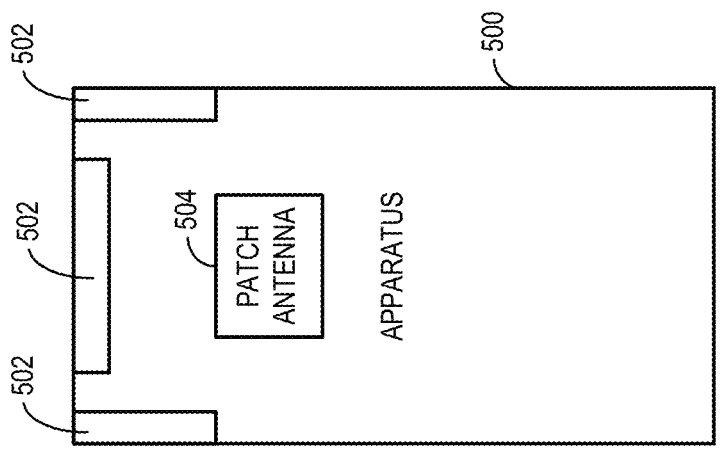
FIG. 5 is a diagram of example antenna sub-arrays for an apparatus in accordance with some aspects of the disclosure.

FIG. 5 illustrates an example of how antenna sub-arrays may be located in an apparatus 500 (e.g., a phone). In some aspects, the apparatus 500 may correspond to the UE 202 of FIG. 2, the mmW UE 302 of FIG. 3, or the apparatus 400 of FIG. 4.

Each dipole antenna 502 may be used for H or V polarization. The patch antenna 504 may be used for dual polarization.

The disclosure relates in some aspects, to using physical/spatial separation for different sub-arrays to enable each IF chain to be served by a corresponding TRP. Thus, two or more independent transport blocks (TBs) can be served by two or more different TRPs using two or more IF chains.

Figure 6:
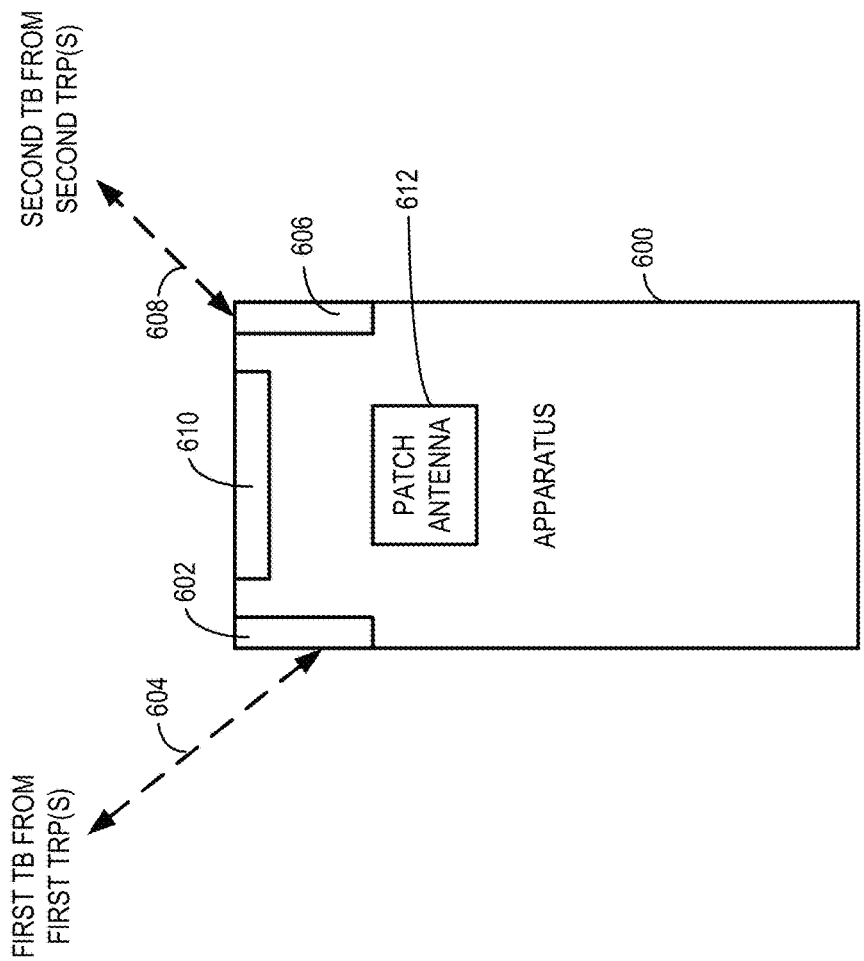
FIG. 6 is a diagram of example communication via antenna sub-arrays in accordance with some aspects of the disclosure.

For example, as shown in FIG. 6, a first antenna sub-array 602 of an apparatus 600 receives a first TB from a first set of TRPs (e.g., one or more TRPs) via a first link 604, while a second antenna sub-array 606 receives a second TB from a second set of TRPs (e.g., one or more TRPs) via a second link 608. Additional TBs may be received from other TRPs via other links. For example, a link may be established via a third sub-array 610, a patch antenna 612, or some other antenna (not shown). Each of these links may be independent as discussed above.

Since the antenna sub-arrays of the apparatus 600 (e.g., a UE) may have different polarizations (e.g., H or V), different TRPs may concurrently serve corresponding TBs for the apparatus 600 via the different antenna sub-arrays. For example, a first TRP may send TB1 to the first antenna sub-array 602 at the same time that a second TRP sends TB2 to the second antenna sub-array 606. In some aspects, the apparatus 600 may correspond to the UE 202 of FIG. 2, the mmW UE 302 of FIG. 3, the apparatus 400 of FIG. 4, or the apparatus 500 of FIG. 5.

Communication Via Multiple Independent Links

The disclosure relates in some aspects to sharing resources in various multi-link scenarios. In some aspects, each of the links may be independent as discussed herein (e.g., TBs for each link are processed independently).

In addition, as discussed above, a particular link may correspond to a particular beam transmitted and/or received via a particular sub-array or a particular set of sub-arrays. Thus, in some aspects, the disclosure relates in some aspects to sharing resources in various multi-link, multi-beam scenarios.

In accordance with the teachings herein, the following operations may be supported in conjunction with communication via multiple independent links: channel sensing for multiple links, control channel transmission/reception to/from multiple TRPs, HARQ feedback to multiple TRPs, sub-frame allocations for multiple links, power control for multiple links, uplink sounding for multiple links, downlink CSI reception for multiple links, beam switching procedures for multiple links, beam recovery procedures for multiple links, RACH procedures for multiple links, measurement for multiple links, and event triggers for multiple links. Several examples of these operations, generalized into channel sensing, control information, allocation, power control, channel state feedback, beam information, and event trigger categories, follow.

Multi-Link Channel Sensing

The disclosure relates in some aspects to a multi-link, multi-beam scenario that involves grouping links together as a channel sensing group. For example, the same channel sensing parameters may be used for the links in a group. As another example, a decision to transmit via one or more of the links in a group may be based on channel sensing for one or more of the links of the group (e.g., where the sensing for different links may cover different beam directions).

Figure 7:
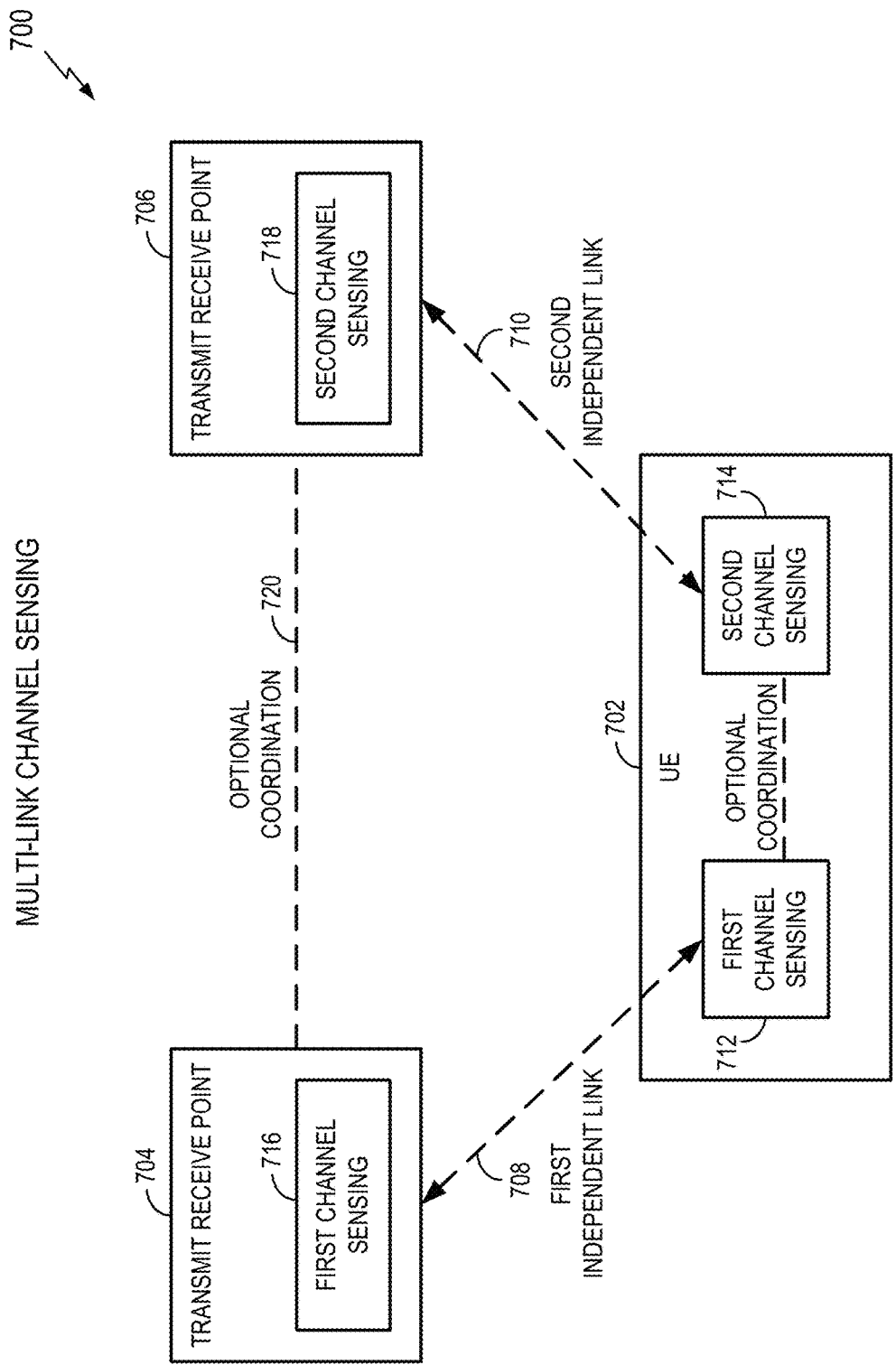
FIG. 7 is a block diagram illustrating an example of multi-link channel sensing in accordance with some aspects of the disclosure.

An example of this scenario is shown in FIG. 7. FIG. 7 illustrates a communication system 700 where a UE 702 communicates with a first TRP 704 via a first link 708 and with a second TRP 706 via a second link 710. The UE 702 includes functionality for first channel sensing 712 to acquire information about the channel for the first link 708 and functionality for second channel sensing 714 to acquire information about the channel for the second link 710. The first TRP 704 includes functionality for first channel sensing 716 to acquire information about the channel for the first link 708. The second TRP 706 includes functionality for second channel sensing 718 to acquire information about the channel for the second link 710. In some aspects, the UE 702 may correspond to the UE 202 of FIG. 2, the mmW UE 302 of FIG. 3, the apparatus 400 of FIG. 4, or the apparatus 500 of FIG. 5. In some aspects, the TRP 704 or the TRP 706 may correspond to the TRP 204 of FIG. 2, the TRP 206 of FIG. 2, the mmW TRP 304 of FIG. 3, or the mmW TRP 306 of FIG. 3.

In accordance with the teachings herein, any of the UE 702, the first TRP 704, or the second TRP 706 may support a channel sensing group for the first link 708 and the second link 710. For example, at the UE 702, the first channel sensing 712 and the second channel sensing 714 may cooperate to share sensing information or to use the same sensing parameters. As another example, the first channel sensing 716 of the first TRP 704 and the second channel sensing 718 of the second TRP 706 may cooperate (e.g., via a link 720) to share sensing information or to use the same sensing parameters.

These and other aspects of channel sensing in a multi-link scenario are discussed below in the section entitled Examples of Multi-Link Channel Sensing.

Multi-Link Control Information

The disclosure relates in some aspects to a multi-link, multi-beam scenario that involves sending control information for different links over one or more of the links. For example, one link may carry control information for multiple links (e.g., the control channel on one link may indicate the existence of or traffic on at least one other link; or one link may transmit feedback for multiple links). As another example, each link may be provisioned (e.g., as a primary link or a secondary link) to carry specific types of control information for one or more links.

Figure 8:
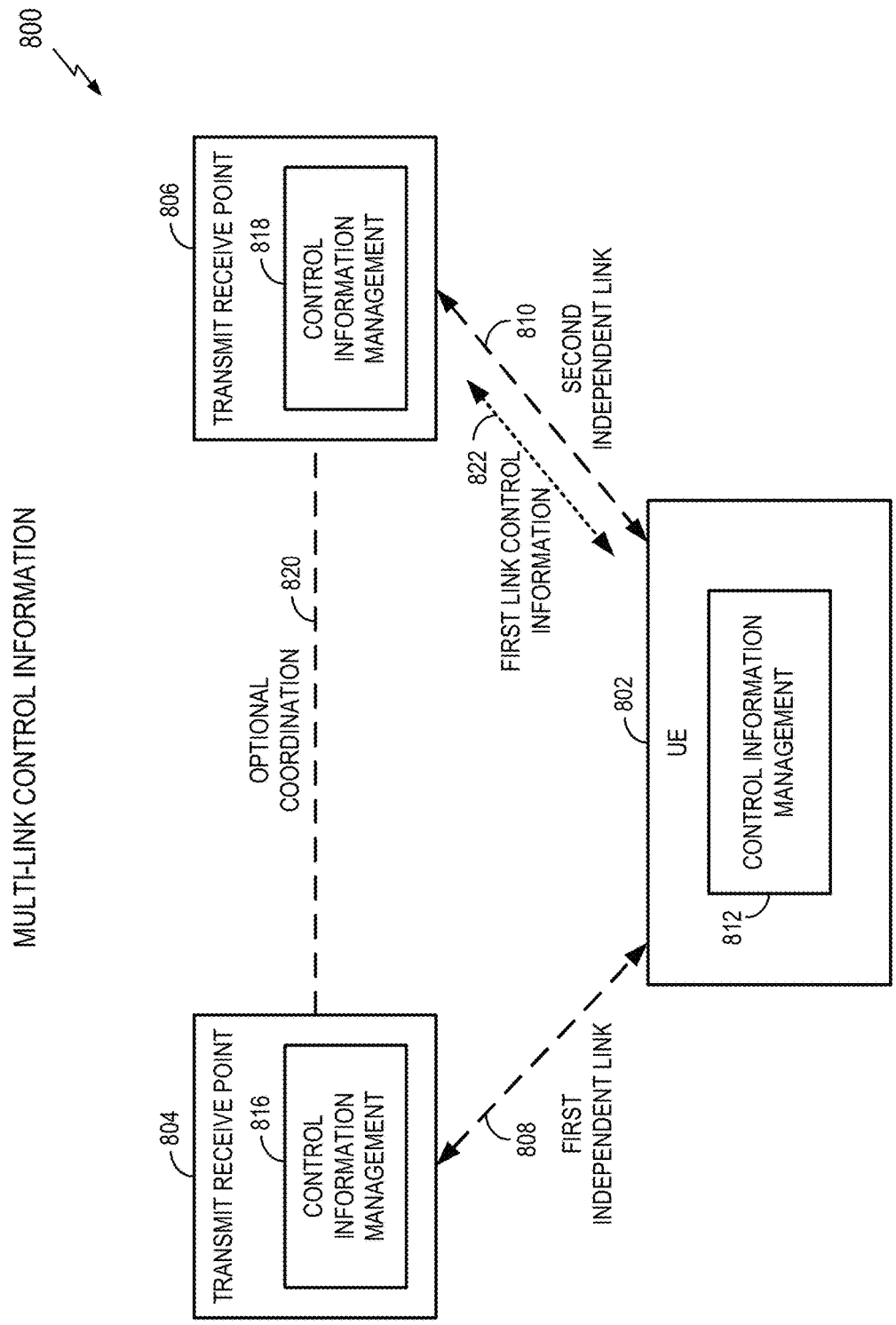
FIG. 8 is a block diagram illustrating an example of multi-link control information in accordance with some aspects of the disclosure.

An example of this scenario is shown in FIG. 8. FIG. 8 illustrates a communication system 800 where a UE 802 communicates with a first TRP 804 via a first link 808 and with a second TRP 806 via a second link 810. The UE 802 includes functionality for control information management 812 to send and receive control information via the first link 808 and the second link 810. The first TRP 804 includes functionality for control information management 816 to send and receive control information via the first link 808. The second TRP 806 includes functionality for control information management 818 to send and receive control information for the second link 810. In some aspects, the UE 802 may correspond to the UE 202 of FIG. 2, the mmW UE 302 of FIG. 3, the apparatus 400 of FIG. 4, or the apparatus 500 of FIG. 5. In some aspects, the TRP 804 or the TRP 806 may correspond to the TRP 204 of FIG. 2, the TRP 206 of FIG. 2, the mmW TRP 304 of FIG. 3, or the mmW TRP 306 of FIG. 3.

In accordance with the teachings herein, any of the UE 802, the first TRP 804, or the second TRP 806 may support sending control information for one link over another link. For example, the control information management 812 of the UE 802 may send first link control information 822 over the second link 810. As another example, control information management of the first TRP 804 may cooperate (e.g., via a link 820) with the control information management of the second TRP 806 to send first link control information 822 over the second link 810.

These and other aspects of communicating control information in a multi-link scenario are discussed below in the sections entitled Examples of Multi-Link Control Channel Communication, Examples of Link Indication, and Examples of Multi-Link HARQ Feedback.

Multi-Link Sub-Frame Allocation

The disclosure relates in some aspects to a multi-link, multi-beam scenario that involves dynamically controlling the uplink (UL) and downlink (DL) allocations for different links. For example, devices may signal the UL/DL allocation to be used for the different links. If the isolation between links is high, the links may use different TDD/FDD sub-frame structures. If the isolation is low or for certain types of information (e.g., control information), the direction of transmission for one link may be constrained to be the same as (or a subset of) the direction of transmission for another link (e.g., the links may use the same TDD/FDD frame structures). Also, sounding on different links may be time division multiplexed (TDM'ed).

Figure 9:
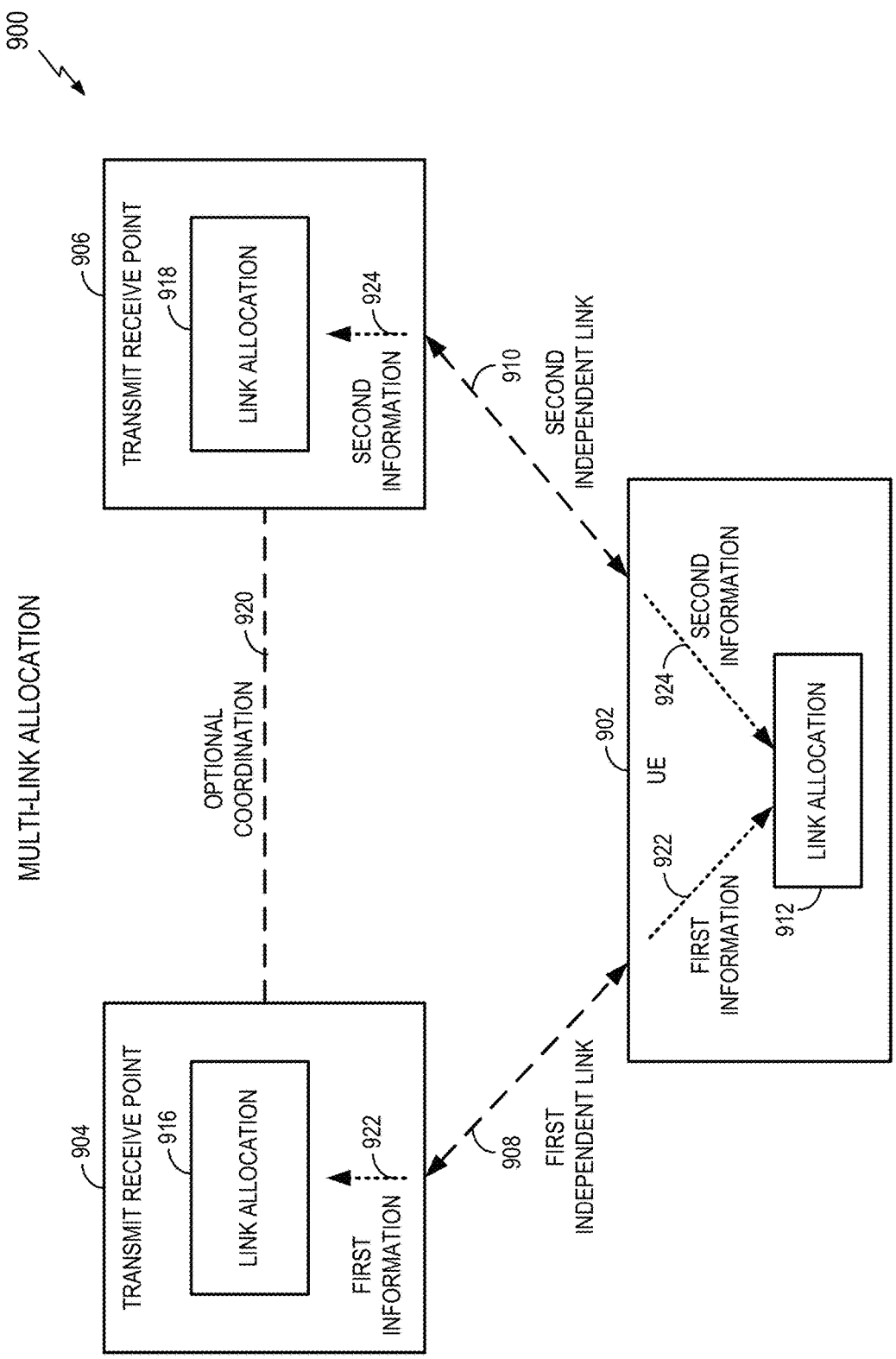
FIG. 9 is a block diagram illustrating an example of multi-link allocation in accordance with some aspects of the disclosure.

An example of this scenario is shown in FIG. 9. FIG. 9 illustrates a communication system 900 where a UE 902 communicates with a first TRP 904 via a first link 908 and with a second TRP 906 via a second link 910. The UE 902 includes functionality for link allocation 912 that allocates uplink and downlink resources based on first information 922 regarding the first link 908 and second information 924 regarding the second link 910. The first TRP 904 and the second TRP 906 may include similar functionality for link allocation 916 and 918, respectively. In some aspects, the UE 902 may correspond to the UE 202 of FIG. 2, the mmW UE 302 of FIG. 3, the apparatus 400 of FIG. 4, or the apparatus 500 of FIG. 5. In some aspects, the TRP 904 or the TRP 906 may correspond to the TRP 204 of FIG. 2, the TRP 206 of FIG. 2, the mmW TRP 304 of FIG. 3, or the mmW TRP 306 of FIG. 3.

In accordance with the teachings herein, any of the UE 902, the first TRP 904, or the second TRP 906 may allocate uplink and downlink resources based on the first information 922 and the second information 924. For example, the link allocation 912 of the UE 902 may allocate different TDD/FDD sub-frame structures for the first link 908 and the second link 910 if the first information 922 and the second information 924 indicate that the isolation between the first link 908 and the second link 910 is high. The link allocation 916 of the first TRP 904 and the link allocation 918 of the second TRP 906 make likewise cooperate (e.g., by sharing the first information 922 or the second information 924 via a link 920) to allocate sub-frame structures for the first link 908 and the second link 910.

These and other aspects of allocating resources in a multi-link scenario are discussed below in the sections entitled Examples of Multi-Link Sub-Frame Allocation and Examples of Multi-Link Sounding.

Multi-Link Power Control

The disclosure relates in some aspects to a multi-link, multi-beam scenario where power control at a device is based on transmissions on multiple links. For example, power control for a UE may be based on power control commands received on multiple links. As another example, a power control constraint may be met taking into account the transmission power on multiple links.

Figure 10:
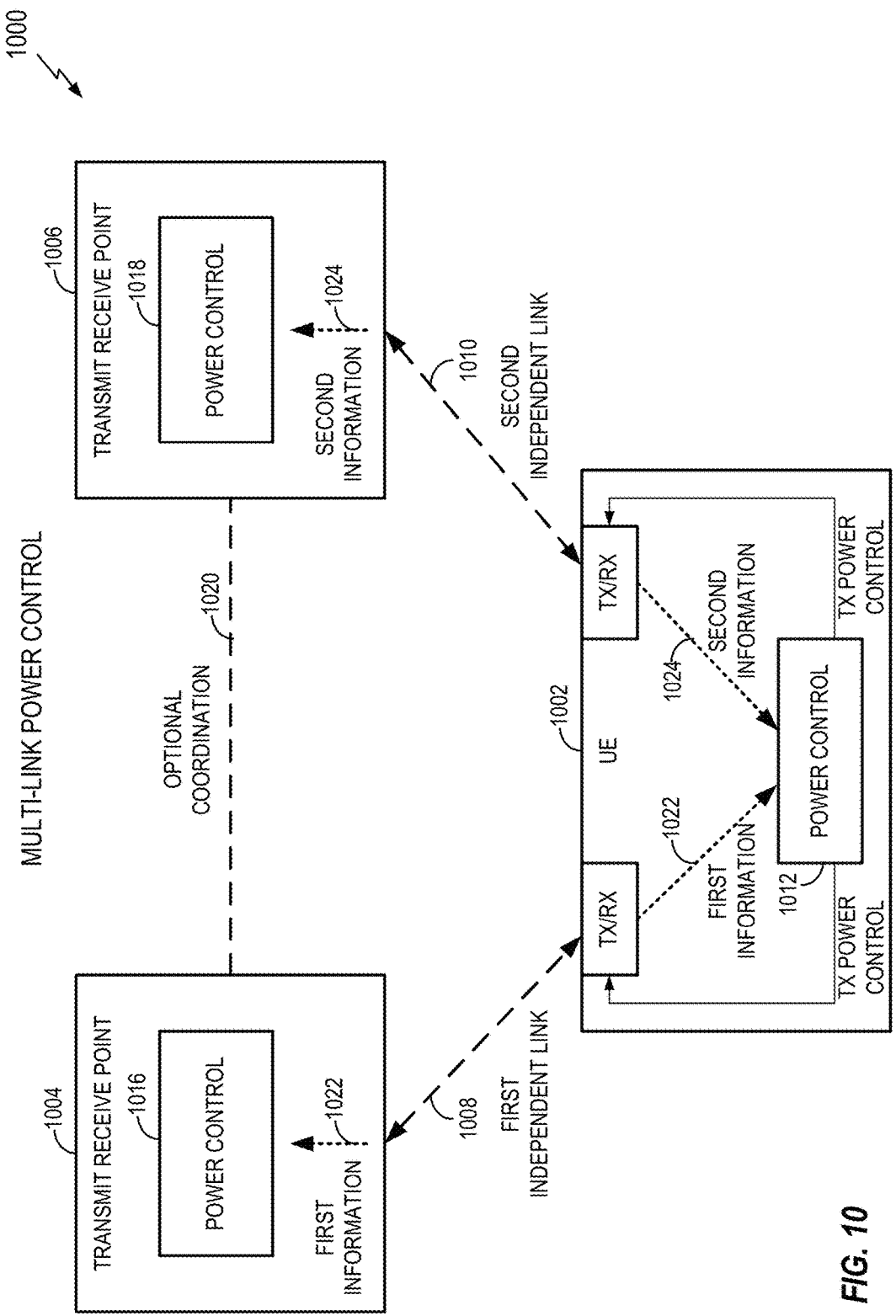
FIG. 10 is a block diagram illustrating an example of multi-link power control in accordance with some aspects of the disclosure.

An example of this scenario is shown in FIG. 10. FIG. 10 illustrates a communication system 1000 where a UE 1002 communicates with a first TRP 1004 via a first link 1008 and with a second TRP 1006 via a second link 1010. The UE 1002 includes functionality for power control 1012 that controls transmit power based on first information 1022 regarding the first link 1008 and second information 1024 regarding the second link 1010. The first TRP 1004 and the second TRP 1006 may include similar functionality for power control 1016 and 1018, respectively. In some aspects, the UE 1002 may correspond to the UE 202 of FIG. 2, the mmW UE 302 of FIG. 3, the apparatus 400 of FIG. 4, or the apparatus 500 of FIG. 5. In some aspects, the TRP 1004 or the TRP 1006 may correspond to the TRP 204 of FIG. 2, the TRP 206 of FIG. 2, the mmW TRP 304 of FIG. 3, or the mmW TRP 306 of FIG. 3.

In accordance with the teachings herein, any of the UE 1002, the first TRP 1004, or the second TRP 1006 may control transmit power based on the first information 1022 and the second information 1024. For example, the power control 1012 of the UE 1002 may set a power control constraint for the first link 1008 and/or the second link 1010 based on the first information 1022 (e.g., power control commands on the first link 1008) and the second information 1024 (e.g., power control commands on the second link 1010). The power control 1016 of the first TRP 1004 and the power control 1018 of the second TRP 1006 make likewise cooperate (e.g., by sharing the first information 1022 or the second information 1024 via a link 1020) to control transmit power on the first link 1008 and/or the second link 1010.

These and other aspects of allocating resources in a multi-link scenario are discussed below in the section entitled Examples of Multi-Link Power Control.

Multi-Link Channel Status Feedback

The disclosure relates in some aspects to a multi-link, multi-beam scenario where channel status feedback is based on the channel state of multiple links. For example, channel state information (CSI) feedback may take into account the CSI-RS from multiple links (e.g., if the antenna sub-arrays for the links are close to one another and/or depending on channel conditions).

Figure 11:
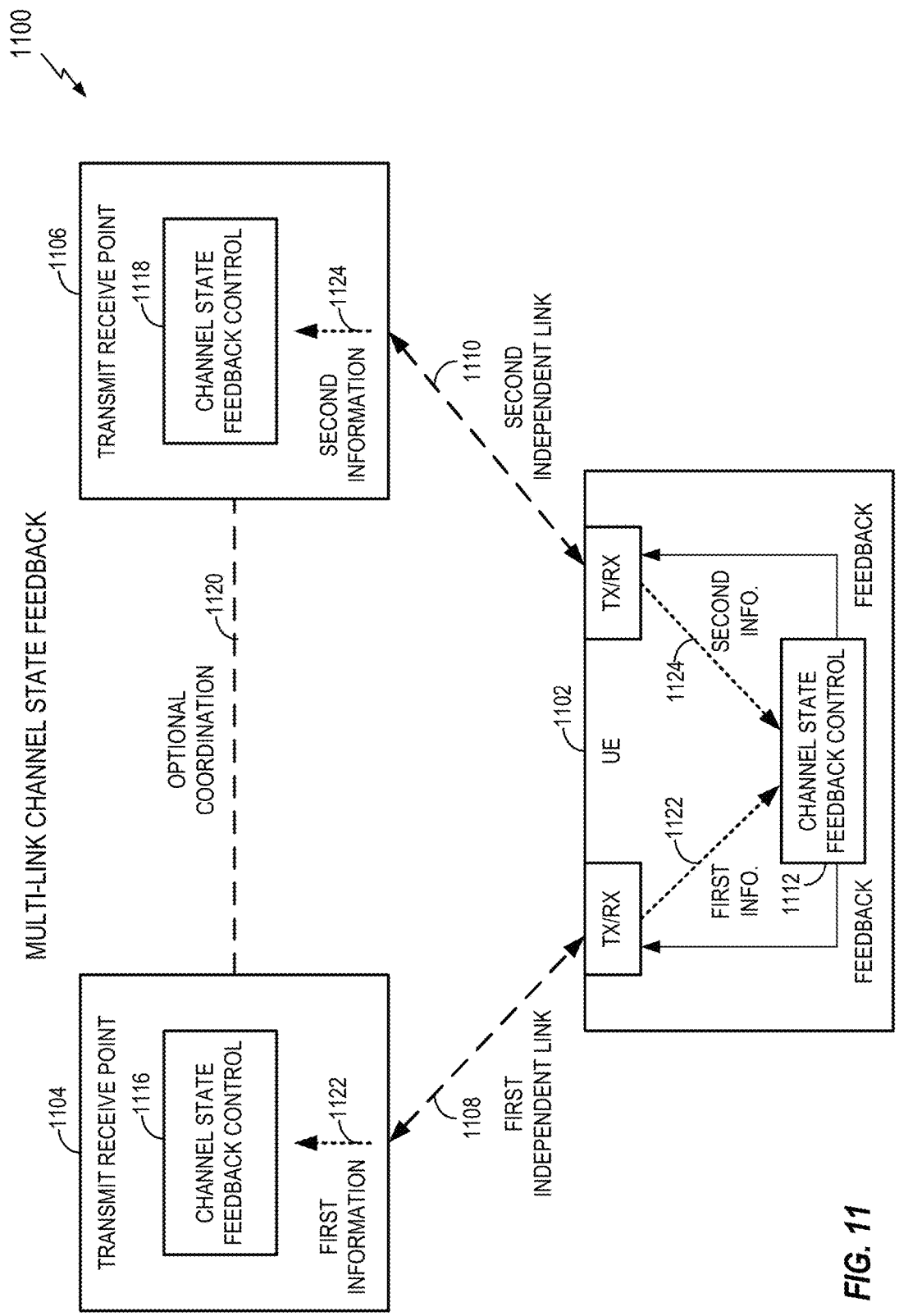
FIG. 11 is a block diagram illustrating an example of multi-link channel state feedback in accordance with some aspects of the disclosure.

An example of this scenario is shown in FIG. 11. FIG. 11 illustrates a communication system 1100 where a UE 1102 communicates with a first TRP 1104 via a first link 1108 and with a second TRP 1106 via a second link 1110. The UE 1102 includes functionality for channel state feedback (CSFB) control 1112 that provides feedback based on first information 1122 regarding the first link 1108 and second information 1124 regarding the second link 1110. The first TRP 1104 and the second TRP 1106 may include similar functionality for CSFB control 1116 and 1118, respectively. In some aspects, the UE 1102 may correspond to the UE 202 of FIG. 2, the mmW UE 302 of FIG. 3, the apparatus 400 of FIG. 4, or the apparatus 500 of FIG. 5. In some aspects, the TRP 1104 or the TRP 1106 may correspond to the TRP 204 of FIG. 2, the TRP 206 of FIG. 2, the mmW TRP 304 of FIG. 3, or the mmW TRP 306 of FIG. 3.

In accordance with the teachings herein, any of the UE 1102, the first TRP 1104, or the second TRP 1106 may provide feedback based on the first information 1122 and the second information 1124. For example, if the antenna sub-arrays for the first link 1108 and the second link 1110 are close to one another, the CSFB control 1112 of the UE 1102 may generate CSI feedback based on based on the first information 1122 (e.g., CSI-RS from the first link 1108) and the second information 1124 (e.g., CSI-RS from the second link 1110). The CSFB control 1116 of the first TRP 1104 and the CSFB control 1118 of the second TRP 1106 make likewise cooperate (e.g., by sharing the first information 1122 or the second information 1124 via a link 1120) to provide multi-link-based feedback.

These and other aspects of allocating resources in a multi-link scenario are discussed below in the section entitled Examples of Multi-Link Channel Status Feedback.

Multi-Link Beam Information

The disclosure relates in some aspects to a multi-link, multi-beam scenario that involves sending beam information for one link on at least one other link. For example, one link can indicate beam switching, link recovery, or link failure for at least one other link.

Figure 12:
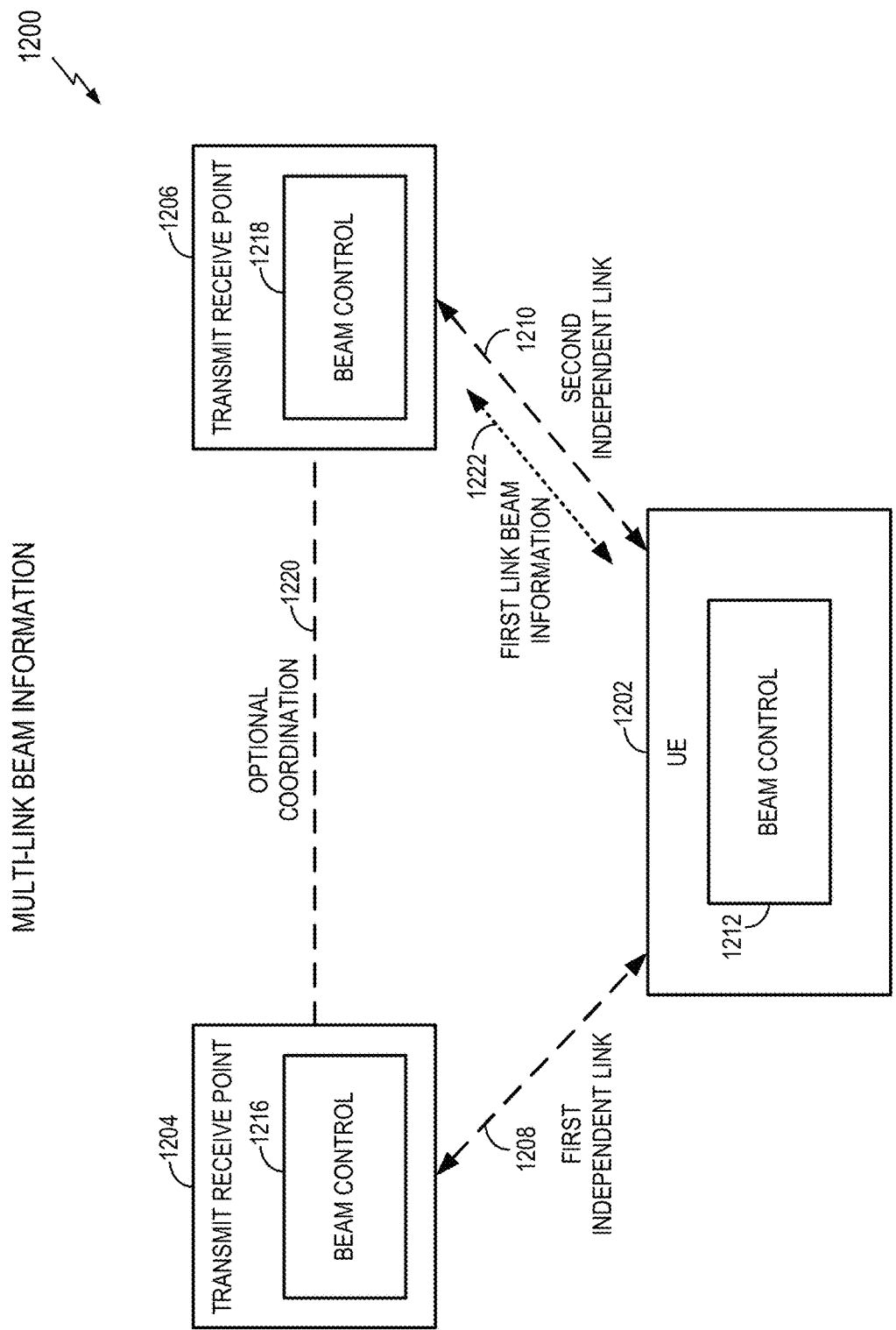
FIG. 12 is a block diagram illustrating an example of multi-link beam information in accordance with some aspects of the disclosure.

An example of this scenario is shown in FIG. 12. FIG. 12 illustrates a communication system 1200 where a UE 1202 communicates with a first TRP 1204 via a first link 1208 and with a second TRP 1206 via a second link 1210. The UE 1202 includes functionality for beam control 1212 to send and receive beam information via the first link 1208 and the second link 1210. The first TRP 1204 includes functionality for beam control 1216 to send and receive beam information via the first link 1208. The second TRP 1206 includes functionality for beam control 1218 to send and receive beam information for the second link 1210. In some aspects, the UE 1202 may correspond to the UE 202 of FIG. 2, the mmW UE 302 of FIG. 3, the apparatus 400 of FIG. 4, or the apparatus 500 of FIG. 5. In some aspects, the TRP 1204 or the TRP 1206 may correspond to the TRP 204 of FIG. 2, the TRP 206 of FIG. 2, the mmW TRP 304 of FIG. 3, or the mmW TRP 306 of FIG. 3.

In accordance with the teachings herein, any of the UE 1202, the first TRP 1204, or the second TRP 1206 may support sending beam information for one link over another link. For example, the beam control 1212 of the UE 1202 may send first link beam information 1222 over the second link 1210. As another example, beam control of the first TRP 1204 may cooperate with the beam control of the second TRP 1206 (e.g., via a link 1220) to send first link beam information 1222 over the second link 1210.

These and other aspects of allocating resources in a multi-link scenario are discussed below in the sections entitled Examples of Multi-Link Beam Switching, Examples of Multi-Link Beam Recovery, and Examples of Multi-Link RACH Procedures.

Multi-Link Event Triggers

The disclosure relates in some aspects to a multi-link, multi-beam scenario where event triggers are based on measurements from multiple links. For example, an event trigger may be based on aggregated measurements from multiple links.

Figure 13:
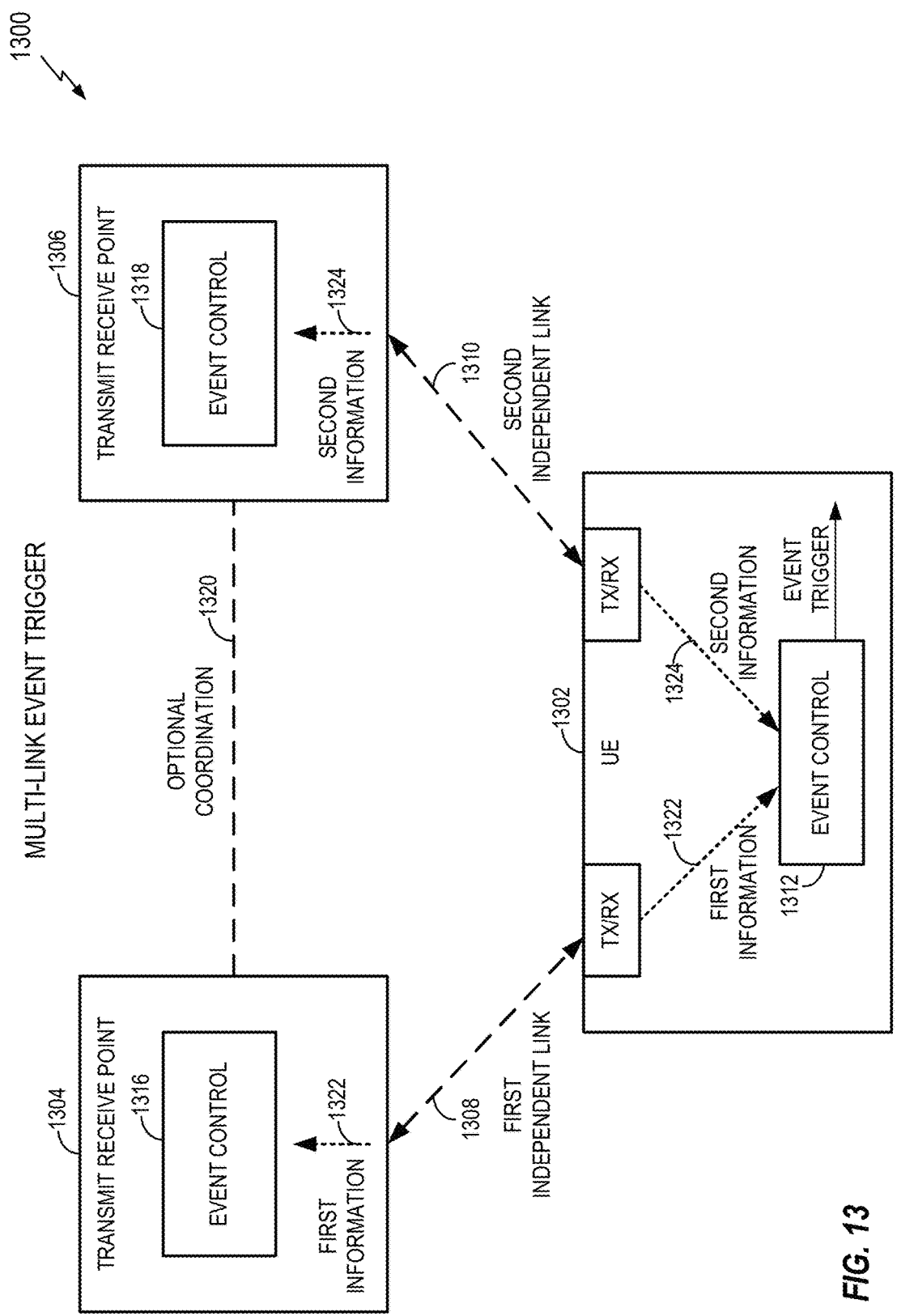
FIG. 13 is a block diagram illustrating an example of multi-link event trigger in accordance with some aspects of the disclosure.

An example of this scenario is shown in FIG. 13. FIG. 13 illustrates a communication system 1300 where a UE 1302 communicates with a first TRP 1304 via a first link 1308 and with a second TRP 1306 via a second link 1310. The UE 1302 includes functionality for event control 1312 that provide feedback based on first information 1322 regarding the first link 1308 and second information 1324 regarding the second link 1310. The first TRP 1304 and the second TRP 1306 may include similar functionality for event control 1316 and 1318, respectively. In accordance with the teachings herein, any of the UE 1302, the first TRP 1304, or the second TRP 1306 may provide an event trigger based on the first information 1322 and the second information 1324. For example, the event control 1312 of the UE 1302 may generate an event trigger based on the first information 1322 (e.g., a measurement from the first link 1308) and the second information 1324 (e.g., a measurement from the second link 1310). The event control 1316 of the first TRP 1304 and the event control 1318 of the second TRP 1306 make likewise cooperate (e.g., by sharing the first information 1322 or the second information 1324 via a link 1320) to provide a multi-link-based event trigger.

These and other aspects of allocating resources in a multi-link scenario are discussed below in the section entitled Examples of Multi-Link Measurements and Event Triggers.

Examples of Multi-Link Channel Sensing

The disclosure relates in some aspects to multi-link channel sensing. In some implementations, device may use a listen before talk (LBT) scheme for shared access (e.g., shared spectrum among TRPs) with N links, where N>=2. In some aspects, a TRP or a UE may use LBT-based sensing of a channel to determine whether the TRP or the UE is allowed to transmit on the channel.

For example, prior to transmitting, a device may sense energy or monitor for control signals (e.g., from a TRP or a UE) on a channel. Alternatively, or in addition, the device may obtain from another device information that indicates the outcome of energy sensing or message decoding on a channel conducted by the other device. For convenience, energy sensing and/or control signal monitoring may be referred to herein simply as sensing. Moreover, sensing may refer to other types of sensing other than energy sensing and control signal monitoring. Information acquired as a result of such sensing (e.g., energy sensing, control signal monitoring, etc.) may be referred to herein as sensing information.

In some aspects, sensing may be associated with a particular link. For example, in some cases, sensing may be done using the same beam (e.g., by using the same antenna sub-array(s) and antenna settings) that that is used for communication via a particular link. Thus, in some aspects, a device may conduct one sensing operation for a first link, another sensing operation for a second link, and so on. In some aspects, the sensing operation for a particular link may be referred to herein as sensing a channel for the link (or associated with the link).

A device can thus decide whether to transmit on one or more links based on the outcome of the energy sensing, the message decoding (e.g., based on the message content), or some other form of sensing. For example, the device may transmit on a particular link if the sensing indicates that the transmission is unlikely to interfere with reception at a nearby device (e.g., a device that is communicating with some other device). Alternatively, or in addition, the device may decide how to transmit on one or more links based on the sensing. For example, the device may adjust its beam (or some other transmission parameter) for a particular link if the sensing indicates that without the adjustment the transmission is likely to interfere with reception at a nearby device.

In view of the above, for a multi-link scenario, a device may obtain sensing information for one link or more than one link (e.g., before transmitting on either link). For example, a device that communicates via a first link and a second link may determine whether to transmit on the first link based on sensing of the first link and determine whether to transmit on the second link based on sensing of the second link. As another example, the device may determine whether to transmit on a first link based on sensing of the first link and a second link. As yet another example, the device may determine whether to transmit on a first link and a second link based on sensing of the first link. As a further example, the device may determine whether to transmit on a first link and a second link based on the sensing of the first link and the second link. Similar sensing schemes may be used for configurations that have more than two links.

In one example scheme, for each link, channel sensing can be done independently with respect to other links. For example, the thresholds, parameters, procedures, or any combination thereof used for sensing may be independent for each link. As a specific example, channel sensing on a first link may be based on a first set of parameters and a first procedure, while channel sensing on a second link may be based on a second set of parameters and a second procedure.

In another example scheme, two or more links can be grouped together as a channel sensing group. Thus, in some aspects, LBT may be performed on the links as a group. For example, a device may monitor for control signals on one or more of the links in the group and decide, based on that sensing result, whether to transmit on one or more of the links in the group. In some implementations, a device may sense one link of the group and decide based on that sensing result whether to transmit on two or more of the links of the group (e.g., all of the links or a subset of the links). In some implementations, a device may sense on multiple links, combine the sensing results, and decide based on the combined sensing results whether to transmit on two or more of the links of the group. In some implementations, the same channel sensing parameters may be used for links of a group.

Grouped channel sensing may provide improved sensing in some scenarios. For example, a given sub-array (e.g., a di-pole antenna) might not have omni-directional (360 degree) coverage. Thus, sensing via a given sub-array might only provide part of the picture of the surrounding environment. In this case, it is possible that a device might not detect any signals on a link corresponding to a first direction from the device and therefore elect to transmit. However, a transmission by the device might still interfere with a receiver located in a second direction from the device. Thus, sensing on each of multiple links (e.g., which may collectively provide wider coverage) may be advantageously taken into account when deciding whether to transmit on any or all of the links of a group. As a result, sensing on multiple links may prove a better LBT result.

In view of the above, the disclosure relates in some aspects to multi-link, multi-beam channel sensing for a device that communicates via all of the links in a set of links. For example, a UE may communicate via multiple links where each link is associated with a corresponding beam. The UE may communicate with a first TRP via a first link (first beam), communicate with at least one other TRP via at least one second link (at least one second beam), and so on. In this case, the UE may conduct channel sensing on each of these links independently or as a group as discussed above.

Furthermore, the disclosure relates in some aspects to multi-link, multi-beam channel sensing for a device that communicates on only a subset of the links of a set of links. For example, a TRP may communicate with a UE via a first link (first beam) and the UE may communicate with at least one other TRP via at least one other link (at least one second beam). In this case, the TRP communicates via a subset of the links. In some scenarios, the device (e.g., the TRP) may conduct channel sensing on the subset of the links independent of channel sensing on the other links. In other scenarios, the device may cooperate with at least one other device (e.g., the UE, another TRP, etc.) to conduct the channel sensing as a group (as discussed above). To this end, the device may communicate with the another device via another link (e.g., a TRP-to-TRP channel).

The disclosure relates in some aspects to signaling support for multi-link channel sensing. Here, one device may communicate with another device (or other devices) to determine how channel sensing will be done. For example, a device may indicate which links are grouped together, how the group sensing is done (e.g., sense on all links or a subset of links, etc.), and so on. This signaling may be, for example, from a TRP to an UE, from a UE to a TRP, from a TRP to another TRP, from a UE to another UE, or between other types of devices.

Examples of Multi-Link Control Channel Communication

One or more control channels may be defined from multiple TRPs to one UE. A control channel may be a physical downlink control channel (PDCCH) or some other suitable channel. In some aspects, a control channel indicates how data may be sent and/or decoded on a downlink channel (e.g., a physical downlink shared channel, PDSCH) or on an uplink channel.

In one aspect, the disclosure relates to supporting multiple links where each link has its own independent control channel. Thus, in this case, a device (e.g., a UE) that is communicating via multiple links sends and receives control information on one link independently of the control information for any of the other links.

In another aspect, the disclosure relates to supporting multiple links where control information for a link may be communicated via a control channel on at least one of the other links. In some aspects, one link (e.g., a control channel on the link) may transmit control information for multiple (N) links. For example, a group of links may designate a subset (one or more) of the links for sending control information. Thus, one link (or multiple links) may serve as the control channel for at least one other link.

In some aspects, the links may be dynamically allocated for sending control information. Some systems use a primary link and a secondary link where the different links may carry different information or carry information in a different way. For example, a primary link might send control information more often, or might send more important control information (e.g., ACK/NACK, or mission critical signaling). Thus, in the event the primary link is blocked (or compromised in some other way), a device may dynamically reallocate the control information for sending on the secondary link.

As another example of dynamic allocation, different links may have similar reliability and/or channel quality (e.g., the links may carried on the same carrier frequency). Thus, different links may be equally suited for carrying control information. Consequently, a device can dynamically select the link or links that will carry the control information. For example, control may be temporarily switched to a second link if a first link that is carrying control information gets blocked or is adversely impacted in some other way. Thus, a device may designate different links at different times for carrying control information.

As yet another example of dynamic allocation, a device may designate one link for some control information and another link for other control information. The information carried by each link may be dynamically changed over time.

In view of the above, the disclosure relates in some aspects to multi-link, multi-beam control information signaling for a device that communicates via all of the links in a set of links. For example, a UE may communicate via multiple links where each link is associated with a corresponding beam. The UE may communicate with a first TRP via a first link (first beam), communicate with at least one other TRP via at least one second link (at least one second beam), and so on. In this case, the UE may communicate control information on each of these links independently or the UE may communicate control information on one or more of the links as a group as discussed above.

Furthermore, the disclosure relates in some aspects to multi-link, multi-beam channel sensing for a device that communicates on only a subset of the links of a set of links. For example, a TRP may communicate with a UE via a first link (first beam) and the UE may communicate with at least one other TRP via at least one other link (at least one second beam). In this case, the TRP communicates via a subset of the links. In some scenarios, the device (e.g., the TRP) may communicate control information on the subset of the links independent of control information communication on the other links. In other scenarios, the device may cooperate with at least one other device (e.g., the UE, another TRP, etc.) to communicate control information on one or more of the links as a group (as discussed above). To this end, the device may communicate with the another device via another link (e.g., a TRP-to-TRP channel) to obtain control information for another link from the other device or to send control information for a link to the other device.

The disclosure relates in some aspects to signaling support for a multi-link control channel Here, one device may communicate with another device (or other devices) to determine how control information will be sent. For example, a device may indicate which links are to carry what types of control information, the times at which a particular link will be carrying control information, and so on. This signaling may be, for example, from a TRP to an UE, from a UE to a TRP, from a TRP to another TRP, from a UE to another UE, or between other types of devices.

Examples of Link Indications

In some cases, control information may take the form of a link indication. The link indication can indicate the existence of another link or other links (e.g., other active links)

The disclosure relates in some aspects to using a link indication on at least one control channel between multiple TRPs and one UE. To improve robustness, a control channel on a first link can carry the link indication to indicate the existence of another link or other links. This may ensure more reliability during reception. For example, by knowing that another TRP is transmitting to a UE, the UE will know to check whether it missed a transmission from the TRP. If the UE did miss a transmission, the UE can take appropriate action (e.g., initiate a retransmission).

The link indication may be sent in various ways. In some aspects, a link indication may be included in the payload of one link to indicate the existence of at least one other link. In some aspects, a link indication may indicate that control information is (or will be) coming over at least one other link (e.g., in the current sub-frame or some other sub-frame). This signaling may be, for example, from a TRP to an UE, from a UE to a TRP, from a TRP to another TRP, from a UE to another UE, or between other types of devices.

In view of the above, the disclosure relates in some aspects to multi-link, multi-beam channel sensing for a device that communicates via all of the links in a set of links. For example, a UE may communicate via multiple links where each link is associated with a corresponding beam. The UE may communicate with a first TRP via a first link (first beam), communicate with at least one other TRP via at least one second link (at least one second beam), and so on. In this case, the UE may conduct send or receive a link indication for one link on another link.

Furthermore, the disclosure relates in some aspects to multi-link, multi-beam channel sensing for a device that communicates on only a subset of the links of a set of links. For example, a TRP may communicate with a UE via a first link (first beam) and the UE may communicate with at least one other TRP via at least one other link (at least one second beam). In this case, the TRP communicates via a subset of the links. In some scenarios, the device (e.g., the TRP) may send or receive a link indication for one link on another link. To this end, the TRPs may share the link information with one another. For example, a first TRP can indicate the existence of a link (e.g., a link that is active at the first TRP) to a second TRP via a backhaul, a TRP-to-TRP link, or some other type of link.

Examples of Multi-Link HARQ Feedback

In some cases, control information may take the form of hybrid automatic repeat request (HARQ) feedback or some other type of feedback (e.g., uplink control signaling). For purposes of illustration, the discussion that follows will describe a HARQ scenario. It should be appreciated, however, that these concepts may be applicable to other types of feedback.

In one aspect, the disclosure relates to supporting multiple links where each link has its own independent HARQ feedback. Thus, in this case, a device (e.g., a UE) that is communicating via multiple links processes (e.g., sends or receives) HARQ feedback on one link independently of the HARQ feedback for any of the other links.

In another aspect, the disclosure relates to supporting HARQ processes across multiple links. In some aspects, one link (or a subset of the links) may process (e.g., send or receive) HARQ feedback for multiple (N) links. For example, a group of links may designate a subset (one or more) of the links for sending HARQ feedback. Thus, one link (or multiple links) may serve as the HARQ channel for at least one other link. In addition, the HARQ feedback may be in response to information received on one or more of the links.

In some aspects, the links may be dynamically allocated for sending feedback. Some systems use a primary link and a secondary link where the different links may carry different feedback or carry feedback in a different way. For example, a primary link might send feedback more often, or might send more important feedback (e.g., ACK/NACK). Thus, in the event the primary link is blocked (or compromised in some other way), a device may dynamically reallocate the feedback for sending on the secondary link.

As another example, different links may have similar reliability and/or channel quality (e.g., the links may carried on the same carrier frequency). Thus, different links may be equally suited for carrying feedback. Consequently, a device can dynamically select the link or links that will carry the feedback. For example, feedback may be temporarily switched to a second link if a first link that is carrying feedback gets blocked. Thus, a device may designate different links at different times for carrying feedback. As another example, a device may designate one link for some of the feedback and another link for other feedback.

In view of the above, the disclosure relates in some aspects to multi-link, multi-beam feedback for a device that communicates via all of the links in a set of links. For example, a UE may communicate via multiple links where each link is associated with a corresponding beam. The UE may communicate with a first TRP via a first link (first beam), communicate with at least one other TRP via at least one second link (at least one second beam), and so on. In this case, the UE may send feedback on each of these links independently or the UE may send feedback on one or more of the links as a group as discussed above. In the latter case, the UE may generate the feedback based on information received on one or more of the links of the group.

Furthermore, the disclosure relates in some aspects to multi-link, multi-beam channel sensing for a device that communicates on only a subset of the links of a set of links. For example, a TRP may communicate with a UE via a first link (first beam) and the UE may communicate with at least one other TRP via at least one other link (at least one second beam). In this case, the TRP communicates via a subset of the links. In some scenarios, the device (e.g., the TRP) may process feedback on the subset of the links independent of feedback on the other links. In other scenarios, the device may cooperate with at least one other device (e.g., the UE, another TRP, etc.) to manage feedback on one or more of the links as a group (as discussed above). To this end, the device may communicate with the another device via another link (e.g., a TRP-to-TRP channel) to obtain HARQ feedback for another link from the other device or to send HARQ feedback for a link to the other device.

The disclosure relates in some aspects to signaling support for multi-link feedback. Here, one device may communicate with another device (or other devices) to determine how feedback will be sent. For example, a device may indicate which links are to carry what types of feedback, the times at which a particular link will be carrying feedback, and so on. As discussed above, this signaling may be, for example, from a TRP to an UE, from a UE to a TRP, from a TRP to another TRP, from a UE to another UE, or between other types of devices.

Examples of Multi-Link Sub-Frame Allocation

The disclosure relates in some aspects to sub-frame allocation in a multi-link scenario. Different sub-frame structures may be used in different circumstances.

In accordance with some aspects of the disclosure, if the current communication is not full duplex communication, it may be desirable to have the time division duplex (TDD) structure used for each sub-frame be compatible on all N links. By using compatible TDD structures on the different links, receiver saturation may be avoided. In this case, the direction of transmission (e.g., uplink or downlink) for one link is specified to be the same or a subset of the direction for the other N−1 links. For example, if one link is in the downlink direction during a particular symbol, another link should be in the downlink direction during that symbol as well. Such a configuration may be used, for example, for the communication of more important information (e.g., control information, high QoS data, etc.).

In accordance with other aspects of the disclosure, a more flexible allocation of uplink and downlink for each link may be allowed. For example, uplink/downlink coordination might not be required between links. In this case, each link may selectively use different time division duplex (TDD)/FDD sub-frame structures. For example, if one link is downlink during a particular symbol, another link may be uplink during that symbol. This approach may be used for example, if the RF isolation between sub-arrays is sufficiently high (e.g., >30 dB), since receiver saturation is less likely under these circumstances. Thus, some interference between links might be acceptable in a flexible uplink and downlink implementation. Consequently, full duplex operation may be possible in cases where the RF isolation between the links is relatively high (e.g., due to the corresponding antenna sub-arrays pointing in different directions). Full duplex operation could also be used, for example, for the communication of less important information (e.g., best effort data, etc.) that has a lower reliability requirement.

In accordance with other aspects of the disclosure, a hybrid of full duplex and non-full duplex operation may be used. Here, some portions of the sub-frame or sub-frames may share the same directions for different links. For example, all links may share the same downlink portion for downlink control signaling purposes and/or all links may share the same uplink portion for uplink control signaling purposes.

In addition, one link may provide a protected portion for other links by reducing transmitting power or blanking out the transmission, or one link can provide a protected portion for other links by reducing transmitting power for a subset of frequency resources or blanking out the transmission over a subset of frequency resources. For example, with 100 MHz bandwidth, one link may reduce transmission power or blank out the transmission for the middle portion of the system bandwidth, e.g., 20 MHz out of 100 MHz. This frequency resource is not necessarily contiguous over frequency domain, e.g., the 20 MHz can be distributed over 100 MHz rather than contiguous in the frequency domain.

Links can coordinate the protected resource and the UE or TRP can take into account such coordinated resource for receiver processing, e.g., to reduce receiver complexity by knowing the coordination information.

The disclosure relates in some aspects to signaling sub-frame or UL/DL configurations to be used on one or more links. For example, one device may communicate with another device (or other devices) to determine the type of sub-frame or the UL/DL configuration to be used on a particular link (or links) and the times at which that sub-frame or UL/DL configuration will be used on the link (or links). This signaling may be, for example, from a TRP to an UE, from a UE to a TRP, from a TRP to another TRP, from a UE to another UE, or between other types of devices.

In view of the above, the disclosure relates in some aspects to multi-link, multi-beam channel sensing for a device that communicates via all of the links in a set of links. For example, a UE may communicate via multiple links where each link is associated with a corresponding beam. The UE may communicate with a first TRP via a first link (first beam), communicate with at least one other TRP via at least one second link (at least one second beam), and so on. In this case, the UE may use or forward information about each link to enable a scheduler (e.g., at the UE or elsewhere) determine the appropriate sub-frame allocation.

Furthermore, the disclosure relates in some aspects to multi-link, multi-beam channel sensing for a device that communicates on only a subset of the links of a set of links. For example, a TRP may communicate with a UE via a first link (first beam) and the UE may communicate with at least one other TRP via at least one other link (at least one second beam). In this case, the TRP communicates via a subset of the links. In some scenarios, the device (e.g., the TRP) may send or receive a link information for one link on another link. To this end, the TRPs may share the link information with one another. For example, a first TRP can send information about one link (e.g., a link that is active at the first TRP) to a second TRP via a backhaul, a TRP-to-TRP link, or some other type of link. In this way, a scheduler (e.g., at a TRP or elsewhere) can determine the appropriate sub-frame allocation.

Examples of Multi-Link Sounding

In some cases, resource (e.g., sub-frame) allocation in a multi-link scenario may be based on dynamic sounding. This sounding could be uplink sounding, downlink sounding, or sounding on some other type of link.

Uplink sounding may be used, for example, to enable a TRP to configure its downlink beamforming (e.g., based on uplink sounding information received from a UE). For example, a UE may send a sounding reference signal (SRS) to a TRP. In a time division duplex (TDD) environment, reciprocity may be used to estimate a channel in one direction (e.g., the DL) based on a channel estimate for another direction (e.g., the UL).

Downlink sounding may be used, for example, to enable a UE to configure its uplink beamforming (e.g., based on downlink sounding information received from a TRP) For example, a TRP may send an SRS to a UE. Here, reciprocity may be used to estimate a channel in the UL based on a channel estimate for the DL.

In one aspect, the disclosure relates to supporting multiple links where each link has its own independent sounding. Thus, in this case, a device (e.g., a UE) that is communicating via multiple links performs sounding operations for one link independently of the sounding operations for any of the other links. For example, a UE may send a corresponding SRS for each link.

In another aspect, the disclosure relates to supporting sounding across multiple links. Here, sounding may be time division multiplexed (TDM'ed) within one sub-frame (e.g., depending on the beamforming directions across links). For example, if there is high interference between beams (e.g., due to the directions of the beams), the uplink sounding may be sent in a sequential manner (e.g., an SRS is sent on one link, followed by an SRS on another link, and so on).

In view of the above, the disclosure relates in some aspects to multi-link, multi-beam sounding for a device that communicates via all of the links in a set of links. For example, a UE may communicate via multiple links where each link is associated with a corresponding beam. The UE may communicate with a first TRP via a first link (first beam), communicate with at least one other TRP via at least one second link (at least one second beam), and so on. In this case, the UE may perform sounding operations on each of these links independently or the UE may perform sounding operations as a group as discussed above (e.g., send or receive sounding signals in succession over different links of the group).

Furthermore, the disclosure relates in some aspects to multi-link, multi-beam channel sounding for a device that communicates on only a subset of the links of a set of links. For example, a TRP may communicate with a UE via a first link (first beam) and the UE may communicate with at least one other TRP via at least one other link (at least one second beam). In this case, the TRP communicates via a subset of the links. In some scenarios, the device (e.g., the TRP) may perform sounding operations on the subset of the links independent of sounding operations on the other links. In other scenarios, the device may cooperate with at least one other device (e.g., the UE, another TRP, etc.) to perform sounding operations on one or more of the links as a group (as discussed above). To this end, the device may communicate with the another device via another link (e.g., a TRP-to-TRP channel) to obtain sounding information for another link from the other device or to send sounding information for a link to the other device.

The disclosure relates in some aspects to signaling support for multi-link sounding. Here, one device may communicate with another device (or other devices) to determine how sounding will be done. For example, a device may indicate which links are grouped together for sounding, how the sounding is done for each link or group of links (e.g., concurrently, sequentially, etc.), the sounding direction (e.g., uplink or downlink) and so on. This signaling may be, for example, from a TRP to an UE, from a UE to a TRP, from a TRP to another TRP, from a UE to another UE, or between other types of devices.

In some implementations, a TRP may schedule the uplink sounding. When scheduling SRS transmission, the TRP may provide signaling to indicate the direction of transmission for each sounding signal.

Examples of Multi-Link Power Control

The disclosure relates in some aspects to multi-link power control. Power control may be implemented using different schemes.

In one aspect, the disclosure relates to supporting multiple links where each link has its own independent power control. Thus, in this case, a device (e.g., a UE) that is communicating via multiple links performs power control for one link independently of the power control operations for any of the other links. For example, a TRP may send power control information (e.g., via a control channel) to a UE via a particular link to control the transmit power of that link. The UE may thus control power on that particular link based on power control commands received on that link.

In another aspect, the disclosure relates to supporting power control across multiple links (e.g., joint power control). For example, a single power control command may control power on a group of links (e.g., that share the same spectrum). As another example, power control for a UE may be based on power control commands received on multiple links. As yet another example, a power control constraint may be met taking into account the transmission power on multiple links.

In either case, a total power constraint (e.g., similar to carrier aggregation) may be used. For example, a TRP may specify a total maximum power limit across multiple links irrespective of whether the link are independent or grouped.

In view of the above, the disclosure relates in some aspects to multi-link, multi-beam power control for a device that communicates via all of the links in a set of links. For example, a UE may communicate via multiple links where each link is associated with a corresponding beam. The UE may communicate with a first TRP via a first link (first beam), communicate with at least one other TRP via at least one second link (at least one second beam), and so on. In this case, the UE may perform power control operations on each of these links independently or the UE may perform power control operations as a group as discussed above. For example, the UE may control power on one or more links based on power control commands received on one or more of the links.

Furthermore, the disclosure relates in some aspects to multi-link, multi-beam channel power control for a device that communicates on only a subset of the links of a set of links. For example, a TRP may communicate with a UE via a first link (first beam) and the UE may communicate with at least one other TRP via at least one other link (at least one second beam). In this case, the TRP communicates via a subset of the links. In some scenarios, the device (e.g., the TRP) may perform power control operations on the subset of the links independent of power control operations on the other links. In other scenarios, the device may cooperate with at least one other device (e.g., the UE, another TRP, etc.) to perform power control operations on one or more of the links as a group (as discussed above). To this end, the device may communicate with the another device via another link (e.g., a TRP-to-TRP channel) to obtain power control information (e.g., power control commands) for another link from the other device or to send power control information for a link to the other device.

The disclosure relates in some aspects to signaling support for multi-link power control. Here, one device may communicate with another device (or other devices) to determine how power control will be done. For example, a device may indicate which links are grouped together for power control, how the power control is done for each link or group of links (e.g., using power control commands on all links or a subset of links, etc.), and so on. This signaling may be, for example, from a TRP to an UE, from a UE to a TRP, from a TRP to another TRP, from a UE to another UE, or between other types of devices.

Examples of Multi-Link Channel Status Feedback

Channel status feedback (e.g., a pre-coding matrix indicator, PMI) from a UE in a multi-link scenario may be implemented using different schemes. For channel state information (CSI) feedback, a TRP transmits a CSI reference signal (CSI-RS) that is detected by a UE. The UE generates CSI feedback (e.g., CQI, PMI, etc.) based on the CSI-RS and sends the CSI feedback to the TRP.

In one aspect, the disclosure relates to supporting multiple links where each link has its own independent channel status feedback. Thus, in this case, a device (e.g., a UE) that is communicating via multiple links performs feedback operations for one link independently of the feedback operations for any of the other links. For example, each link can have its own channel state information (CSI) feedback based on the CSI reference signal (CSI-RS) send by the TRP on that link.

In another aspect, the disclosure relates to supporting channel status feedback across multiple links. For example, the CSI feedback for a given link may be based on CSI-RS from multiple links. Thus, a UE may send a joint CSI report. This joint report may be sent on one or more of the links. When transmitting the feedback, the transmitter may provide information on how it uses the CSI-RS from multiple links.

The use of feedback across a group of links may be dynamically invoked based on one or more trigger conditions. For example, joint power control may be invoked when the antenna sub-arrays being used are relatively close to each other (e.g., less than a threshold distance apart). As another example, joint power control may be invoked depending on channel conditions.

The CSI calculated for different links may be different (e.g., due to different directions of coverage of the antenna sub-arrays and/or due to different locations of the antenna sub-arrays on the device). As one example, the environment seen by different antenna sub-arrays may be different (e.g., due to different channel conditions in the different directions). Hence, different CSI may be generated for the different links (e.g., one of the links may be worse than the other). In such a case, a device may elect to send a joint CSI report so it can use the links jointly for subsequent communication.

When the sub-arrays being used are close to each other, a device may be able to get better performance (e.g., higher SNR) by using both links. Thus, a device may elect to send a joint CSI report in this case so the device can use the links jointly for subsequent communication. Moreover, by sending a joint report, feedback overhead may be lower.

In view of the above, the disclosure relates in some aspects to multi-link, multi-beam channel status feedback for a device that communicates via all of the links in a set of links. For example, a UE may communicate via multiple links where each link is associated with a corresponding beam. The UE may communicate with a first TRP via a first link (first beam), communicate with at least one other TRP via at least one second link (at least one second beam), and so on. In this case, the UE may perform feedback operations on each of these links independently or the UE may perform feedback operations as a group as discussed above. For example, the UE may use channel state information from one or more links to generate feedback send on one or more of the links.

Furthermore, the disclosure relates in some aspects to multi-link, multi-beam channel status feedback for a device that communicates on only a subset of the links of a set of links. For example, a TRP may communicate with a UE via a first link (first beam) and the UE may communicate with at least one other TRP via at least one other link (at least one second beam). In this case, the TRP communicates via a subset of the links. In some scenarios, the device (e.g., the TRP) may perform feedback operations on the subset of the links independent of feedback operations on the other links. In other scenarios, the device may cooperate with at least one other device (e.g., the UE, another TRP, etc.) to perform feedback operations on one or more of the links as a group (as discussed above). To this end, the device may communicate with the another device via another link (e.g., a TRP-to-TRP channel) to obtain feedback information (e.g., joint CSI feedback sent to the other device) from the other device or to send feedback information to the other device. Also, the TRPs may cooperate to enable a UE to use the links jointly for communication.

The disclosure relates in some aspects to signaling support for multi-link channel status feedback. Here, one device may communicate with another device (or other devices) to determine how channel status feedback will be done. For example, a device may indicate which links are grouped together for channel status feedback, how the channel status feedback is done for each link or group of links (e.g., a solo report or a joint report) and so on. This signaling may be, for example, from a TRP to an UE, from a UE to a TRP, from a TRP to another TRP, from a UE to another UE, or between other types of devices.

Examples of Multi-Link Beam Switching

The disclosure relates in some aspects to communicating beam information in a multi-link scenario. In some case, the beam information is for beam switching and/or beam management.

In beam switching/link management a device may tell another device that communication may switch from one link to another link or may request such a switch (e.g., because the link quality has dropped or because a better link was found). Beam switching/link management for a multi-link scenario may be implemented using different schemes.

In one aspect, the disclosure relates to supporting multiple links where each link performs its own independent beam switching (per link switching). Thus, in this case, a device (e.g., a UE) that is communicating via multiple links performs beam switching for one link independently of the beam switching for any of the other links. For example, a UE can send a message on a particular link to inform a TRP that the UE is switching to another beam or direction (e.g., because the link quality has dropped or because a better link was found).

In another aspect, the disclosure relates to beam switching across multiple links (cross-link switching). Here, one link (or a group of links) can indicate beam switching for at least one other link via a control channel. For example, a UE can send a message via a control channel for one link to inform a TRP that the beams are being switched for multiple links. As another example, if an active link for a device is lost (e.g., blocked), another link may carry the beam switching information (e.g., beam identifier) to enable the device to switch to another link. These messages may also indicate the time for the switch so that the UE and the TRP can synchronize their switching operations. Furthermore, a confirmation of receiving a beam switching command in one or more links can be transmitted via another link or links.

Cross-link switching may potentially reduce the latency associated with a beam switch. For example, handshaking (e.g., switching control and recovery procedure) associated with the switch can be carried on another link, thereby reducing the switch time on one or more of the links subject to the switch. Also, a TRP could tell the UE to switch the link in the very next sub-frame.

In view of the above, the disclosure relates in some aspects to multi-link, multi-beam beam switching for a device that communicates via all of the links in a set of links. For example, a UE may communicate via multiple links where each link is associated with a corresponding beam as discussed above. In this case, the UE may perform beam switching on each of these links independently or the UE may perform beam switching across multiple links as discussed above (cross-link switching).

Furthermore, the disclosure relates in some aspects to multi-link, multi-beam channel status feedback for a device that communicates on only a subset of the links of a set of links. For example, a TRP may communicate with a UE via a first link (first beam) and the UE may communicate with at least one other TRP via at least one other link (at least one second beam) as discussed above. In some scenarios, the device (e.g., the TRP) may perform beam switching on the subset of the links independent of beam switching on the other links. In other scenarios, the device may cooperate with at least one other device (e.g., the UE, another TRP, etc.) to perform beam switching across one or more of the links (cross-link switching). To this end, the device may communicate with the another device via another link (e.g., a TRP-to-TRP channel) to obtain beam switching information (e.g., a beam identifier) from the other device or to send beam switching information to the other device.

The disclosure relates in some aspects to signaling support for multi-link channel beam switching. Here, one device may communicate with another device (or other devices) to determine how beam switching will be done. For example, a device may indicate whether cross-link switching will be used or whether beam switching is to be done independently for each link. This signaling may be, for example, from a TRP to an UE, from a UE to a TRP, from a TRP to another TRP, from a UE to another UE, or between other types of devices.

Examples of Multi-Link Beam Recovery

In some cases, beam information communicated for a multi-link scenario includes beam recovery information. Once a beam is lost (e.g., blocked), a device may commence a beam recovery operation (e.g., a RACH procedure or a scheduling request (SR) procedure) to re-synchronize with another device. However, since the beam was lost, the device can't use that control channel to communicate a beam switch to the other device. Beam recovery in a multi-link scenario may be implemented using different schemes.

In one aspect, the disclosure relates to supporting multiple links where each link performs its own independent beam recovery (per-link recovery). In this case, a device (e.g., a UE) that is communicating via multiple links performs beam recovery for one link independently of the beam recovery for any of the other links. For example, a UE may send a RACH message (on a random access channel) to a TRP to inform the TRP that the UE has lost the link. In practice, however, a RACH procedure may have relatively high overhead.

In another aspect, the disclosure relates to beam recovery across multiple links (cross-link recovery). Here, one link (or group of links) can be used to recover at least one other link. For example, a UE may send a RACH or SR message to a TRP via the good link (e.g., via a control channel of that link) to inform the TRP that the UE has lost another link (or other links). As another example, a TRP may send a similar message to a UE. Such a message may include or be sent in conjunction with various types of beamforming-related information. For example, the beamforming-related information may include an indication to send new beam pairing information, an indication of a preferred beam, a beam identifier, a designated time for a beam switch, a confirmation, or other information to facilitate beam recovery.

In view of the above, the disclosure relates in some aspects to multi-link, multi-beam beam recovery for a device that communicates via all of the links in a set of links. For example, a UE may communicate via multiple links where each link is associated with a corresponding beam as discussed above. In this case, the UE may perform beam recovery on each of these links independently or the UE may perform beam recovery across multiple links as discussed above (cross-link recovery).

Furthermore, the disclosure relates in some aspects to multi-link, multi-beam channel status feedback for a device that communicates on only a subset of the links of a set of links. For example, a TRP may communicate with a UE via a first link (first beam) and the UE may communicate with at least one other TRP via at least one other link (at least one second beam) as discussed above. In some scenarios, the device (e.g., the TRP) may perform beam recovery on the subset of the links independent of beam recovery on the other links. In other scenarios, the device may cooperate with at least one other device (e.g., the UE, another TRP, etc.) to perform beam recovery across one or more of the links (cross-link recovery). To this end, the device may communicate with the another device via another link (e.g., a TRP-to-TRP channel) to obtain beam recovery information (e.g., a beam identifier) from the other device or to send beam recovery information to the other device.

The disclosure relates in some aspects to signaling support for multi-link channel beam recovery. Here, one device may communicate with another device (or other devices) to determine how beam recovery will be done. For example, a device may indicate whether cross-link recovery will be used or whether beam recovery is to be done independently for each link. This signaling may be, for example, from a TRP to an UE, from a UE to a TRP, from a TRP to another TRP, from a UE to another UE, or between other types of devices.

Examples of Multi-Link RACH Procedures

In some cases, beam information communicated for a multi-link scenario includes random access channel (RACH) information. RACH procedures in a multi-link scenario may be implemented using different schemes.

In one aspect, the disclosure relates to supporting multiple links where each link performs its own independent RACH procedure. In this case, a device (e.g., a UE) that is communicating via multiple links performs a RACH procedure for one link independently of the RACH procedure for any of the other links. For example, a UE may send a RACH message (on a random access channel) to a TRP to inform the TRP that the UE has lost the link. In practice, however, a RACH procedure may have relatively high overhead.

If a single link is used, a random access channel (RACH) procedure can be used to recover a beam. With multiple links, however, the chance of using the RACH is reduced due to possible cross-link recovery. When multiple (e.g., N) links fail, a control signal may be sent on another link to signal failure events of multiple links at the same time. For example, a UE can send a RACH message to a TRP to indicate that multiple links have failed.

Thus, in another aspect, the disclosure relates to a RACH procedure across multiple links. Here, one link (or group of links) can be used to send a control signal for at least one other link.

In view of the above, the disclosure relates in some aspects to a multi-link, multi-beam RACH procedure for a device that communicates via all of the links in a set of links. For example, a UE may communicate via multiple links where each link is associated with a corresponding beam as discussed above. In this case, the UE may perform a RACH procedure on each of these links independently or the UE may signal failure events across multiple links as discussed above (cross-link recovery).

Furthermore, the disclosure relates in some aspects to a multi-link, multi-beam RACH procedure for a device that communicates on only a subset of the links of a set of links. For example, a TRP may communicate with a UE via a first link (first beam) and the UE may communicate with at least one other TRP via at least one other link (at least one second beam) as discussed above. In some scenarios, the device (e.g., the TRP) may perform a RACH procedure on the subset of the links independent of RACH procedures on the other links. In other scenarios, the device may cooperate with at least one other device (e.g., the UE, another TRP, etc.) to signal failure events across one or more of the links. To this end, the device may communicate with the another device via another link (e.g., a TRP-to-TRP channel) to obtain failure event information from the other device or to send failure event information to the other device.

The disclosure relates in some aspects to signaling support for multi-link channel RACH procedures. Here, one device may communicate with another device (or other devices) to determine how RACH procedures will be done. For example, a device may indicate whether RACH procedures are to be done independently for each link or whether cross-link signaling of failure events will be used. This signaling may be, for example, from a TRP to an UE, from a UE to a TRP, from a TRP to another TRP, from a UE to another UE, or between other types of devices.

Examples of Multi-Link Measurements and Event Triggers

The disclosure relates in some aspects to link measurement (e.g., RSRP/RSSI measurements) for a multi-link scenario. Link measurements may be used, for example, for handoff or other event triggers.

In one aspect, the disclosure relates to supporting multiple links where each link performs its own measurement and event trigger operations (per link measurement). In this case, a device (e.g., a UE) that is communicating via multiple links performs measurement and event trigger operations for one link independently of the measurement and event trigger operations for any of the other links. Here, event triggers (e.g., for handoff to a different TRP or link) are based on per link measurements. Thus, a given apparatus may use multiple triggers, one for each link. Also, multiple beam measurements may be conducted for a given link and these measurements may be aggregated (e.g., for comparison to a trigger threshold).

In another aspect, the disclosure relates to measurement and event trigger operations across multiple links. Here, one link (or group of links) can be used for measurement and event triggering for at least one other link. Event triggers may be based on an aggregated measurement from multiple links. For example, an event may be triggered based on comparison of a trigger threshold with the maximum value of the measurements from all of the links in a group. As above, multiple beam measurements may be conducted for a given link and these measurements may be aggregated.

In view of the above, the disclosure relates in some aspects to multi-link, multi-beam measurement and event trigger operations for a device that communicates via all of the links in a set of links. For example, a UE may communicate via multiple links where each link is associated with a corresponding beam as discussed above. In this case, the UE may perform measurement and event trigger operations on each of these links independently or the UE may perform measurement and event trigger operations across multiple links as discussed above.

Furthermore, the disclosure relates in some aspects to multi-link, multi-beam measurement and event trigger operations for a device that communicates on only a subset of the links of a set of links. For example, a TRP may communicate with a UE via a first link (first beam) and the UE may communicate with at least one other TRP via at least one other link (at least one second beam) as discussed above. In some scenarios, the device (e.g., the TRP) may perform measurement and event trigger operations on the subset of the links independent of measurement and event trigger operations on the other links. In other scenarios, the device may cooperate with at least one other device (e.g., the UE, another TRP, etc.) to measurement and event trigger operations across one or more of the links. To this end, the device may communicate with the another device via another link (e.g., a TRP-to-TRP channel) to obtain measurement information from the other device or to send measurement information to the other device.

The disclosure relates in some aspects to signaling support for multi-link channel measurement and event trigger operations. Here, one device may communicate with another device (or other devices) to determine how measurement and event trigger operations will be done. For example, a device may indicate whether measurement and event trigger operations are to be done independently for each link or whether cross-link operations will be used. This signaling may be, for example, from a TRP to an UE, from a UE to a TRP, from a TRP to another TRP, from a UE to another UE, or between other types of devices.

First Example Apparatus

Figure 14:
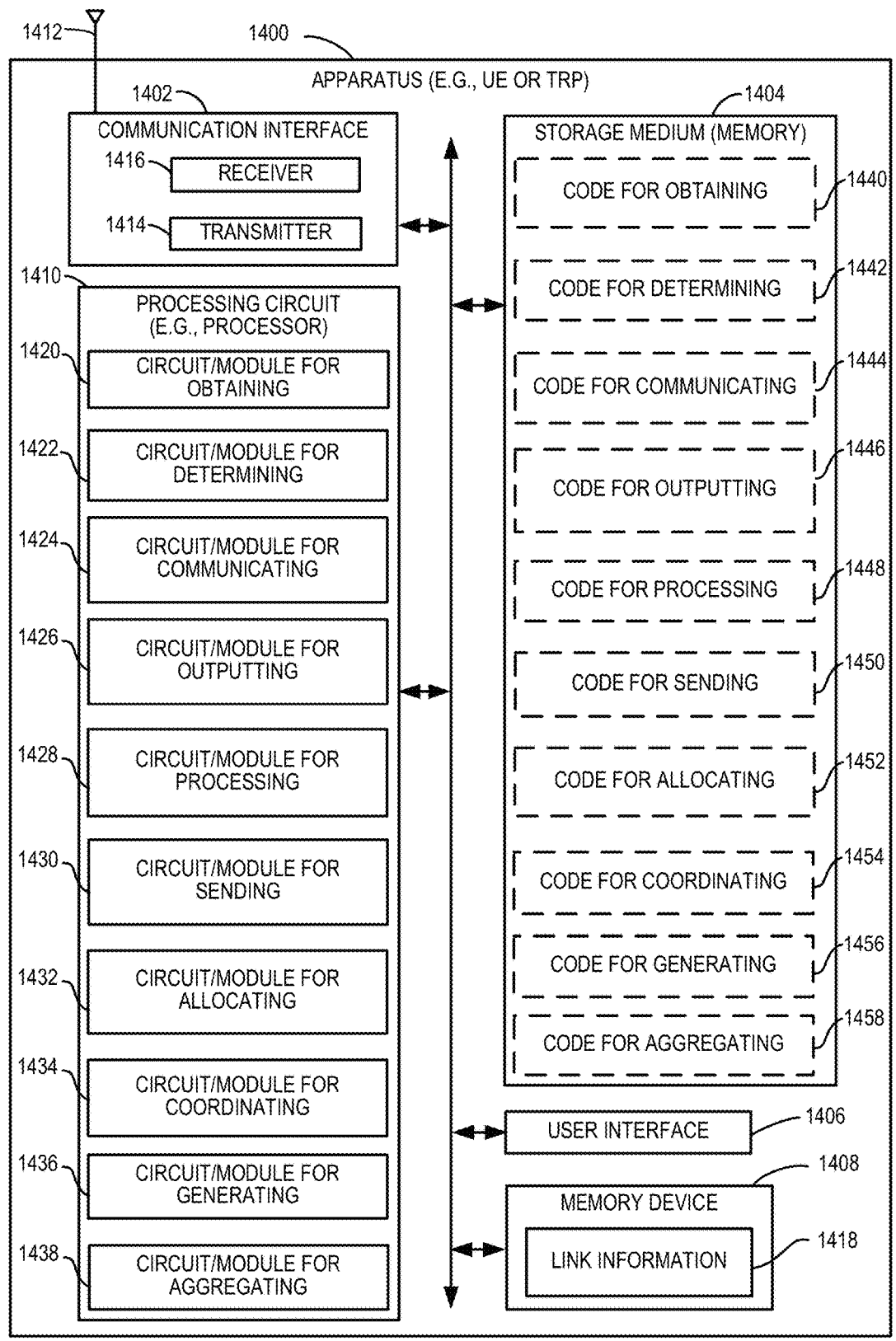
FIG. 14 is a block diagram illustrating an example hardware implementation for an apparatus (e.g., an electronic device) that can support communication in accordance with some aspects of the disclosure.

FIG. 14 illustrates a block diagram of an example hardware implementation of an apparatus 1400 configured to communicate according to one or more aspects of the disclosure. The apparatus 1400 could embody or be implemented within a UE, a TRP, a gNB, a base station (BS), or some other type of device that supports wireless communication. In various implementations, the apparatus 1400 could embody or be implemented within an access terminal, an access point, or some other type of device. In various implementations, the apparatus 1400 could embody or be implemented within a server, a network entity, a mobile phone, a smart phone, a tablet, a portable computer, a server, a personal computer, a sensor, an alarm, a vehicle, a machine, an entertainment device, a medical device, or any other electronic device having circuitry.

The apparatus 1400 includes a communication interface (e.g., at least one transceiver) 1402, a storage medium 1404, a user interface 1406, a memory device (e.g., a memory circuit) 1408, and a processing circuit 1410 (e.g., at least one processor). In various implementations, the user interface 1406 may include one or more of: a keypad, a display, a speaker, a microphone, a touchscreen display, of some other circuitry for receiving an input from or sending an output to a user.

These components can be coupled to and/or placed in electrical communication with one another via a signaling bus or other suitable component, represented generally by the connection lines in FIG. 14. The signaling bus may include any number of interconnecting buses and bridges depending on the specific application of the processing circuit 1410 and the overall design constraints. The signaling bus links together various circuits such that each of the communication interface 1402, the storage medium 1404, the user interface 1406, and the memory device 1408 are coupled to and/or in electrical communication with the processing circuit 1410. The signaling bus may also link various other circuits (not shown) such as timing sources, peripherals, voltage regulators, and power management circuits, which are well known in the art, and therefore, will not be described any further.

The communication interface 1402 provides a means for communicating with other apparatuses over a transmission medium. In some implementations, the communication interface 1402 may be adapted to facilitate wireless communication of the apparatus 1400. For example, the communication interface 1402 may include circuitry and/or programming adapted to facilitate the communication of information bi-directionally with respect to one or more communication devices in a network. Thus, in some implementations, the communication interface 1402 may be coupled to one or more antennas 1412 for wireless communication within a wireless communication system. In some implementations, the communication interface 1402 may be configured for wire-based communication. For example, the communication interface 1402 could be a bus interface, a send/receive interface, or some other type of signal interface including drivers, buffers, or other circuitry for outputting and/or obtaining signals (e.g., outputting signal from and/or receiving signals into an integrated circuit). The communication interface 1402 can be configured with one or more standalone receivers and/or transmitters, as well as one or more transceivers. In the illustrated example, the communication interface 1402 includes a transmitter 1414 and a receiver 1416. The communication interface 1402 serves as one example of a means for receiving and/or a means transmitting.

The memory device 1408 may represent one or more memory devices. As indicated, the memory device 1408 may maintain link information 1418 along with other information used by the apparatus 1400. In some implementations, the memory device 1408 and the storage medium 1404 are implemented as a common memory component. The memory device 1408 may also be used for storing data that is manipulated by the processing circuit 1410 or some other component of the apparatus 1400.

The storage medium 1404 may represent one or more computer-readable, machine-readable, and/or processor-readable devices for storing programming, such as processor executable code or instructions (e.g., software, firmware), electronic data, databases, or other digital information. The storage medium 1404 may also be used for storing data that is manipulated by the processing circuit 1410 when executing programming. The storage medium 1404 may be any available media that can be accessed by a general purpose or special purpose processor, including portable or fixed storage devices, optical storage devices, and various other mediums capable of storing, containing or carrying programming.

By way of example and not limitation, the storage medium 1404 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 1404 may be embodied in an article of manufacture (e.g., a computer program product). By way of example, a computer program product may include a computer-readable medium in packaging materials. In view of the above, in some implementations, the storage medium 1404 may be a non-transitory (e.g., tangible) storage medium.

The storage medium 1404 may be coupled to the processing circuit 1410 such that the processing circuit 1410 can read information from, and write information to, the storage medium 1404. That is, the storage medium 1404 can be coupled to the processing circuit 1410 so that the storage medium 1404 is at least accessible by the processing circuit 1410, including examples where at least one storage medium is integral to the processing circuit 1410 and/or examples where at least one storage medium is separate from the processing circuit 1410 (e.g., resident in the apparatus 1400, external to the apparatus 1400, distributed across multiple entities, etc.).

Programming stored by the storage medium 1404, when executed by the processing circuit 1410, causes the processing circuit 1410 to perform one or more of the various functions and/or process operations described herein. For example, the storage medium 1404 may include operations configured for regulating operations at one or more hardware blocks of the processing circuit 1410, as well as to utilize the communication interface 1402 for wireless communication utilizing their respective communication protocols. In some aspects, the storage medium 1404 may include computer-readable medium storing computer-executable code, including code to perform the functionality described herein.

The processing circuit 1410 is generally adapted for processing, including the execution of such programming stored on the storage medium 1404. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 1410 is arranged to obtain, process and/or send data, control data access and storage, issue commands, and control other desired operations. The processing circuit 1410 may include circuitry configured to implement desired programming provided by appropriate media in at least one example. For example, the processing circuit 1410 may be implemented as one or more processors, one or more controllers, and/or other structure configured to execute executable programming Examples of the processing circuit 1410 may include a general purpose processor, a digital signal processor (DSP), an application-specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 1410 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 1410 are for illustration and other suitable configurations within the scope of the disclosure are also contemplated.

According to one or more aspects of the disclosure, the processing circuit 1410 may be adapted to perform any or all of the features, processes, functions, operations and/or routines for any or all of the apparatuses described herein. For example, the processing circuit 1410 may be configured to perform any of the steps, functions, and/or processes described with respect to FIGS. 1-13 and 15-27. As used herein, the term "adapted" in relation to the processing circuit 1410 may refer to the processing circuit 1410 being one or more of configured, used, implemented, and/or programmed to perform a particular process, function, operation and/or routine according to various features described herein.

The processing circuit 1410 may be a specialized processor, such as an application-specific integrated circuit (ASIC) that serves as a means for (e.g., structure for) carrying out any one of the operations described in conjunction with FIGS. 1-13 and 15-27. The processing circuit 1410 serves as one example of a means for transmitting and/or a means for receiving. In various implementations, the processing circuit 1410 may provide and/or incorporate, at least in part, the functionality described above in any of FIGS. 7-13.

According to at least one example of the apparatus 1400, the processing circuit 1410 may include one or more of a circuit/module for obtaining 1420, a circuit/module for determining 1422, a circuit/module for communicating 1424, a circuit/module for outputting 1426, a circuit/module for processing 1428, a circuit/module for sending 1430, a circuit/module for allocating 1432, a circuit/module for coordinating 1434, a circuit/module for generating 1436, or a circuit/module for aggregating 1438. In various implementations, the circuit/module for obtaining 1420, the circuit/module for determining 1422, the circuit/module for communicating 1424, the circuit/module for outputting 1426, the circuit/module for processing 1428, the circuit/module for sending 1430, the circuit/module for allocating 1432, the circuit/module for coordinating 1434, the circuit/module for generating 1436, or the circuit/module for aggregating 1438 may provide and/or incorporate, at least in part, the functionality described above in any of FIGS. 7-13.

As mentioned above, programming stored by the storage medium 1404, when executed by the processing circuit 1410, causes the processing circuit 1410 to perform one or more of the various functions and/or process operations described herein. For example, the programming may cause the processing circuit 1410 to perform the various functions, steps, and/or processes described herein with respect to FIGS. 1-13 and 15-27 in various implementations. As shown in FIG. 14, the storage medium 1404 may include one or more of code for obtaining 1440, code for determining 1442, code for communicating 1444, code for outputting 1446, code for processing 1448, code for sending 1450, code for allocating 1452, code for coordinating 1454, code for generating 1456, or code for aggregating 1458. In various implementations, the code for obtaining 1440, the code for determining 1442, the code for communicating 1444, the code for outputting 1446, the code for processing 1448, the code for sending 1450, the code for allocating 1452, the code for coordinating 1454, the code for generating 1456, or the code for aggregating 1458 may be executed or otherwise used to provide the functionality described herein for the circuit/module for obtaining 1420, the circuit/module for determining 1422, the circuit/module for communicating 1424, the circuit/module for outputting 1426, the circuit/module for processing 1428, the circuit/module for sending 1430, the circuit/module for allocating 1432, the circuit/module for coordinating 1434, the circuit/module for generating 1436, or the circuit/module for aggregating 1438.

The circuit/module for obtaining 1420 may include circuitry and/or programming (e.g., code for obtaining 1440 stored on the storage medium 1404) adapted to perform several functions relating to, for example, obtaining information. In some scenarios, the circuit/module for obtaining 1420 may receive information (e.g., from the memory device 1408, the communication interface 1402, or some other component of the apparatus 1400) and process (e.g., decode) the information. In some scenarios (e.g., if the circuit/module for obtaining 1420 is or includes an RF receiver), the circuit/module for obtaining 1420 may receive information directly from a device that transmitted the information. In any case, the circuit/module for obtaining 1420 may output the received information to another component of the apparatus 1400 (e.g., the circuit/module for determining 1422, the circuit/module for generating 1436, the memory device 1408, or some other component).

The circuit/module for obtaining 1420 (e.g., a means for obtaining) may take various forms. In some aspects, the circuit/module for obtaining 1420 may correspond to, for example, a processing circuit as discussed herein. In some aspects, the circuit/module for communicating 1422 may correspond to, for example, an interface (e.g., a bus interface, a receive interface, or some other type of signal interface), a communication device, a transceiver, a receiver, or some other similar component as discussed herein. In some implementations, the communication interface 1402 includes the circuit/module for obtaining 1420 and/or the code for obtaining 1440. In some implementations, the circuit/module for obtaining 1420 and/or the code for obtaining 1440 is configured to control the communication interface 1402 (e.g., a transceiver or a receiver) to communicate the information.

The circuit/module for determining 1422 may include circuitry and/or programming (e.g., code for determining 1442 stored on the storage medium 1404) adapted to perform several functions relating to, for example, determining whether to perform an operation. In some aspects, the circuit/module for determining 1422 (e.g., a means for determining) may correspond to, for example, a processing circuit.

In some scenarios, the circuit/module for determining 1422 may obtain information upon which the determination is to be based. For example, the circuit/module for determining 1422 may obtain sensing information, an indication, RF isolation information, an indication of information carried by a link, a distance between antenna sub-arrays, or channel condition information (e.g., from the communication interface 1402, the memory device 1408, or some other component of the apparatus 1400). The circuit/module for determining 1422 may then make the determination based on the obtained information. For example, the circuit/module for determining 1422 may determine whether to transmit, determine whether to communicate, determine an interaction, determine a type of information, determine whether a power control signal is to control transmit power, or determine whether a feedback signal is to be based on channel state information. The circuit/module for determining 1422 may then output an indication of the determination (e.g., to the circuit/module for communicating 1424, the circuit/module for allocating 1432, the memory device 1408, or some other component).

The circuit/module for communicating 1424 may include circuitry and/or programming (e.g., code for communicating 1444 stored on the storage medium 1404) adapted to perform several functions relating to, for example, communicating information. In some implementations, the communication involves receiving the information. In some implementations, the communication involves sending (e.g., transmitting) the information.

In some implementations where the communicating involves receiving information, the circuit/module for communicating 1424 receives information (e.g., from the communication interface 1402, the receiver 1416, the memory device 1408, some other component of the apparatus 1400, or some other device), processes (e.g., decodes) the information, and outputs the information to another component of the apparatus 1400 (e.g., the circuit/module for decoding 1420, the memory device 1408, or some other component). In some scenarios (e.g., if the circuit/module for communicating 1424 includes a receiver), the communicating involves the circuit/module for communicating 1424 receiving information directly from a device that transmitted the information (e.g., via radio frequency signaling or some other type of signaling suitable for the applicable communication medium).

In some implementations where the communicating involves sending information, the circuit/module for communicating 1424 obtains information (e.g., from the memory device 1408 or some other component of the apparatus 1400), processes (e.g., encodes for transmission) the information, and outputs the processed information. In some scenarios, the communicating involves sending the information to another component of the apparatus 1400 (e.g., the transmitter 1414, the communication interface 1402, or some other component) that will transmit the information to another device. In some scenarios (e.g., if the circuit/module for communicating 1424 includes a transmitter), the communicating involves the circuit/module for communicating 1424 transmitting the information directly to another device (e.g., the ultimate destination) via radio frequency signaling or some other type of signaling suitable for the applicable communication medium.

The circuit/module for communicating 1424 (e.g., a means for communicating) may take various forms. In some aspects, the circuit/module for communicating 1424 may correspond to, for example, an interface (e.g., a bus interface, a send/receive interface, or some other type of signal interface), a communication device, a transceiver, a transmitter, a receiver, or some other similar component as discussed herein. In some implementations, the communication interface 1402 includes the circuit/module for communicating 1424 and/or the code for communicating 1444. In some implementations, the circuit/module for communicating 1424 and/or the code for communicating 1444 is configured to control the communication interface 1402 (e.g., a transceiver, a receiver, or a transmitter) to communicate the information.

The circuit/module for outputting 1426 may include circuitry and/or programming (e.g., code for outputting 1446 stored on the storage medium 1404) adapted to perform several functions relating to, for example, outputting (e.g., sending or transmitting) information. In some implementations, the circuit/module for outputting 1426 may obtain information (e.g., from the circuit/module for obtaining 1420, the memory device 1408, or some other component of the apparatus 1400) and process the information (e.g., encode the information for transmission). In some scenarios, the circuit/module for outputting 1426 sends the information to another component (e.g., the circuit/module for communicating 1424, the transmitter 1414, the communication interface 1402, or some other component) that will send the information to another device. In some scenarios (e.g., if the circuit/module for outputting 1426 includes a transmitter), the circuit/module for outputting 1426 transmits the information directly to another device (e.g., the ultimate destination) via radio frequency signaling or some other type of signaling suitable for the applicable communication medium.

The circuit/module for outputting 1426 (e.g., a means for outputting) may take various forms. In some aspects, the circuit/module for outputting 1426 may correspond to, for example, a processing circuit as discussed herein. In some aspects, the circuit/module for outputting 1426 may correspond to, for example, an interface (e.g., a bus interface, a send interface, or some other type of signal interface), a communication device, a transceiver, a transmitter, or some other similar component as discussed herein. In some implementations, the communication interface 1402 includes the circuit/module for outputting 1426 and/or the code for outputting 1446. In some implementations, the circuit/module for outputting 1426 and/or the code for outputting 1446 is configured to control the communication interface 1402 (e.g., a transceiver or a transmitter) to transmit information.

The circuit/module for processing 1428 may include circuitry and/or programming (e.g., code for processing 1448 stored on the storage medium 1404) adapted to perform several functions relating to, for example, processing information. In some aspects, the circuit/module for processing 1428 (e.g., a means for processing) may correspond to, for example, a processing circuit.

Initially, the circuit/module for processing 1428 obtains at least one first transport block and at least one second transport block. The circuit/module for processing 1428 may obtain this information, for example, from the communication interface 1402, the memory device 1408, or some other component of the apparatus 1400. The circuit/module for processing 1428 then processes the at least one first transport block and processes the at least one second transport block, where the processing of the at least one first transport block is independent of (at least in some aspects, e.g., error processing) of the processing the at least one second transport block. The circuit/module for processing 1428 may then output a result of the processing to another component of the apparatus 1400 (e.g., the memory device 1408, the communication interface 1402, or some other component).

The circuit/module for sending 1430 may include circuitry and/or programming (e.g., code for sending 1450 stored on the storage medium 1404) adapted to perform several functions relating to, for example, sending (e.g., transmitting) information. In some implementations, the circuit/module for sending 1430 may obtain information (e.g., from the memory device 1408, or some other component of the apparatus 1400), process the information (e.g., encode the information for transmission), and send the information to another component (e.g., the transmitter 1414, the communication interface 1402, or some other component) that will transmit the information to another device. In some scenarios (e.g., if the circuit/module for sending 1430 includes a transmitter), the circuit/module for sending 1430 transmits the information directly to another device (e.g., the ultimate destination) via radio frequency signaling or some other type of signaling suitable for the applicable communication medium.

The circuit/module for sending 1430 (e.g., a means for sending) may take various forms. In some aspects, the circuit/module for sending 1430 may correspond to, for example, an interface (e.g., a bus interface, a send/receive interface, or some other type of signal interface), a communication device, a transceiver, a transmitter, or some other similar component as discussed herein. In some implementations, the communication interface 1402 includes the circuit/module for sending 1430 and/or the code for sending 1450. In some implementations, the circuit/module for sending 1430 and/or the code for sending 1450 is configured to control the communication interface 1402 (e.g., a transceiver or a transmitter) to transmit information.

The circuit/module for allocating 1432 may include circuitry and/or programming (e.g., code for allocating 1452 stored on the storage medium 1404) adapted to perform several functions relating to, for example, allocating a resource. In some aspects, the circuit/module for allocating 1432 (e.g., a means for allocating) may correspond to, for example, a processing circuit.

In some aspects, the circuit/module for allocating 1432 may obtain information (e.g., from the means for obtaining 1420, the memory device 1408, or some other component) about available resources and information about an interaction between links. The circuit/module for allocating 1432 may then select an allocation based on the interaction (e.g., as discussed herein) and output an indication of the allocation to a component of the apparatus 1400 (e.g., the circuit/module for communicating 1424, the memory device 1408, or some other component).

The circuit/module for coordinating 1434 may include circuitry and/or programming (e.g., code for coordinating 1454 stored on the storage medium 1404) adapted to perform several functions relating to, for example, coordinating with another device. In some aspects, the circuit/module for coordinating 1434 (e.g., a means for coordinating) may correspond to, for example, a processing circuit.

In some aspects, the circuit/module for coordinating 1434 may obtain information (e.g., a protected portion of RF resources) upon which the coordination is to be based (e.g., from the means for obtaining 1420, the memory device 1408, or some other component). The circuit/module for coordinating 1434 may then communicate with another device (e.g., via the circuit/module for communicating 1424, the memory device 1408, the communication interface 1402, or some other component) to select or otherwise use at least one RF resource.

The circuit/module for generating 1436 may include circuitry and/or programming (e.g., code for generating 1456 stored on the storage medium 1404) adapted to perform several functions relating to, for example, generating information. In some aspects, the circuit/module for generating 1436 (e.g., a means for generating) may correspond to, for example, a processing circuit.

In some aspects, the circuit/module for generating 1436 may generate a feedback signal based on obtained channel state information for multiple links. In some aspects, the circuit/module for generating 1436 may generate an event trigger based on obtained measurement information for multiple links. The circuit/module for generating 1436 then outputs the generated information (e.g., to the circuit/module for communicating 1424, the memory device 1408, the communication interface 1402, or some other component).

The circuit/module for aggregating 1438 may include circuitry and/or programming (e.g., code for aggregating 1458 stored on the storage medium 1404) adapted to perform several functions relating to, for example, aggregating information. In some aspects, the circuit/module for aggregating 1438 (e.g., a means for aggregating) may correspond to, for example, a processing circuit.

In some aspects, the circuit/module for aggregating 1438 may obtain, over a period of time, information to be aggregated (e.g., from the means for obtaining 1420, the memory device 1408, or some other component). The circuit/module for aggregating 1438 may thus store the information as it is collected (e.g., in the memory device 1408, or some other component). The circuit/module for aggregating 1438 then outputs the aggregated information or information about the aggregated information (e.g., to the circuit/module for communicating 1424, the memory device 1408, the communication interface 1402, or some other component).

Example Processes

FIGS. 15-27 illustrate processes 1500-2700 for communication in accordance with some aspects of the disclosure. Each process may be independent or used in conjunction with (e.g., used at least in part with) one or more of the other processes. Each process may take place within a processing circuit (e.g., the processing circuit 1410 of FIG. 14), which may be located in a UE, a TRP, a gNB, a BS, or some other suitable apparatus. Of course, in various aspects within the scope of the disclosure, each process may be implemented by any suitable apparatus capable of supporting communication-related operations.

For purposes of illustration, the following operations may be described in the context of a first wireless communication link and a second wireless communication link. It should be appreciated that these teachings are applicable to a different number of links (e.g., 3 or more).

Also, in each example process, the first wireless communication link and the second wireless communication link may be independent links. To this end, the links may have or may be associated with one of more of the characteristics that follow.

In some aspects, an apparatus may communicate first transport blocks via the first wireless communication link, where the first transport blocks may be processed independently of second transport blocks communicated via the second wireless communication link. In some aspects, error processing of the first transport blocks may be independent of error processing of the second transport blocks. In some aspects, cyclic redundancy check (CRC) processing of the first transport blocks may be independent of CRC processing of the second transport blocks.

As discussed herein, the first wireless communication link and the second wireless communication link may be beamformed links. Thus, in some aspects, the communication of the first transport blocks may be via a first beam; and the communication of the second transport blocks may be via a second beam. In some aspects, communication on (e.g., via) the first wireless communication link may use a first radio frequency (RF) chain of the apparatus; while communication on the second wireless communication link may use a second RF chain of the apparatus. In some aspects, communication on the first wireless communication link may use a first antenna sub-array of the apparatus; while communication on the second wireless communication link may use a second antenna sub-array of the apparatus.

Example Channel Sensing Processes

Figure 15:
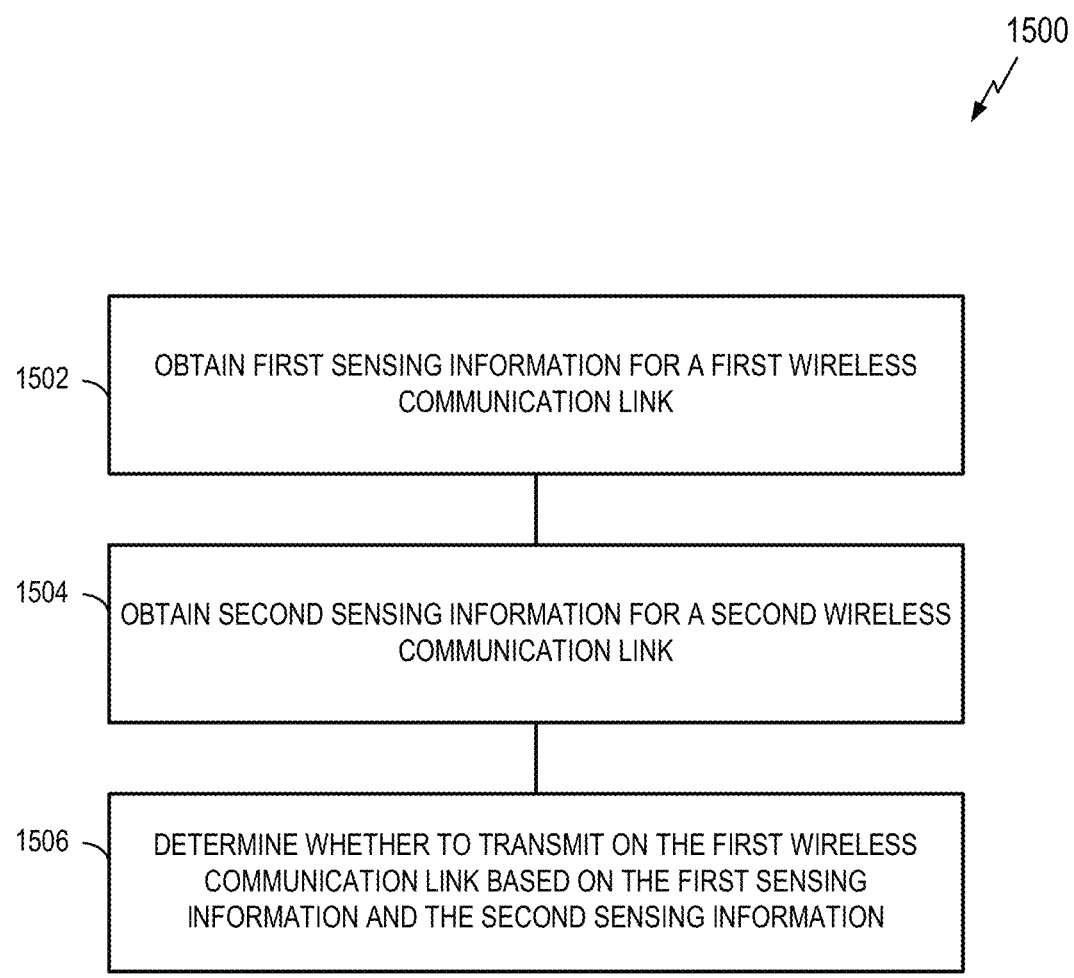
FIG. 15 is flowchart illustrating an example sensing information process in accordance with some aspects of the disclosure.
Figure 16:
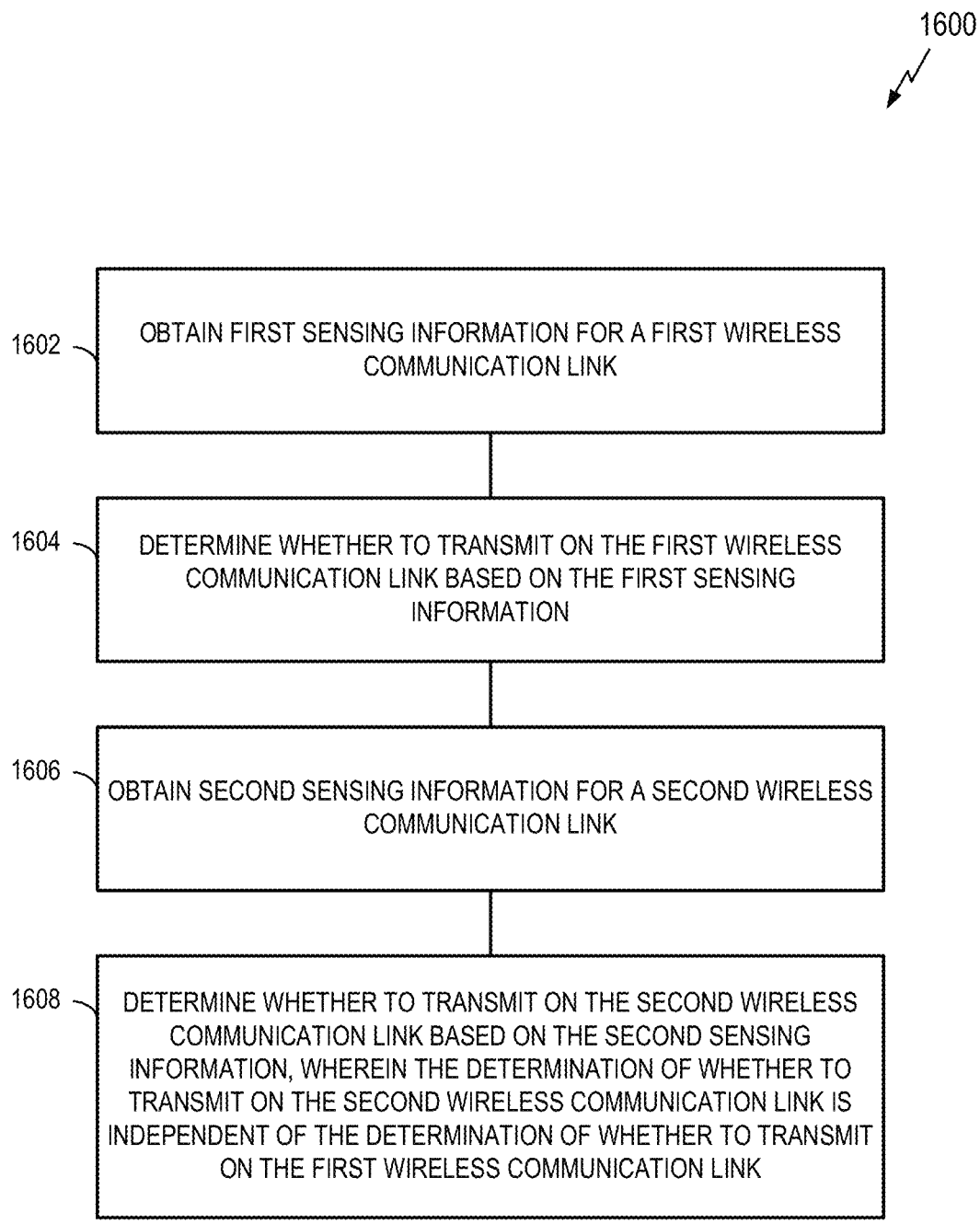
FIG. 16 is flowchart illustrating another example sensing information process in accordance with some aspects of the disclosure.

FIGS. 15 and 16 describe processes for channel sensing.

At block 1502 of FIG. 15, an apparatus (e.g., a UE) obtains first sensing information for a first wireless communication link. In some aspects, the obtaining of the first sensing information may include sensing using a first beam associated with the first wireless communication link.

At block 1504, the apparatus obtains second sensing information for a second wireless communication link. In some aspects (e.g., if the apparatus is a UE), the obtaining of the second sensing information may include sensing using a second beam associated with the second wireless communication link. In some aspects (e.g., if the apparatus is a TRP), the obtaining of the second sensing information may include receiving the second sensing information from another apparatus that is configured to sense using a second beam associated with the second wireless communication link. In some aspects, the process 1500 may include outputting the first sensing information for transmission to the other apparatus.

At block 1506, the apparatus determines whether to transmit on the first wireless communication link based on the first sensing information and the second sensing information. For example, the apparatus may communicate first transport blocks via the first wireless communication link if the determination is to transmit.

In some aspects, the first wireless communication link and the second wireless communication link may be members of a channel sensing group. In this case, a common set of channel sensing parameters may be used for sensing by all member of the channel sensing group. In some aspects, the sensing may include a listen before talk operation.

In some aspects, the process 1500 may further include determining whether to transmit on the second wireless communication link based on the first sensing information and the second sensing information.

In some aspects, the process 1500 may further include communicating on the first wireless communication link using a first radio frequency (RF) chain of the apparatus; and communicating on the second wireless communication link using a second RF chain of the apparatus.

In some aspects, the process 1500 may further include communicating on the first wireless communication link using a first antenna sub-array of the apparatus; and communicating on the second wireless communication link using a second antenna sub-array of the apparatus.

Referring now to FIG. 16, at block 1602 an apparatus (e.g., a UE) obtains first sensing information for a first wireless communication link.

At block 1604, the apparatus determines whether to transmit on the first wireless communication link based on the first sensing information.

At block 1606, the apparatus obtains second sensing information for a second wireless communication link.

In some aspects, the obtaining of the first sensing information may be a first channel sensing operation. In addition, the obtaining of the second sensing information may be a second channel sensing operation, where the second channel sensing operation is independent of the first channel sensing operation. In some aspects, the first channel sensing operation may use a first beam, and the second channel sensing operation may use a second beam.

At block 1608, the apparatus determines whether to transmit on the second wireless communication link based on the second sensing information. Here, the determination of whether to transmit on the second wireless communication link may be independent of the determination of whether to transmit on the first wireless communication link.

In some aspects, the process 1600 may further include communicating first transport blocks via the first wireless communication link if the determination of whether to transmit on the first wireless communication link is to transmit; communicating second transport blocks via the second wireless communication link if the determination of whether to transmit on the second wireless communication link is to transmit; and processing the first transport blocks independently of the second transport blocks. In some aspect, the processing may include error processing. In some aspect, the processing may include cyclic redundancy check (CRC) processing.

Example Control Channel Processes

Figure 17:
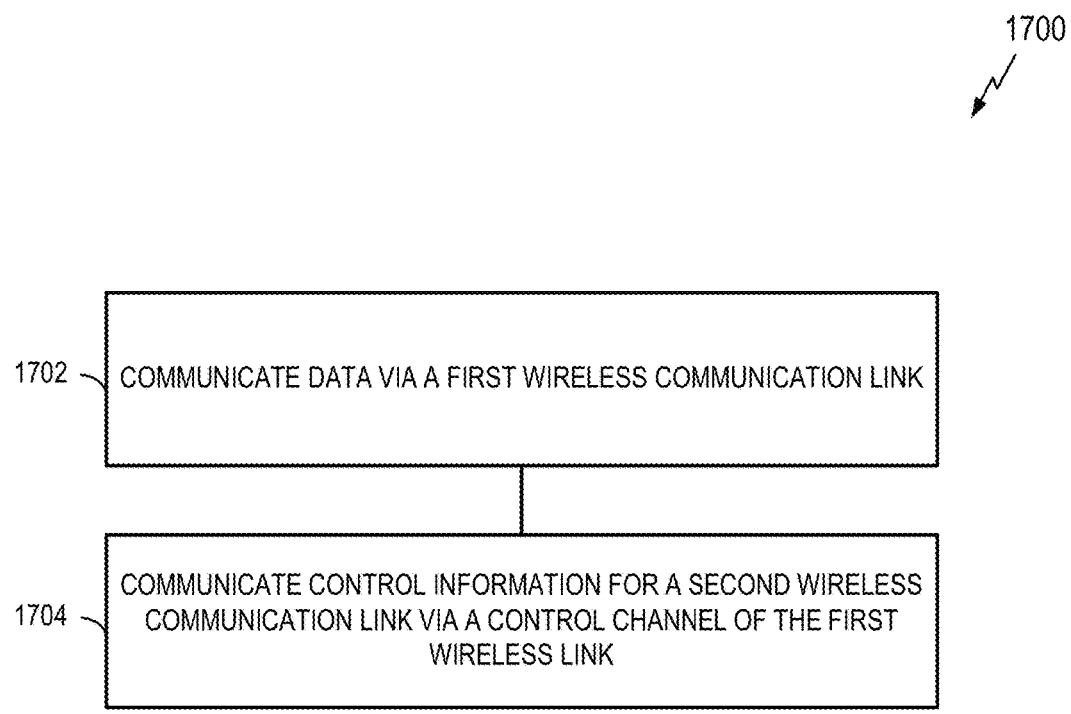
FIG. 17 is flowchart illustrating an example control information process in accordance with some aspects of the disclosure.
Figure 18:
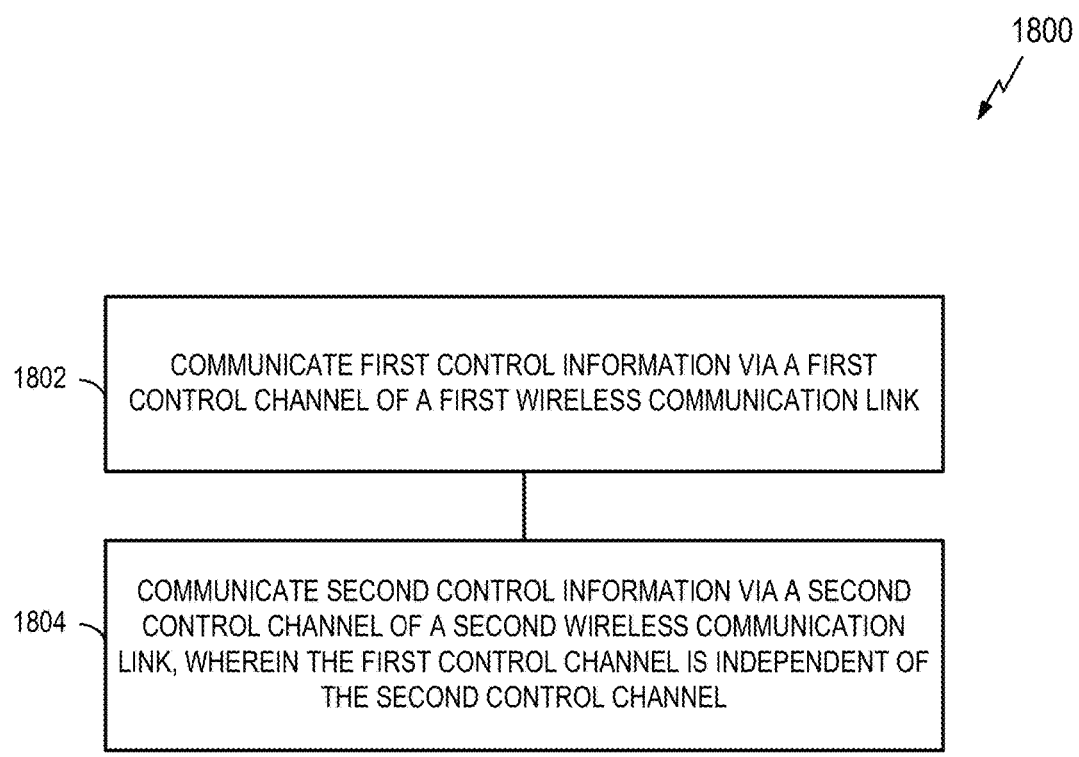
FIG. 18 is flowchart illustrating another example control information process in accordance with some aspects of the disclosure.

FIGS. 17 and 18 describe processes for control channel signaling.

At block 1702 of FIG. 17, an apparatus (e.g., a UE) communicates data via a first wireless communication link.

At block 1704, the apparatus communicates control information for a second wireless communication link via a control channel of the first wireless communication link. In some aspects, the control channel may be a physical downlink control channel (PDCCH).

In some aspects, the first wireless communication link may be provisioned to carry a first type of control information, while the second wireless communication link may be provisioned to carry a second type of control information that is different from the first type of control information.

The control information may take different forms in different implementations. In some aspects, the control information may include an indication that the second wireless communication link exists. In some aspects, the control information may include an indication that the second wireless communication link is active. In some aspects, the control information may include hybrid automatic repeat request (HARQ) feedback for the second wireless communication link.

In some aspects, the process 1700 may include determining, based on at least one indication, whether to communicate control information for a group of independent links via the control channel of the first wireless communication link.

In some aspects, the process 1700 may include sending the control information to another apparatus that is configured to communicate via the second wireless communication link.

In some aspects, the process 1700 may include communicating other data via the second wireless communication link.

Referring now to FIG. 18, at block 1802 an apparatus (e.g., a UE) communicates first control information via a first control channel of a first wireless communication link.

At block 1804, the apparatus communicates second control information via a second control channel of a second wireless communication link. In some aspects, the first control channel may be independent of the second control channel.

In some aspects, the process 1800 may include communicating first transport blocks via the first wireless communication link; communicating second transport blocks via the second wireless communication link; and processing the first transport blocks independently of the second transport blocks. In some aspects, the processing may include error processing. In some aspects, the processing may include cyclic redundancy check (CRC) processing.

Example Allocation Process

Figure 19:
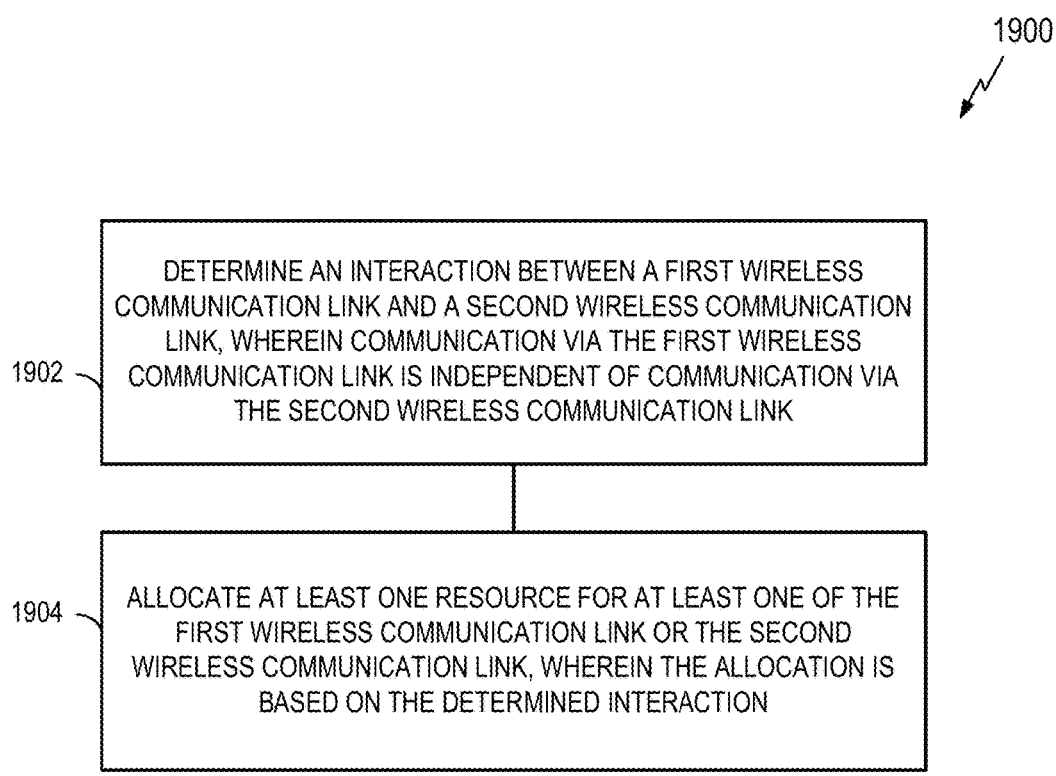
FIG. 19 is flowchart illustrating an example allocation process in accordance with some aspects of the disclosure.

FIG. 19 describes an allocation process.

At block 1902 of FIG. 19, an apparatus (e.g., a UE) determines an interaction between a first wireless communication link and a second wireless communication link. In some aspects, communication via the first wireless communication link may be independent of communication via the second wireless communication link.

The interaction may take different forms in different scenarios. In some aspects, the interaction may be characterized by an amount of radio frequency (RF) isolation between the first wireless communication link and the second wireless communication link. In some aspects, the interaction may be characterized by an amount of radio frequency (RF) interference between the first wireless communication link and the second wireless communication link.

At block 1904, the apparatus allocates at least one resource for at least one of the first wireless communication link or the second wireless communication link. In some aspects, the allocation may be based on the determined interaction.

If the RF isolation is less than an RF isolation threshold, the allocation may include: designating the communication via the first wireless communication link to be in a first direction for a particular symbol time; and designating the communication via the second wireless communication link to be in a second direction, different from the first direction, for the particular symbol time. In some aspects, the first direction may be an uplink direction; and the second direction may be a downlink direction.

If the RF isolation is greater than an RF isolation threshold, the allocation may include: designating the communication via the first wireless communication link to be in a first direction for a particular symbol time; and designating the communication via the second wireless communication link to be in the first direction for the particular symbol time.

If the RF isolation is less than an RF isolation threshold, the allocation may include: designating uplink sounding for the first wireless communication link to be time division multiplexed within a sub-frame.

In some aspects, the process 1900 may include determining at least one type of information carried by the first wireless communication link or the second wireless communication link; and allocating at least one resource for at least one of the first wireless communication link or the second wireless communication link, wherein the allocation may be based on the determined at least one type of information.

In some aspects, the process 1900 may include identifying a protected portion for the first wireless communication link; and limiting transmission on the second wireless communication link for a subset of frequency resources associated with the protected portion. The limiting of transmission may include reducing transmit power or temporarily ceasing transmission. In addition, the process 1900 may include coordinating the protected portion with at least one other apparatus (e.g., an SNP).

Example Power Control Processes

Figure 20:
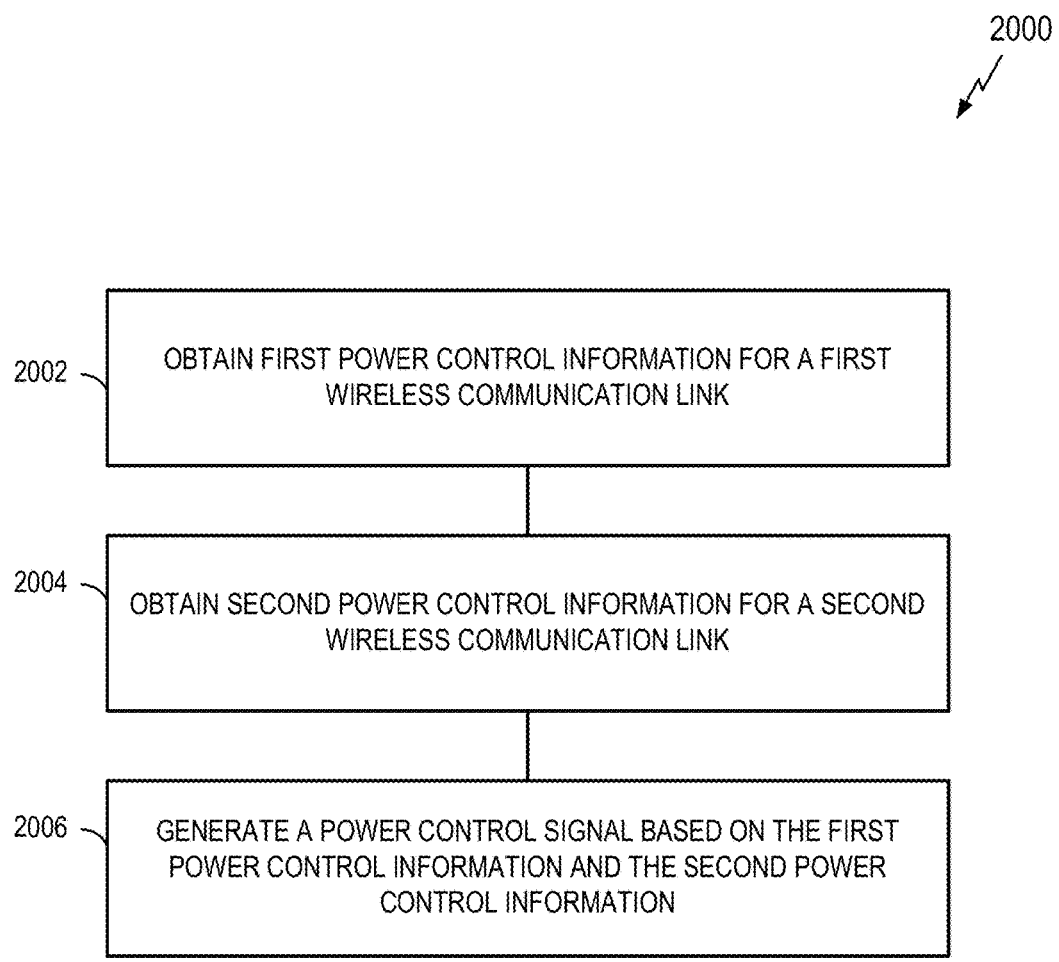
FIG. 20 is flowchart illustrating an example power control process in accordance with some aspects of the disclosure.
Figure 21:
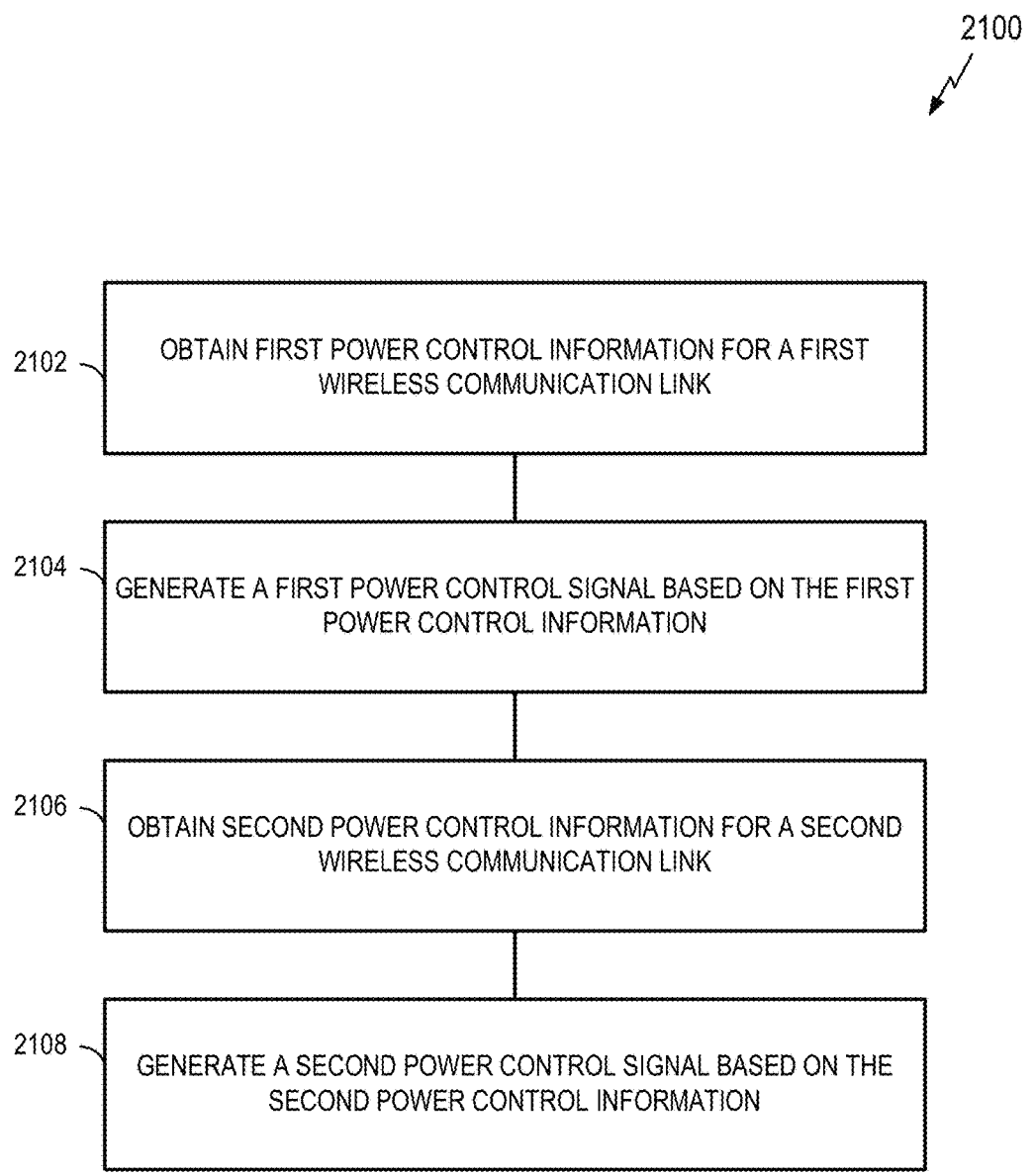
FIG. 21 is flowchart illustrating another example power control process in accordance with some aspects of the disclosure.

FIGS. 20 and 21 describe processes for power control.

At block 2002 of FIG. 20, an apparatus (e.g., a UE) obtains first power control information for a first wireless communication link. In some aspects, the obtaining of the first power control information may include receiving first signals using a first beam associated with the first wireless communication link.

At block 2004, the apparatus obtains second power control information for a second wireless communication link. In some aspects (e.g., if the apparatus is a TRP), the obtaining of the second power control information may include receiving the second power control information from another apparatus that is configured to receive second signals using a second beam associated with the second wireless communication link. In some aspects, the process 2000 may include outputting the first power control information for transmission to the other apparatus. In some aspects (e.g., if the apparatus is a UE), the obtaining of the second power control information may include receiving second signals using a second beam associated with the second wireless communication link.

In some aspects, the first power control information may include first power control commands sent via the first wireless communication link; and the second power control information may include second power control commands sent via the second wireless communication link.

At block 2006, the apparatus generates a power control signal based on the first power control information and the second power control information.

In some aspects, the power control signal may be for controlling transmit power across a plurality of wireless communication links including the first wireless communication link and the second wireless communication link. In this case, the power control signal may indicate a maximum transmit power across the plurality of wireless communication links.

In some aspects, the process 2000 may include determining whether the power control signal is to control transmit power across a plurality of wireless communication links including the first wireless communication link and the second wireless communication link. In some aspects, the determination may be based on whether the first wireless communication link and the second wireless communication link share a radio frequency (RF) band.

In some scenarios, the first power control information may include a first indication of transmission power on the first wireless communication link; the second power control information may include a second indication of transmission power on the second wireless communication link; and the power control signal may include a power control constraint across the first wireless communication link and the second wireless communication link.

Referring now to FIG. 21, at block 2102 an apparatus (e.g., a UE) obtains first power control information for a first wireless communication link.

At block 2104, the apparatus generates a first power control signal based on the first power control information. In some aspects, the obtaining of the first power control information may include a first power control operation. In some aspects, the first power control operation may use a first beam.

At block 2106, the apparatus obtains second power control information for a second wireless communication link. In some aspects, the obtaining of the second power control information may include a second power control operation. The second power control operation may be independent of the first power control operation. In some aspects, the second power control operation may use a second beam.

At block 2108, the apparatus generates a second power control signal based on the second power control information.

In some aspects, the process 2100 may include communicating first transport blocks via the first wireless communication link; communicating second transport blocks via the second wireless communication link; and processing the first transport blocks independently of the second transport blocks. In some aspects, the processing may include error processing. In some aspects, the processing may include cyclic redundancy check (CRC) processing.

Example Channel Status Feedback Processes

Figure 22:
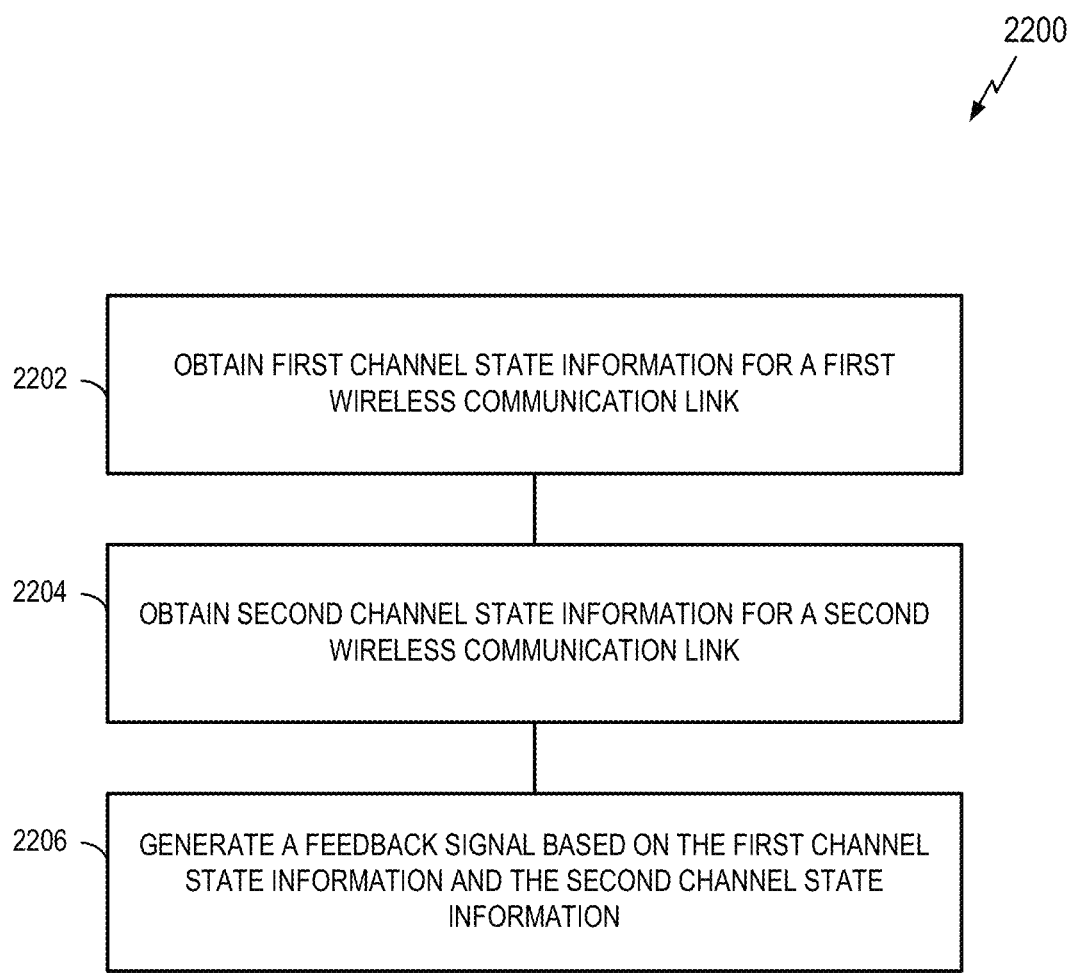
FIG. 22 is flowchart illustrating an example feedback process in accordance with some aspects of the disclosure.
Figure 23:
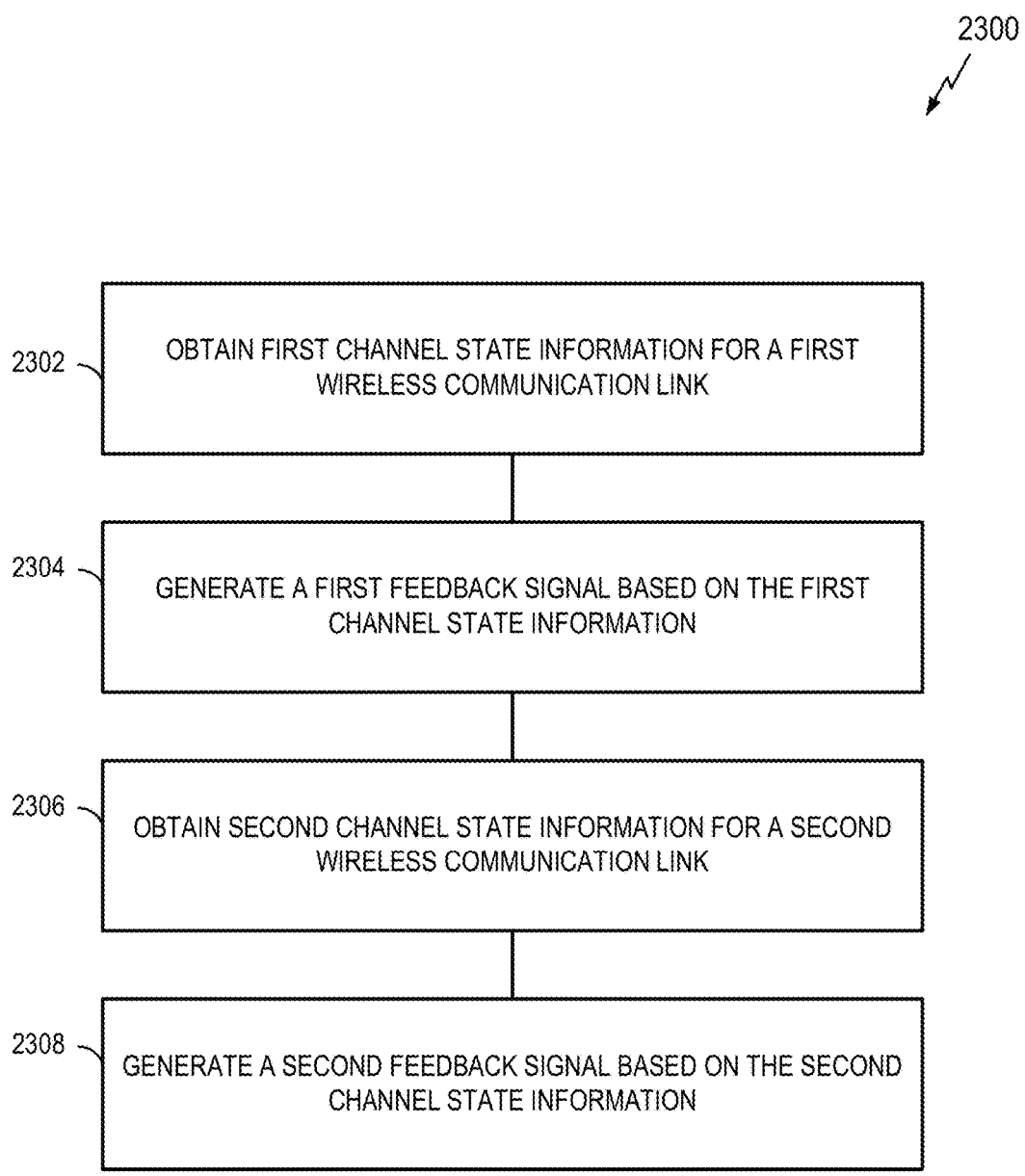
FIG. 23 is flowchart illustrating another example feedback process in accordance with some aspects of the disclosure.

FIGS. 22 and 23 describe processes for channel status feedback.

At block 2202 of FIG. 22, an apparatus (e.g., a UE) obtains first channel state information for a first wireless communication link. In some aspects, the obtaining of the first channel state information may include receiving first signals using a first beam associated with the first wireless communication link.

At block 2204, the apparatus obtains second channel state information for a second wireless communication link. In some aspects (e.g., if the apparatus is a TRP), the obtaining of the second channel state information may include receiving the second channel state information from another apparatus that is configured to receive second signals using a second beam associated with the second wireless communication link. In some aspects, the process 2200 may include outputting the first channel state information for transmission to the other apparatus. In some aspects (e.g., if the apparatus is a UE), the obtaining of the second channel state information may include receiving second signals using a second beam associated with the second wireless communication link.

At block 2206, the apparatus generates a feedback signal based on the first channel state information and the second channel state information. In some aspects, the feedback signal may include channel state information (CSI) feedback. In this case, the first channel state information may include a first channel state information reference signal (CSI-RS) sent via the first wireless communication link; and the second channel state information may include a second CSI-RS sent via the second wireless communication link.

In some aspects, the process 2200 may include determining whether the feedback signal is to be based on the first channel state information and the second channel state information, where the determination is based on whether a first antenna sub-array for the first wireless communication link is within a threshold distance of a second antenna sub-array for the second wireless communication link.

In some aspects, the process 2200 may include determining whether the feedback signal is to be based on the first channel state information and the second channel state information, where the determination may be based on a first channel condition for the first wireless communication link, a second channel condition for the second wireless communication link, or a combination thereof.

Referring now to FIG. 23, at block 2302 an apparatus (e.g., a UE) obtains first channel state information for a first wireless communication link. In some aspects, the obtaining of the first channel state information may include a first channel state operation. In some aspects, the first channel state operation may use a first beam.

At block 2304, the apparatus generates a first feedback signal based on the first channel state information. In some aspects, the first feedback signal may include first channel state information (CSI) feedback. In addition, the first channel state information may include a first channel state information reference signal (CSI-RS) sent via the first wireless communication link.

At block 2306, the apparatus obtains second channel state information for a second wireless communication link. In some aspects, the obtaining of the second channel state information may include a second channel state operation. The second channel state operation may be independent of the first channel state operation. In some aspects, the second channel state operation may use a second beam.

At block 2308, the apparatus generates a second feedback signal based on the second channel state information. In some aspects, the second feedback signal may include second CSI feedback. In addition, the second channel state information may include a second CSI-RS sent via the second wireless communication link.

In some aspects, the process 2300 may include communicating first transport blocks via the first wireless communication link; communicating second transport blocks via the second wireless communication link; and processing the first transport blocks independently of the second transport blocks. In some aspects, the processing may include error processing. In some aspects, the processing may include cyclic redundancy check (CRC) processing.

Example Beam Information Processes

Figure 24:
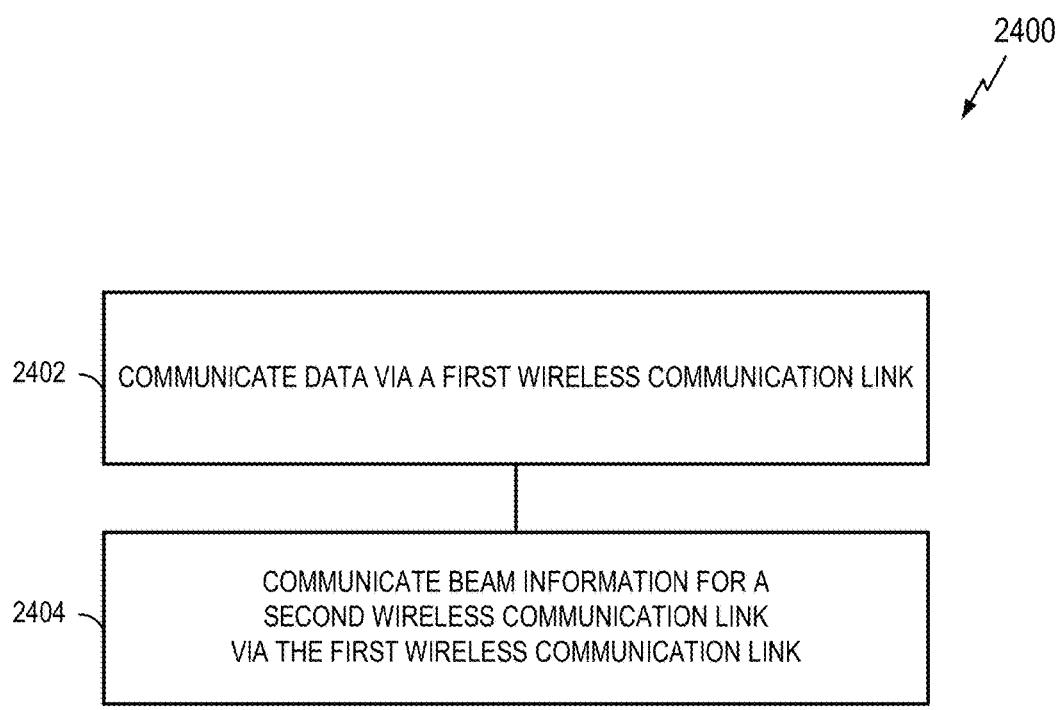
FIG. 24 is flowchart illustrating an example beam information process in accordance with some aspects of the disclosure.
Figure 25:
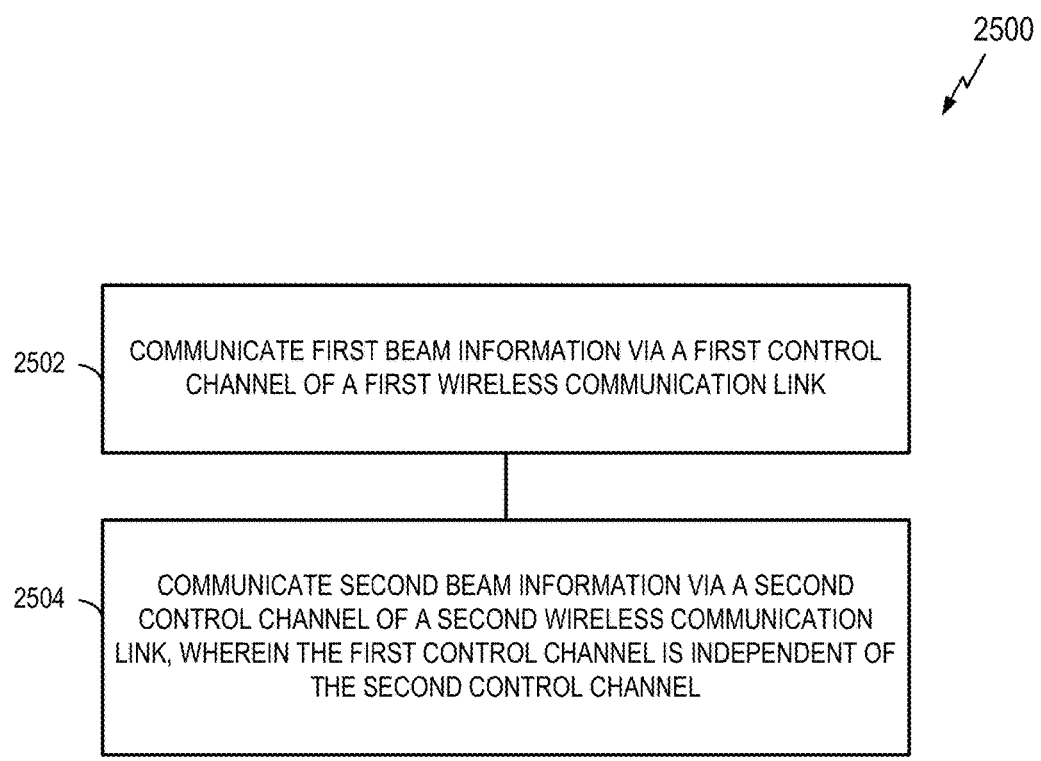
FIG. 25 is flowchart illustrating another example beam information process in accordance with some aspects of the disclosure.

FIGS. 24 and 25 describe processes for communicating beam information.

At block 2402 of FIG. 24, an apparatus (e.g., a UE) communicates data via a first wireless communication link.

At block 2404, the apparatus communicates beam information for a second wireless communication link via the first wireless communication link.

The beam information may take different forms in different scenarios. In some aspects, the beam information may indicate that at least one beam for at least one wireless communication link is being switched. In some aspects, the beam information may indicate that a user equipment (UE) is switching to another beam or beam direction. In some aspects, the beam information may include a random access channel (RACH) message or a scheduling request (SR), where the RACH message or the SR is indicative of a beam failure on the second wireless communication link. In some aspects, the beam information may indicate a failure event on the second wireless communication link. In some aspects, the beam information may be a confirmation of a beam switch. In some aspects, the beam information may include: beam recovery information, an indication to send new beam pairing information, an indication of a preferred beam, a beam identifier, a designated time for a beam switch, or any combination thereof.

In some aspects, the process 2400 may include sending the beam information to another apparatus that is configured to communicate via the second wireless communication link.

In some aspects, the process 2400 may include communicating other data via the second wireless communication link.

Referring now to FIG. 25, at block 2502 an apparatus (e.g., a UE) communicates first beam information via a first control channel of a first wireless communication link.

At block 2504, the apparatus communicates second beam information via a second control channel of a second wireless communication link, wherein the first control channel is independent of the second control channel.

In some aspects, the process 2500 may include communicating first transport blocks via the first wireless communication link; communicating second transport blocks via the second wireless communication link; and processing the first transport blocks independently of the second transport blocks. In some aspects, the processing may include error processing. In some aspects, the processing may include cyclic redundancy check (CRC) processing.

Example Link Measurement and Event Trigger Processes

Figure 26:
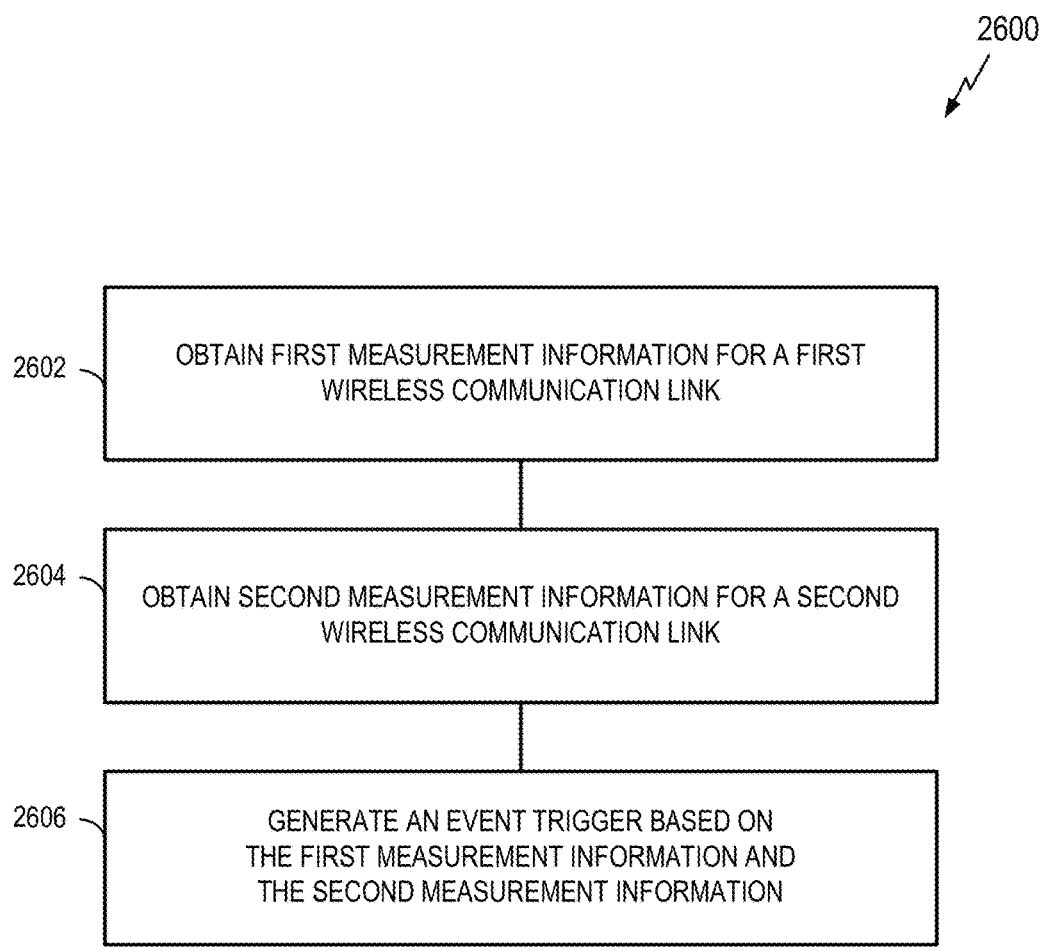
FIG. 26 is flowchart illustrating an example event trigger process in accordance with some aspects of the disclosure.
Figure 27:
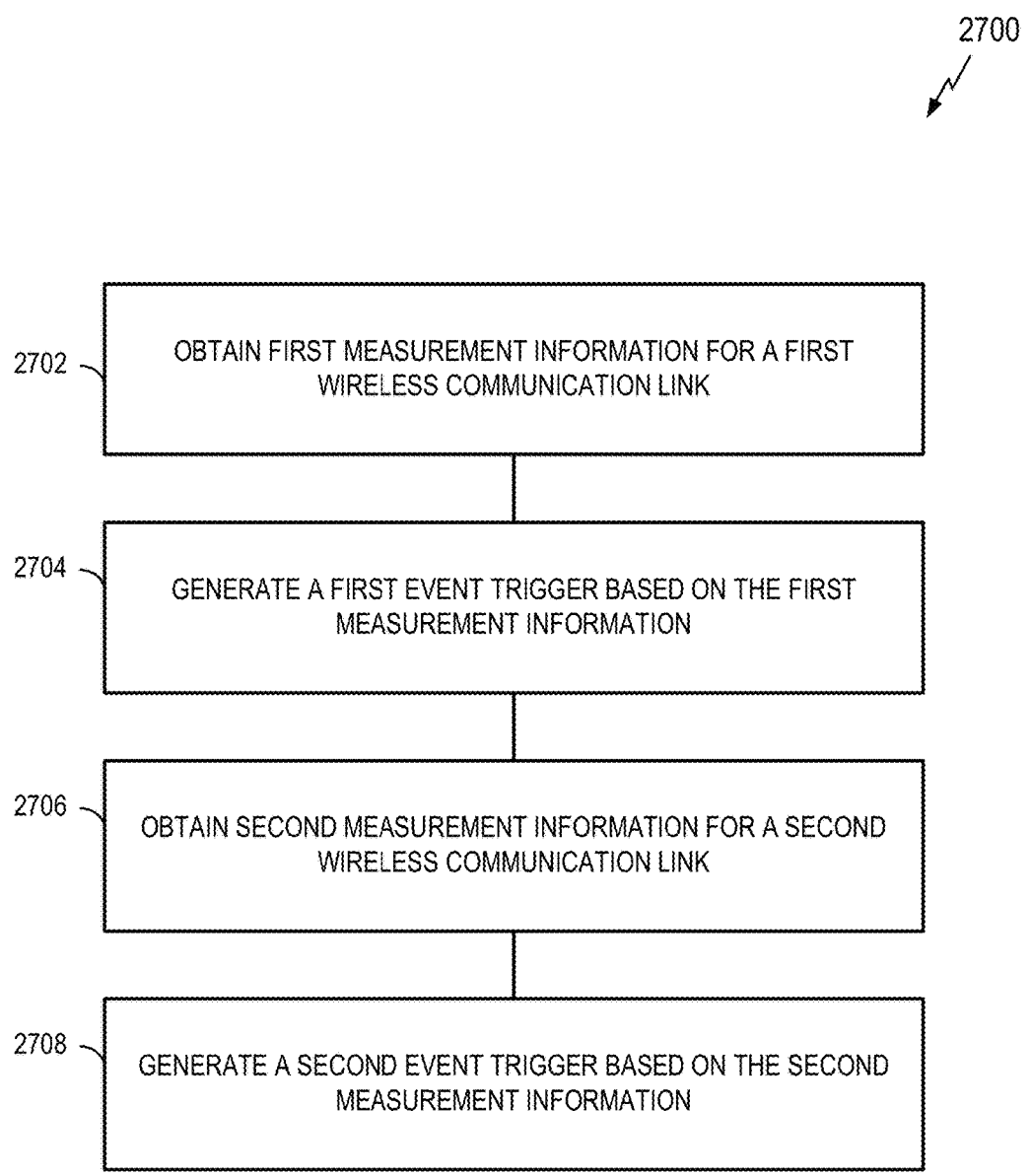
FIG. 27 is flowchart illustrating another example event trigger process in accordance with some aspects of the disclosure.

FIGS. 26 and 27 describe processes for link measurements and event triggers.

At block 2602 of FIG. 26, an apparatus (e.g., a UE) obtains first measurement information for a first wireless communication link. In some aspects, the obtaining of the first measurement information may include receiving first signals using a first beam associated with the first wireless communication link.

At block 2604, the apparatus obtains second measurement information for a second wireless communication link. In some aspects (e.g., if the apparatus is a TRP), the obtaining of the second measurement information may include receiving the second measurement information from another apparatus that is configured to receive second signals using a second beam associated with the second wireless communication link. In some aspects, the process 2600 may include outputting the first measurement information for transmission to the other apparatus. In some aspects (e.g., if the apparatus is a UE), the obtaining of the second measurement information may include receiving second signals using a second beam associated with the second wireless communication link.

At block 2606, the apparatus generates an event trigger based on the first measurement information and the second measurement information.

In some aspects, the process 2600 may include aggregating the first measurement information and the second measurement information. In this case, the event trigger may be generated based on the aggregated first measurement information and second measurement information.

Referring now to FIG. 27, at block 2702 an apparatus (e.g., a UE) obtains first measurement information for a first wireless communication link. In some aspects, the obtaining of the first measurement information may include a first measurement operation. In some aspects, the first measurement operation may use a first beam.

At block 2704, the apparatus generates a first event trigger based on the first measurement information.

At block 2706, the apparatus obtains second measurement information for a second wireless communication link. In some aspects, the obtaining of the second measurement information may include a second measurement operation. The second measurement operation may be independent of the first measurement operation. In some aspects, the second measurement operation may use a second beam.

At block 2708, the apparatus generates a second event trigger based on the second measurement information.

In some aspects, the process 2700 may include communicating first transport blocks via the first wireless communication link; communicating second transport blocks via the second wireless communication link; and processing the first transport blocks independently of the second transport blocks. In some aspects, the processing may include error processing. In some aspects, the processing may include cyclic redundancy check (CRC) processing.

Second Example Apparatus

Figure 28:
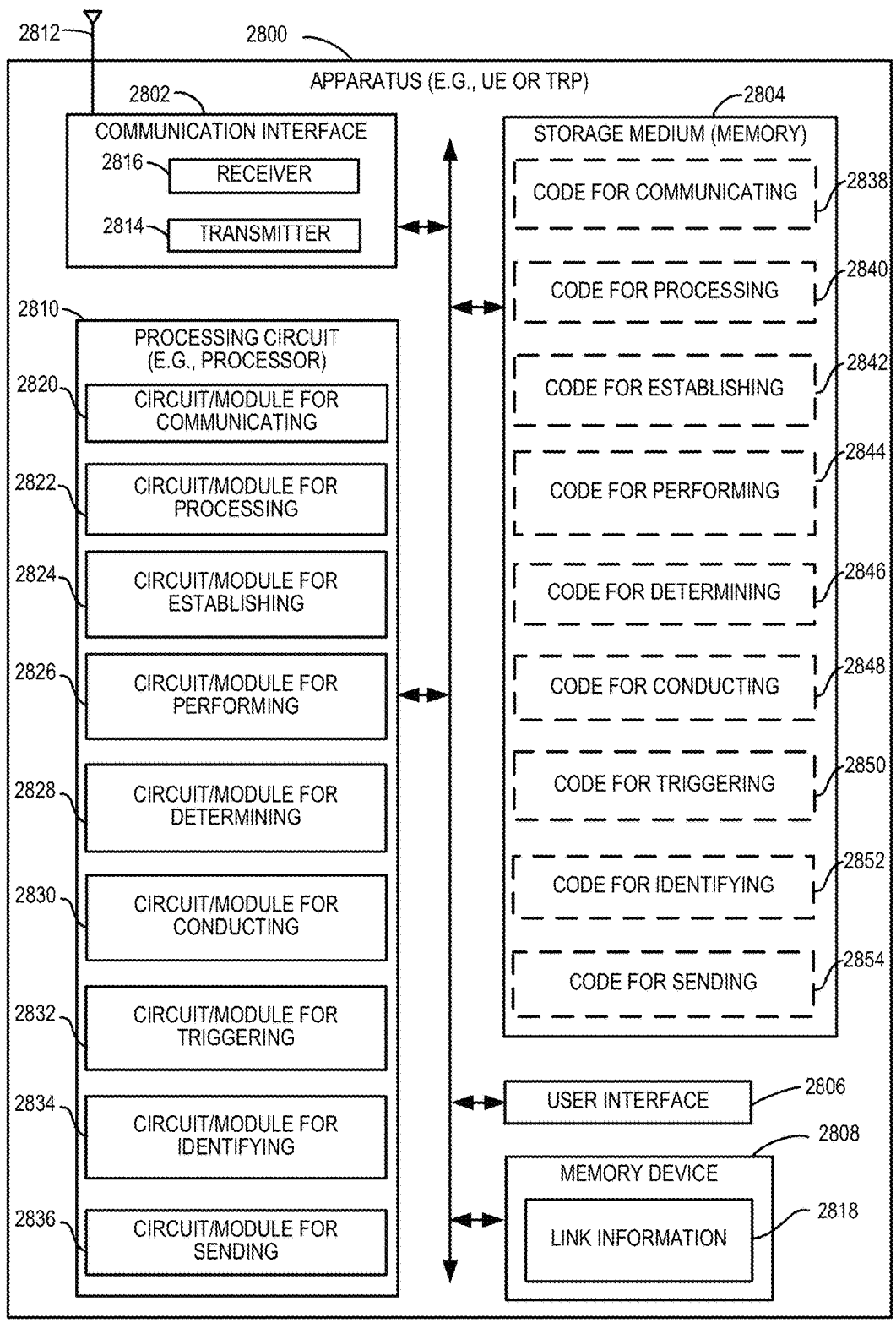
FIG. 28 is a block diagram illustrating an example hardware implementation for an apparatus (e.g., an electronic device) that can support communication in accordance with some aspects of the disclosure.

FIG. 28 illustrates a block diagram of an example hardware implementation of an apparatus 2800 configured to communicate according to one or more aspects of the disclosure. The apparatus 2800 could embody or be implemented within a UE, a TRP, a gNB, a base station (BS), or some other type of device that supports wireless communication. In various implementations, the apparatus 2800 could embody or be implemented within an access terminal, an access point, or some other type of device. In various implementations, the apparatus 2800 could embody or be implemented within a server, a network entity, a mobile phone, a smart phone, a tablet, a portable computer, a personal computer, a sensor, an alarm, a vehicle, a machine, an entertainment device, a medical device, or any other electronic device having circuitry.

The apparatus 2800 includes a communication interface (e.g., at least one transceiver) 2802, a storage medium 2804, a user interface 2806, a memory device 2808 (e.g., a memory circuit), and a processing circuit 2810 (e.g., at least one processor). In various implementations, the user interface 2806 may include one or more of: a keypad, a display, a speaker, a microphone, a touchscreen display, of some other circuitry for receiving an input from or sending an output to a user.

These components can be coupled to and/or placed in electrical communication with one another via a signaling bus or other suitable component, represented generally by the connection lines in FIG. 28. The signaling bus may include any number of interconnecting buses and bridges depending on the specific application of the processing circuit 2810 and the overall design constraints. The signaling bus links together various circuits such that each of the communication interface 2802, the storage medium 2804, the user interface 2806, and the memory device 2808 are coupled to and/or in electrical communication with the processing circuit 2810. The signaling bus may also link various other circuits (not shown) such as timing sources, peripherals, voltage regulators, and power management circuits, which are well known in the art, and therefore, will not be described any further.

The communication interface 2802 provides a means for communicating with other apparatuses over a transmission medium. In some implementations, the communication interface 2802 may be adapted to facilitate wireless communication of the apparatus 2800. For example, the communication interface 2802 may include circuitry and/or programming adapted to facilitate the communication of information bi-directionally with respect to one or more communication devices in a network. Thus, in some implementations, the communication interface 2802 may be coupled to one or more antennas 2812 for wireless communication within a wireless communication system. In some implementations, the communication interface 2802 may be configured for wire-based communication. For example, the communication interface 2802 could be a bus interface, a send/receive interface, or some other type of signal interface including drivers, buffers, or other circuitry for outputting and/or obtaining signals (e.g., outputting signal from and/or receiving signals into an integrated circuit). The communication interface 2802 can be configured with one or more standalone receivers and/or transmitters, as well as one or more transceivers. In the illustrated example, the communication interface 2802 includes a transmitter 2814 and a receiver 2816. The communication interface 2802 serves as one example of a means for receiving and/or a means transmitting.

The memory device 2808 may represent one or more memory devices. As indicated, the memory device 2808 may maintain link information 2818 along with other information used by the apparatus 2800. In some implementations, the memory device 2808 and the storage medium 2804 are implemented as a common memory component. The memory device 2808 may also be used for storing data that is manipulated by the processing circuit 2810 or some other component of the apparatus 2800.

The storage medium 2804 may represent one or more computer-readable, machine-readable, and/or processor-readable devices for storing programming, such as processor executable code or instructions (e.g., software, firmware), electronic data, databases, or other digital information. The storage medium 2804 may also be used for storing data that is manipulated by the processing circuit 2810 when executing programming. The storage medium 2804 may be any available media that can be accessed by a general purpose or special purpose processor, including portable or fixed storage devices, optical storage devices, and various other mediums capable of storing, containing or carrying programming.

By way of example and not limitation, the storage medium 2804 may include a magnetic storage device (e.g., hard disk, floppy disk, magnetic strip), an optical disk (e.g., a compact disc (CD) or a digital versatile disc (DVD)), a smart card, a flash memory device (e.g., a card, a stick, or a key drive), a random access memory (RAM), a read only memory (ROM), a programmable ROM (PROM), an erasable PROM (EPROM), an electrically erasable PROM (EEPROM), a register, a removable disk, and any other suitable medium for storing software and/or instructions that may be accessed and read by a computer. The storage medium 2804 may be embodied in an article of manufacture (e.g., a computer program product). By way of example, a computer program product may include a computer-readable medium in packaging materials. In view of the above, in some implementations, the storage medium 2804 may be a non-transitory (e.g., tangible) storage medium.

The storage medium 2804 may be coupled to the processing circuit 2810 such that the processing circuit 2810 can read information from, and write information to, the storage medium 2804. That is, the storage medium 2804 can be coupled to the processing circuit 2810 so that the storage medium 2804 is at least accessible by the processing circuit 2810, including examples where at least one storage medium is integral to the processing circuit 2810 and/or examples where at least one storage medium is separate from the processing circuit 2810 (e.g., resident in the apparatus 2800, external to the apparatus 2800, distributed across multiple entities, etc.).

Programming stored by the storage medium 2804, when executed by the processing circuit 2810, causes the processing circuit 2810 to perform one or more of the various functions and/or process operations described herein. For example, the storage medium 2804 may include operations configured for regulating operations at one or more hardware blocks of the processing circuit 2810, as well as to utilize the communication interface 2802 for wireless communication utilizing their respective communication protocols. In some aspects, the storage medium 2804 may include computer-readable medium storing computer-executable code, including code to perform the functionality described herein.

The processing circuit 2810 is generally adapted for processing, including the execution of such programming stored on the storage medium 2804. As used herein, the terms "code" or "programming" shall be construed broadly to include without limitation instructions, instruction sets, data, code, code segments, program code, programs, programming, subprograms, software modules, applications, software applications, software packages, routines, subroutines, objects, executables, threads of execution, procedures, functions, etc., whether referred to as software, firmware, middleware, microcode, hardware description language, or otherwise.

The processing circuit 2810 is arranged to obtain, process and/or send data, control data access and storage, issue commands, and control other desired operations. The processing circuit 2810 may include circuitry configured to implement desired programming provided by appropriate media in at least one example. For example, the processing circuit 2810 may be implemented as one or more processors, one or more controllers, and/or other structure configured to execute executable programming Examples of the processing circuit 2810 may include a general purpose processor, a digital signal processor (DSP), an application-specific integrated circuit (ASIC), a field programmable gate array (FPGA) or other programmable logic component, discrete gate or transistor logic, discrete hardware components, or any combination thereof designed to perform the functions described herein. A general purpose processor may include a microprocessor, as well as any conventional processor, controller, microcontroller, or state machine. The processing circuit 2810 may also be implemented as a combination of computing components, such as a combination of a DSP and a microprocessor, a number of microprocessors, one or more microprocessors in conjunction with a DSP core, an ASIC and a microprocessor, or any other number of varying configurations. These examples of the processing circuit 2810 are for illustration and other suitable configurations within the scope of the disclosure are also contemplated.

According to one or more aspects of the disclosure, the processing circuit 2810 may be adapted to perform any or all of the features, processes, functions, operations and/or routines for any or all of the apparatuses described herein. For example, the processing circuit 2810 may be configured to perform any of the steps, functions, and/or processes described with respect to FIGS. 1-13 and 29-55. As used herein, the term "adapted" in relation to the processing circuit 2810 may refer to the processing circuit 2810 being one or more of configured, used, implemented, and/or programmed to perform a particular process, function, operation and/or routine according to various features described herein.

The processing circuit 2810 may be a specialized processor, such as an application-specific integrated circuit (ASIC) that serves as a means for (e.g., structure for) carrying out any one of the operations described in conjunction with FIGS. 1-13 and 29-55. The processing circuit 2810 serves as one example of a means for transmitting and/or a means for receiving. In various implementations, the processing circuit 2810 may provide and/or incorporate, at least in part, the functionality described above in any of FIGS. 7-13.

According to at least one example of the apparatus 2800, the processing circuit 2810 may include one or more of a circuit/module for communicating 2820, a circuit/module for processing 2822, a circuit/module for establishing 2824, a circuit/module for performing 2826, a circuit/module for determining 2828, a circuit/module for conducting 2830, a circuit/module for triggering 2832, a circuit/module for identifying 2834, or a circuit/module for sending 2836. In various implementations, the circuit/module for communicating 2820, the circuit/module for processing 2822, the circuit/module for establishing 2824, the circuit/module for performing 2826, the circuit/module for determining 2828, the circuit/module for conducting 2830, the circuit/module for triggering 2832, the circuit/module for identifying 2834, or the circuit/module for sending 2836 may provide and/or incorporate, at least in part, the functionality described above in any of FIGS. 7-13.

As mentioned above, programming stored by the storage medium 2804, when executed by the processing circuit 2810, causes the processing circuit 2810 to perform one or more of the various functions and/or process operations described herein. For example, the programming may cause the processing circuit 2810 to perform the various functions, steps, and/or processes described herein with respect to FIGS. 1-13 and 29-55 in various implementations. As shown in FIG. 28, the storage medium 2804 may include one or more of code for communicating 2838, code for processing 2840, code for establishing 2842, code for performing 2844, code for determining 2846, code for conducting 2848, code for triggering 2850, code for identifying 2852, or code for sending 2854. In various implementations, the code for communicating 2838, the code for processing 2840, the code for establishing 2842, the code for performing 2844, the code for determining 2846, the code for conducting 2848, the code for triggering 2850, the code for identifying 2852, or the code for sending 2854 may be executed or otherwise used to provide the functionality described herein for the circuit/module for communicating 2820, the circuit/module for processing 2822, the circuit/module for establishing 2824, the circuit/module for performing 2826, the circuit/module for determining 2828, the circuit/module for conducting 2830, the circuit/module for triggering 2832, the circuit/module for identifying 2834, or the circuit/module for sending 2836.

Example Processes

FIGS. 29-55 illustrate processes 2900-5500, respectively, for communication in accordance with some aspects of the disclosure. Each process may be independent or used in conjunction with (e.g., used at least in part with) one or more of the other processes. Each process may take place within a processing circuit (e.g., the processing circuit 2810 of FIG. 28), which may be located in a UE, a TRP, a gNB, a BS, or some other suitable apparatus. Of course, in various aspects within the scope of the disclosure, each process may be implemented by any suitable apparatus capable of supporting communication-related operations.

Example Independent Link Processes

Figure 29:
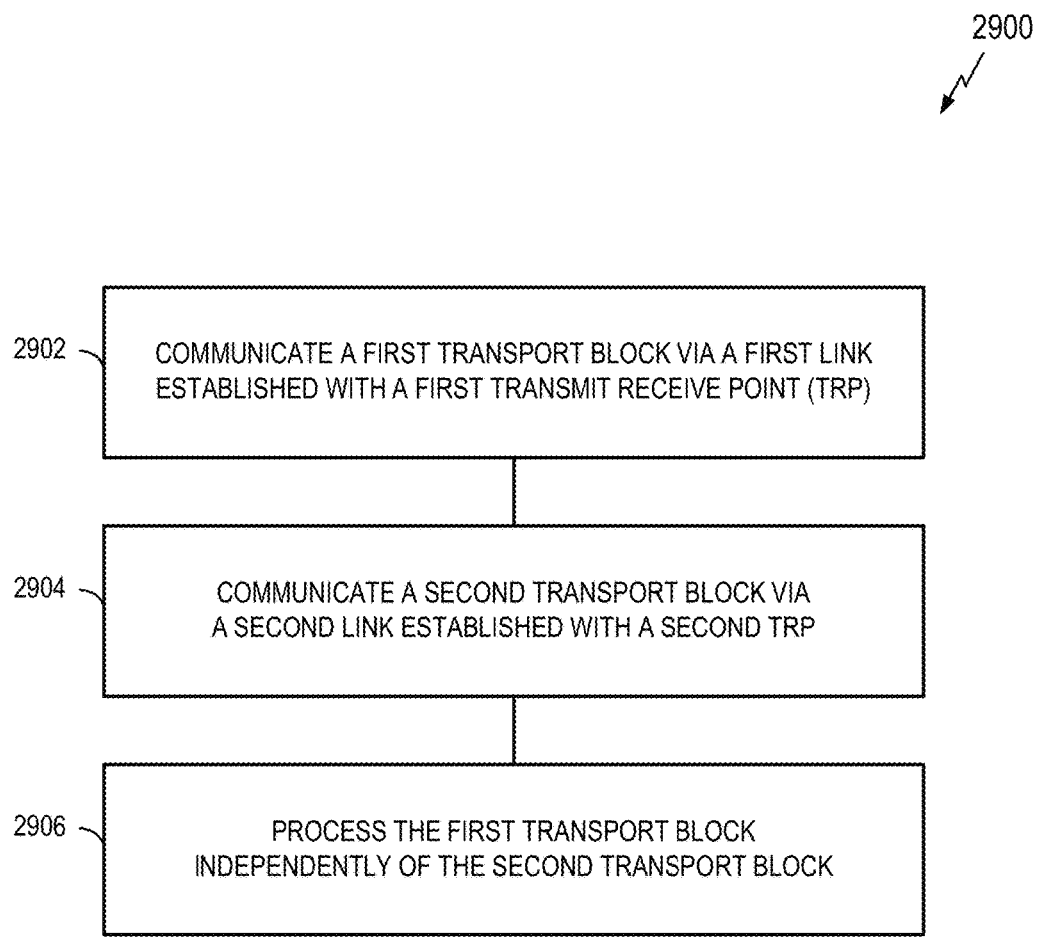
FIG. 29 is flowchart illustrating an example independent link process in accordance with some aspects of the disclosure.
Figure 30:
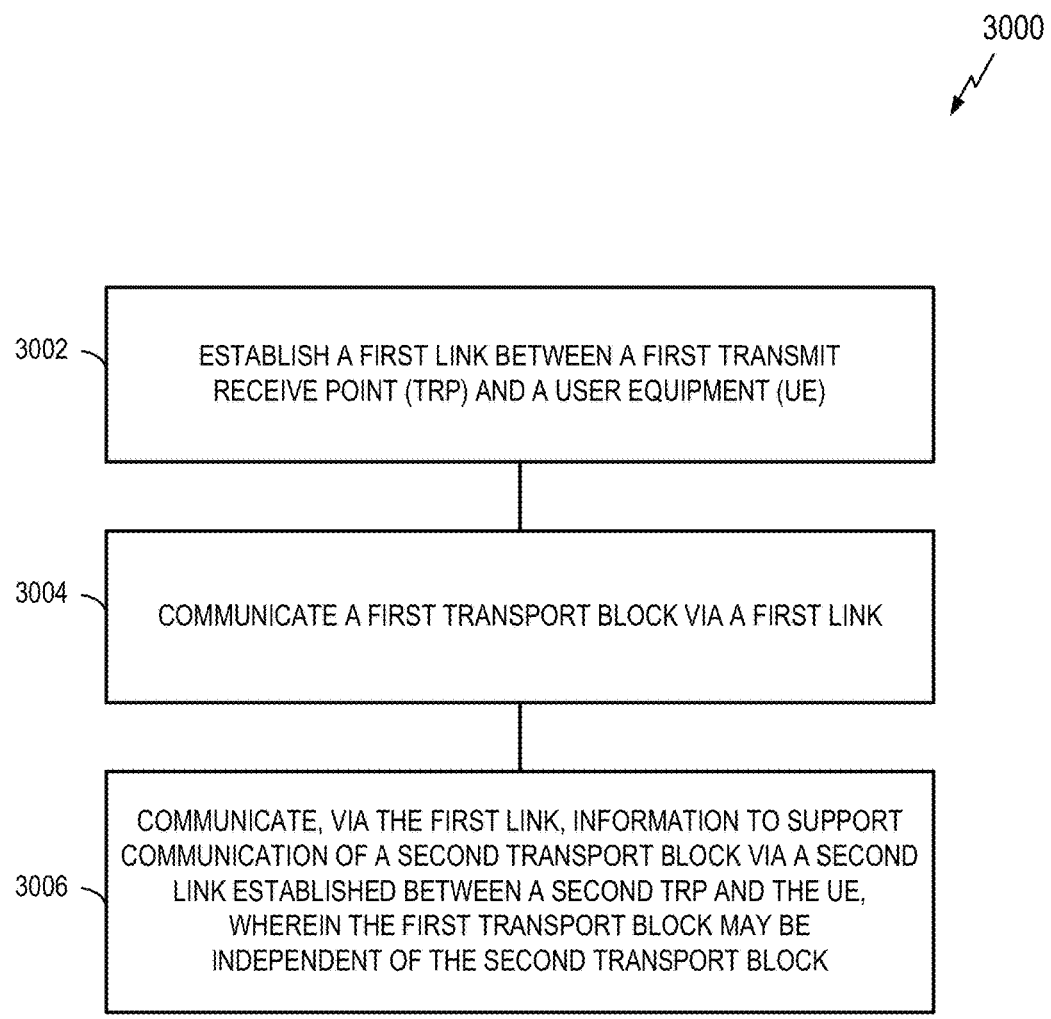
FIG. 30 is flowchart illustrating another example independent process in accordance with some aspects of the disclosure.

FIGS. 29 and 30 describe independent link processes.

At block 2902 of FIG. 29, an apparatus (e.g., a UE) communicates a first transport block via a first link established with a first transmit receive point (TRP).

At block 2904, the apparatus communicates a second transport block via a second link established with a second TRP.

In some aspects, the communication via the first link may use a first radio frequency (RF) chain and the communication via the second link may use a second RF chain. In some aspects, each RF chain may include an intermediate frequency (IF) chain and a baseband chain.

In some aspects, the communication via the first link may use a first antenna sub-array and the communication via the second link may use a second antenna sub-array.

At block 2906, the apparatus processes the first transport block independently of the second transport block. In some aspects, the processing may include error processing. In some aspects, the processing may include cyclic redundancy check (CRC) processing.

In some aspects, the process may include communicating at least one other transport block via at least one other link established with the second TRP or at least one other TRP; and processing the at least one other transport block independently of the first transport block and the second transport block.

In some aspects, the communicating may include millimeter wave communication.

At block 3002 of FIG. 30, an apparatus (e.g., a TRP) establishes a first link between a first transmit receive point (TRP) and a user equipment (UE).

At block 3004, the apparatus communicates a first transport block via a first link.

At block 3006, the apparatus communicates, via the first link, information to support communication of a second transport block via a second link established between a second TRP and the UE.

In some aspects, the first transport block may be independent of the second transport block. In some aspects, error processing for the first transport block may be independent of error processing for the second transport block. In some aspects, cyclic redundancy check (CRC) processing for the first transport block may be independent of CRC processing for the second transport block.

Example Channel Sensing Processes

Figure 31:
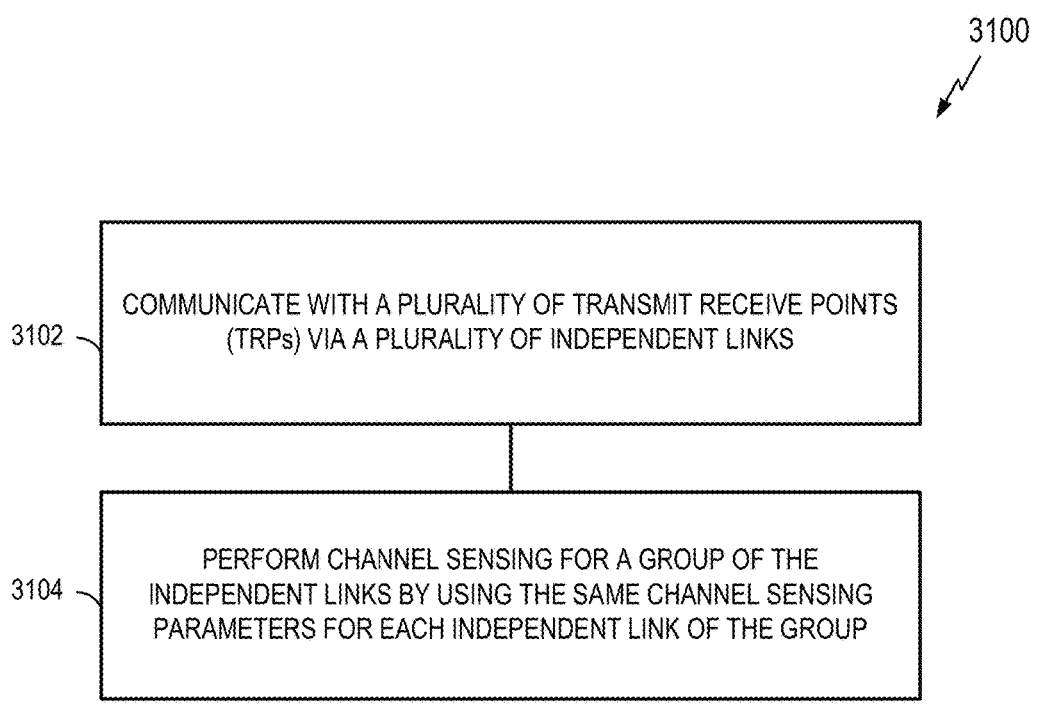
FIG. 31 is flowchart illustrating an example sensing process in accordance with some aspects of the disclosure.
Figure 32:
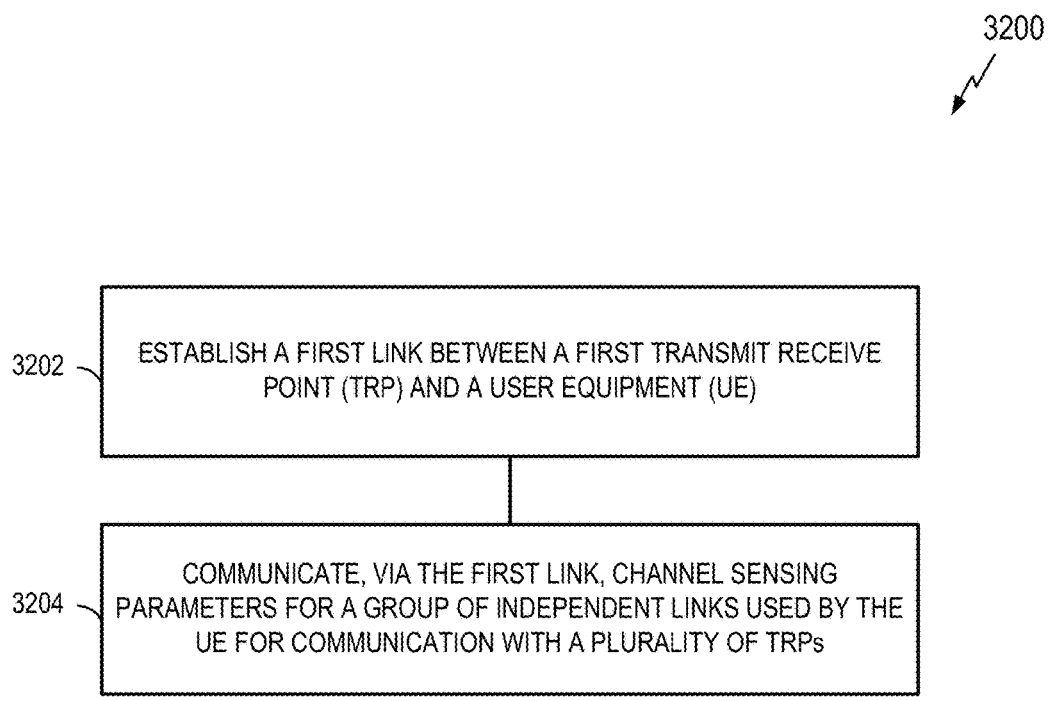
FIG. 32 is flowchart illustrating an example sensing-related process in accordance with some aspects of the disclosure.

FIGS. 31 and 32 describe processes for channel sensing.

At block 3102 of FIG. 31, an apparatus (e.g., a UE) communicates with a plurality of transmit receive points (TRPs) via a plurality of independent links.

At block 3104, the apparatus performs channel sensing for a group of the independent links by using the same channel sensing parameters for each independent link of the group.

At block 3202 of FIG. 32, an apparatus (e.g., a TRP) establishes a first link between a first transmit receive point (TRP) and a user equipment (UE).

At block 3204, the apparatus communicates, via the first link, channel sensing parameters for a group of independent links used by the UE for communication with a plurality of TRPs.

Example Control Channel Processes

Figure 33:
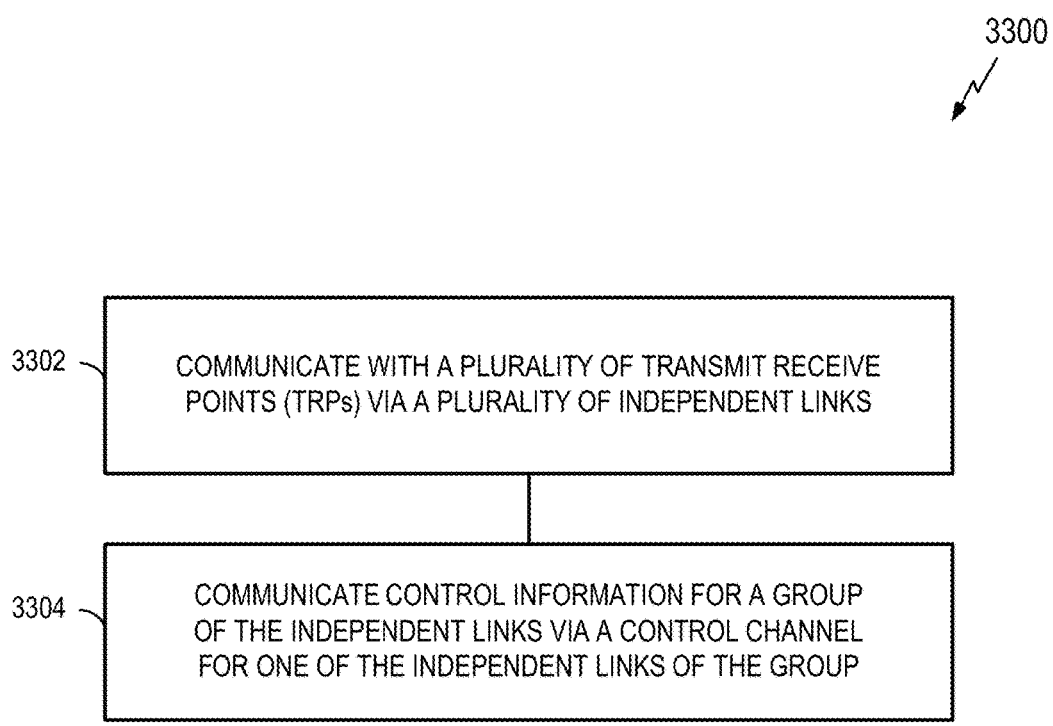
FIG. 33 is flowchart illustrating an example control information process in accordance with some aspects of the disclosure.
Figure 34:
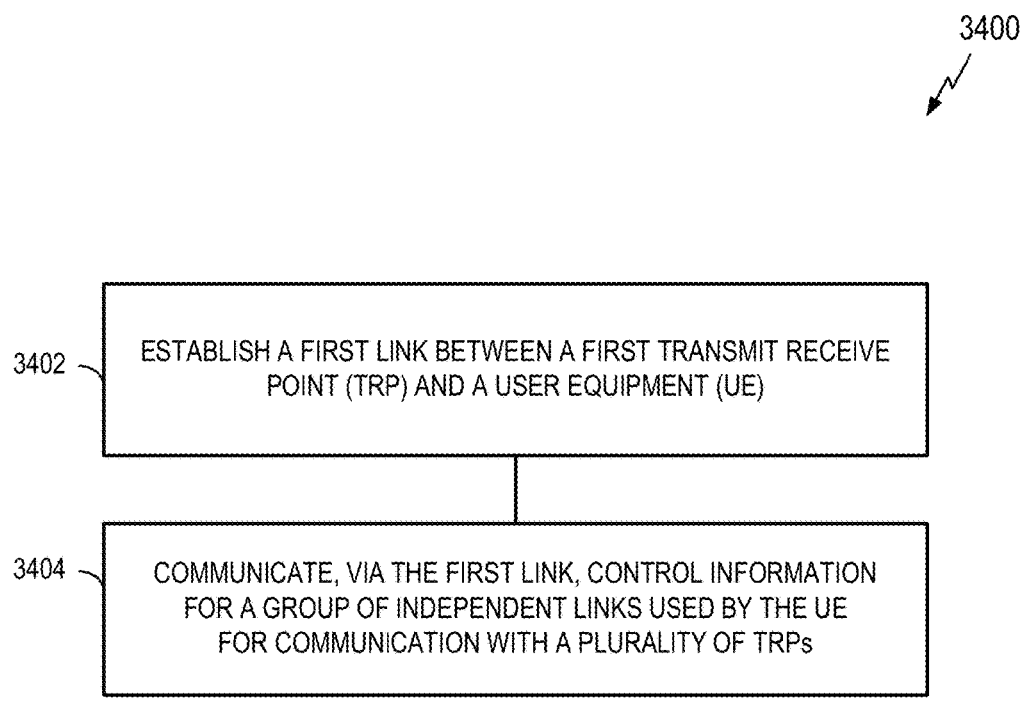
FIG. 34 is flowchart illustrating another example control information process in accordance with some aspects of the disclosure.

FIGS. 33 and 34 describe processes for control channel signaling.

At block 3302 of FIG. 33, an apparatus (e.g., a UE) communicates with a plurality of transmit receive points (TRPs) via a plurality of independent links.

At block 3304, the apparatus communicates control information for a group of the independent links via a control channel for one of the independent links of the group.

At block 3402 of FIG. 34, an apparatus (e.g., a TRP) establishes a first link between a first transmit receive point (TRP) and a user equipment (UE).

At block 3404, the apparatus communicates, via the first link, control information for a group of independent links used by the UE for communication with a plurality of TRPs.

Example Sub-Frame Format Processes

Figure 35:
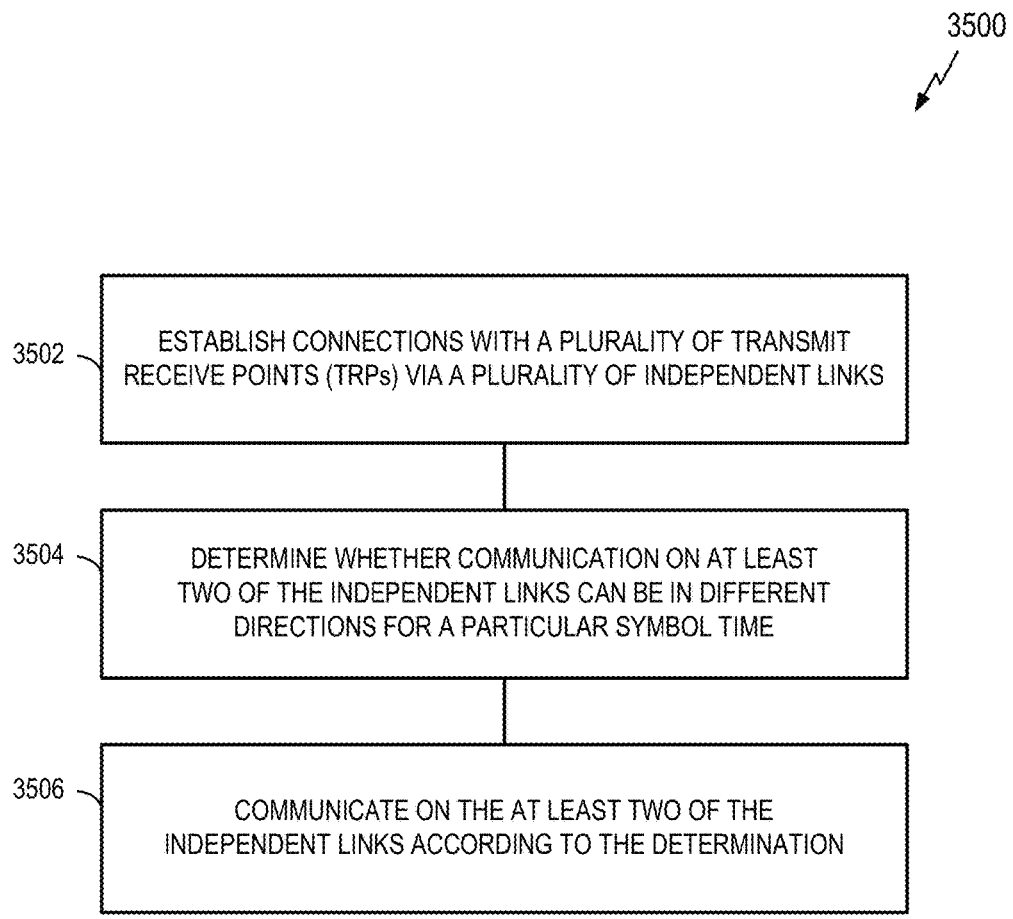
FIG. 35 is flowchart illustrating an example independent link process in accordance with some aspects of the disclosure.
Figure 36:
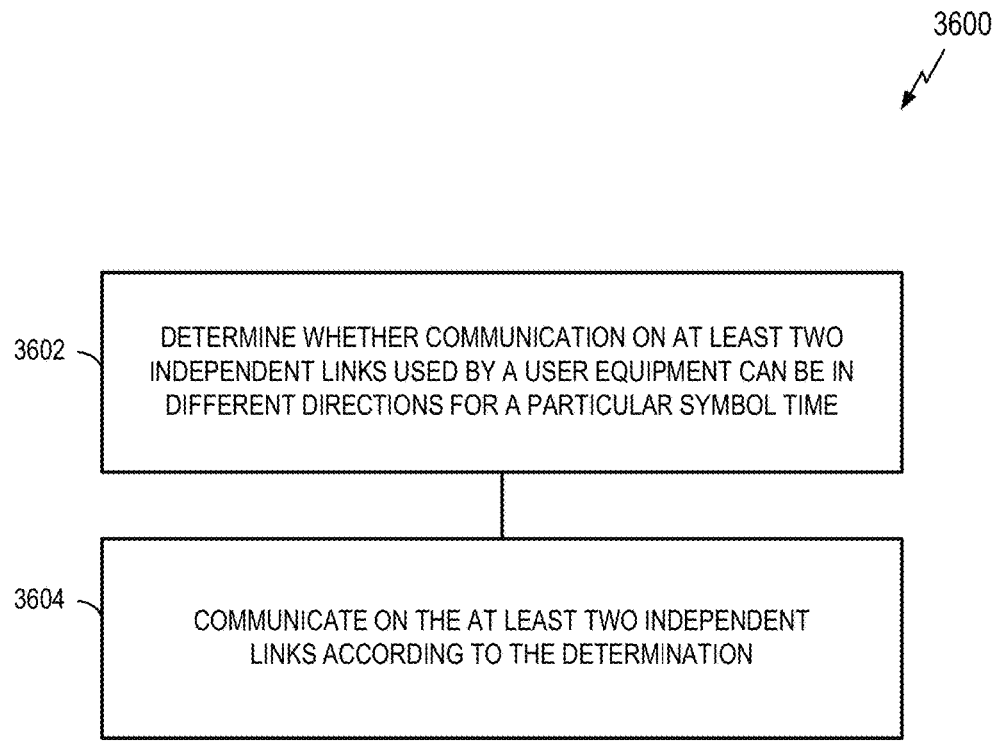
FIG. 36 is flowchart illustrating another example independent link process in accordance with some aspects of the disclosure.

FIGS. 35 and 36 describe processes for communicating via different sub-frame formats.

At block 3502 of FIG. 35, an apparatus (e.g., a UE) establishes connections with a plurality of transmit receive points (TRPs) via a plurality of independent links.

At block 3504, the apparatus determines whether communication on at least two of the independent links can be in different directions for a particular symbol time.

At block 3506, the apparatus communicates on the at least two of the independent links according to the determination.

At block 3602 of FIG. 36, an apparatus (e.g., a TRP) determines whether communication on at least two independent links used by a user equipment can be in different directions for a particular symbol time.

At block 3604, the apparatus communicates on the at least two independent links according to the determination.

Example Link Indication Processes

Figure 37:
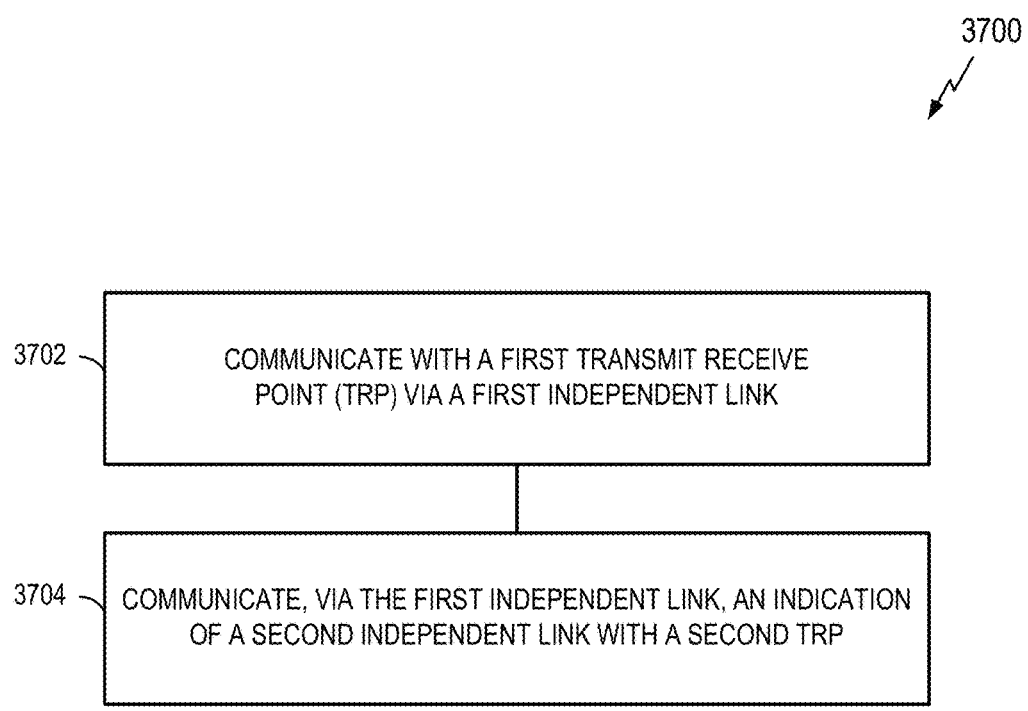
FIG. 37 is flowchart illustrating another example independent link process in accordance with some aspects of the disclosure.
Figure 38:
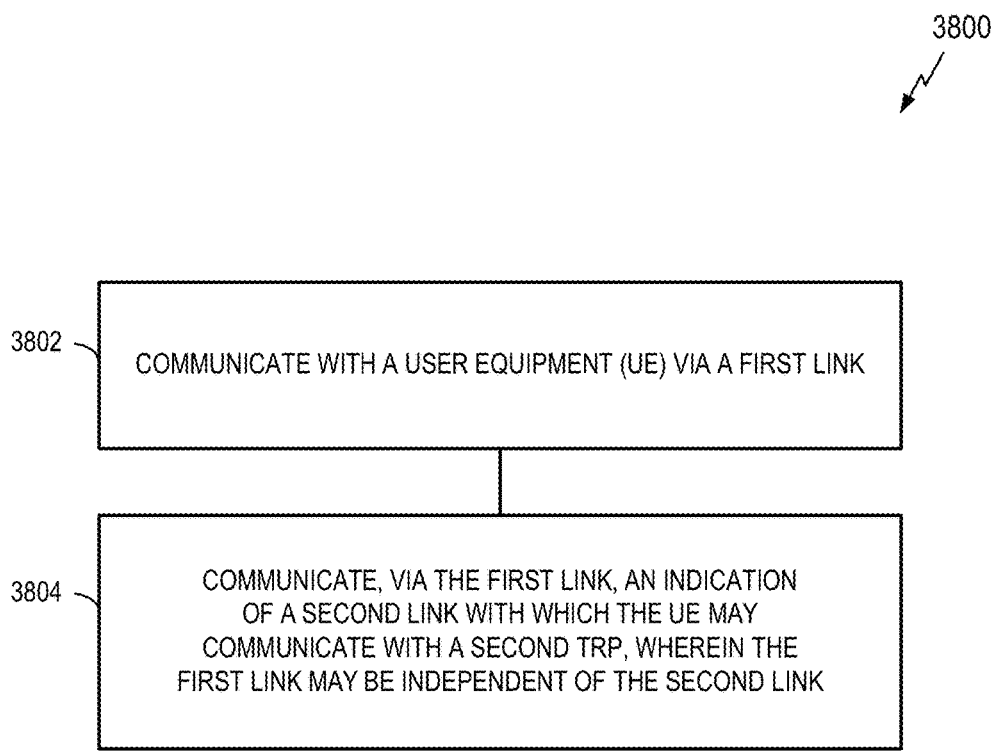
FIG. 38 is flowchart illustrating another example independent link process in accordance with some aspects of the disclosure.

FIGS. 37 and 38 describe processes for indicating a link.

At block 3702 of FIG. 37, an apparatus (e.g., a UE) communicates with a first transmit receive point (TRP) via a first independent link.

At block 3704, the apparatus communicates, via the first independent link, an indication of a second independent link with a second TRP.

At block 3802 of FIG. 38, an apparatus (e.g., a TRP) communicates with a user equipment (UE) via a first link.

At block 3804, the apparatus communicates, via the first link, an indication of a second link with which the UE may communicate with a second TRP. In some aspects, the first link may be independent of the second link.

Example HARQ Feedback Processes

Figure 39:
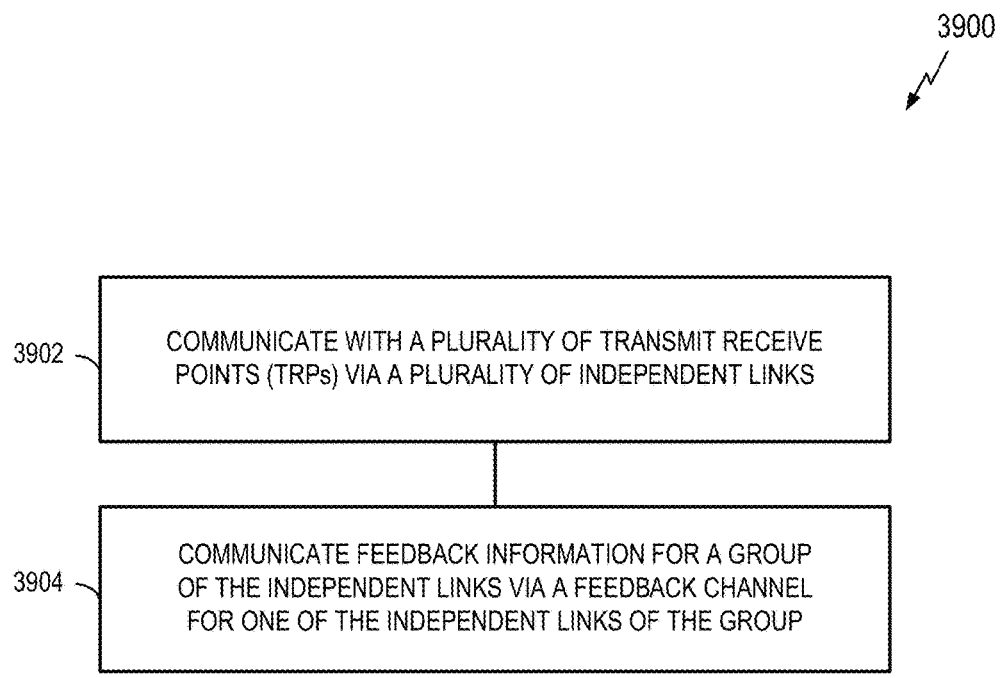
FIG. 39 is flowchart illustrating an example feedback process in accordance with some aspects of the disclosure.
Figure 40:
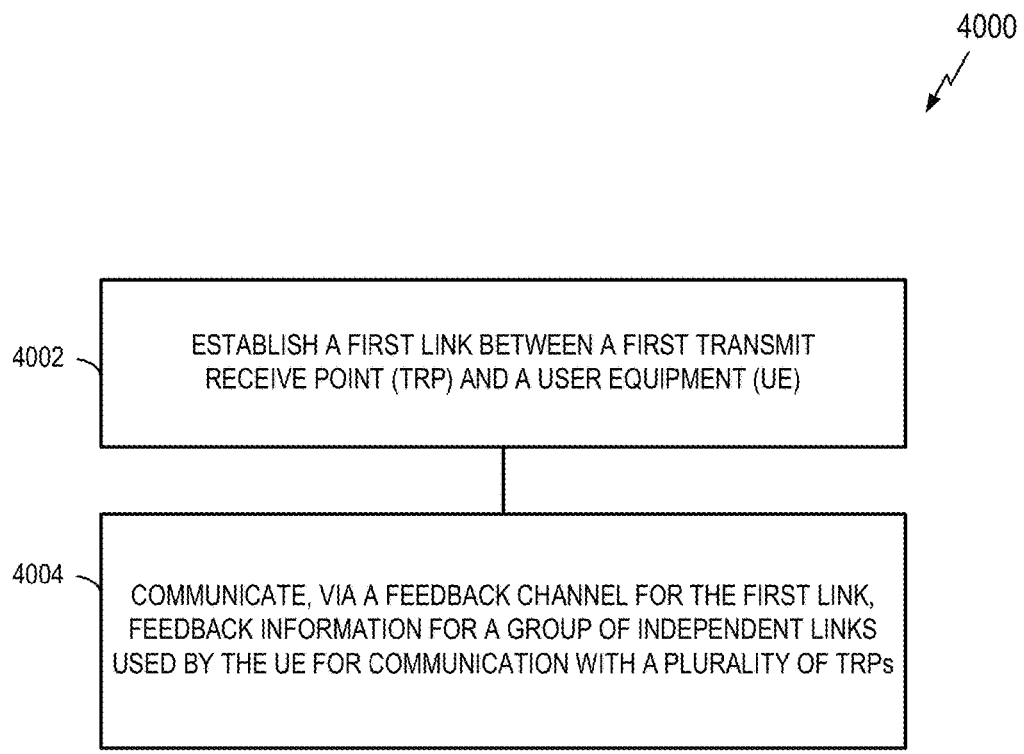
FIG. 40 is flowchart illustrating another example feedback process in accordance with some aspects of the disclosure.

FIGS. 39 and 40 describe processes for HARQ feedback.

At block 3902 of FIG. 39, an apparatus (e.g., a UE) communicates with a plurality of transmit receive points (TRPs) via a plurality of independent links.

At block 3904, the apparatus communicates feedback information for a group of the independent links via a feedback channel for one of the independent links of the group.

At block 4002 of FIG. 40, an apparatus (e.g., a TRP) establishes a first link between a first transmit receive point (TRP) and a user equipment (UE).

At block 4004, the apparatus communicates, via a feedback channel for the first link, feedback information for a group of independent links used by the UE for communication with a plurality of TRPs.

Example Power Control Processes

Figure 41:
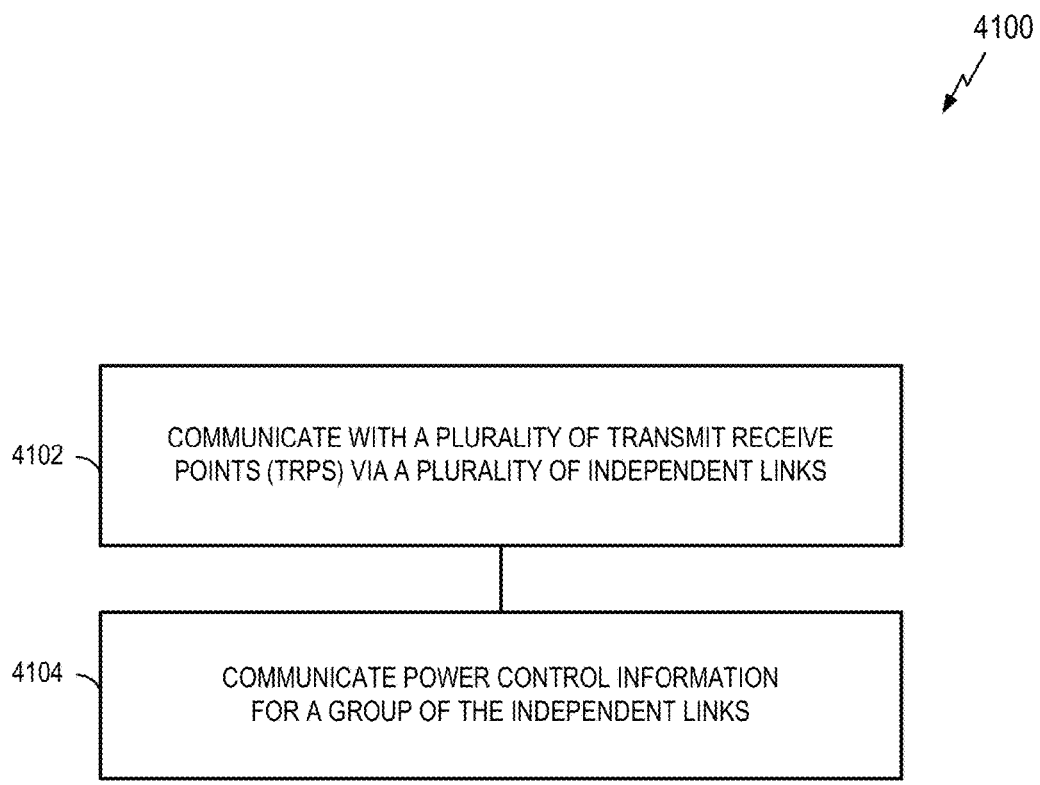
FIG. 41 is flowchart illustrating an example power control process in accordance with some aspects of the disclosure.
Figure 42:
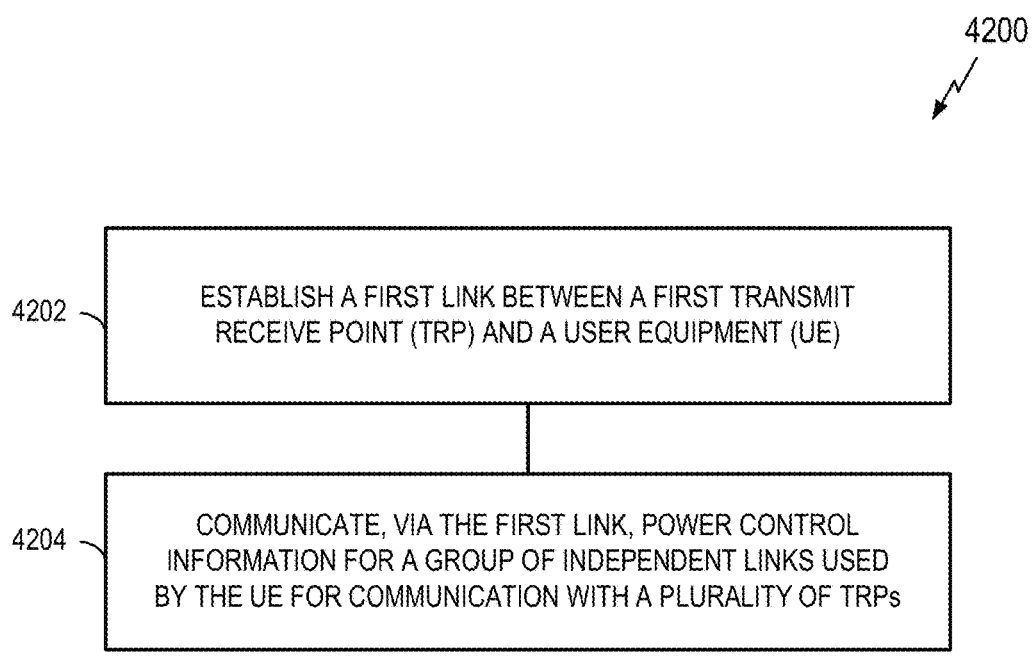
FIG. 42 is flowchart illustrating another example power control process in accordance with some aspects of the disclosure.

FIGS. 41 and 42 describe processes for power control.

At block 4102 of FIG. 41, an apparatus (e.g., a UE) communicates with a plurality of transmit receive points (TRPs) via a plurality of independent links.

At block 4104, the apparatus communicates power control information for a group of the independent links.

At block 4202 of FIG. 42, an apparatus (e.g., a TRP) establishes a first link between a first transmit receive point (TRP) and a user equipment (UE).

At block 4204, the apparatus communicates, via the first link, power control information for a group of independent links used by the UE for communication with a plurality of TRPs.

Example Uplink Sounding Processes

Figure 43:
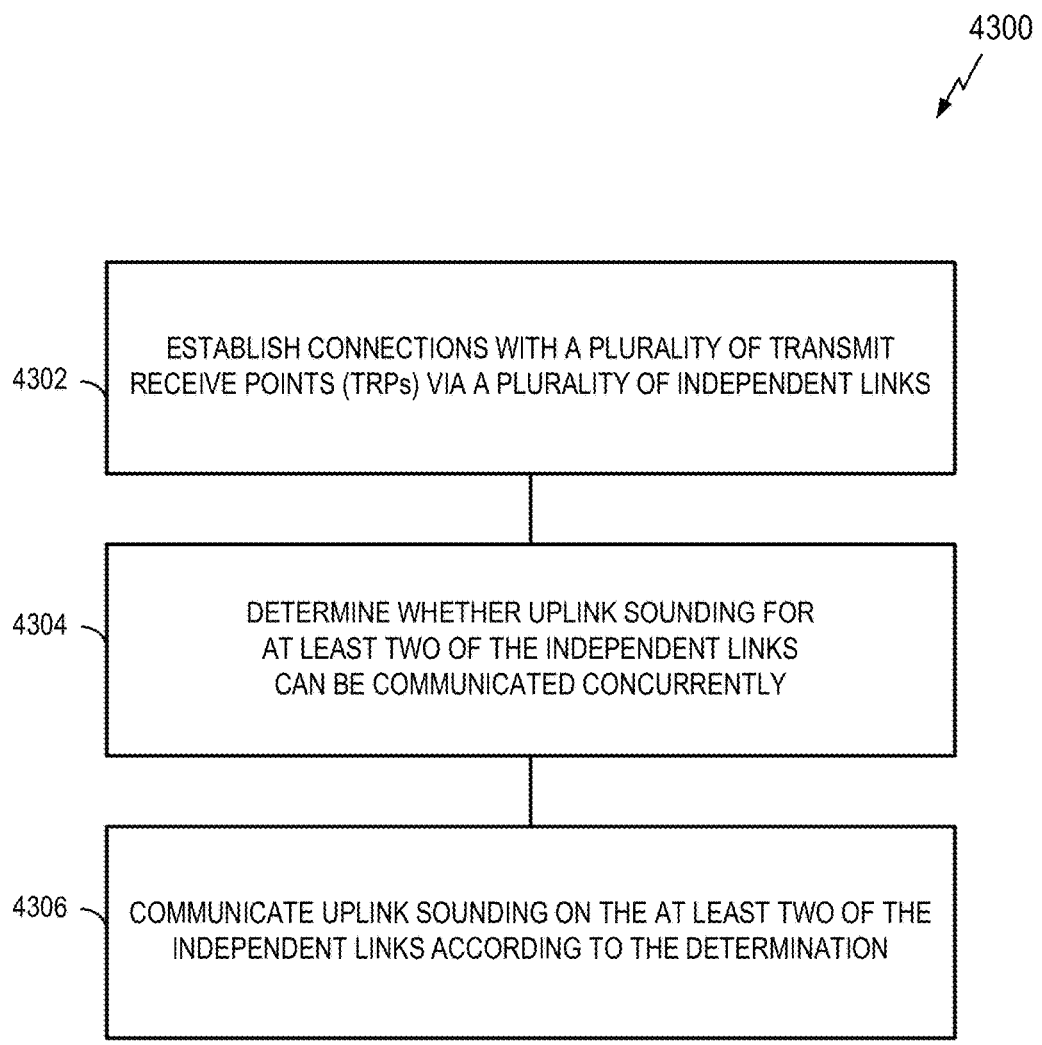
FIG. 43 is flowchart illustrating an example uplink sounding process in accordance with some aspects of the disclosure.
Figure 44:
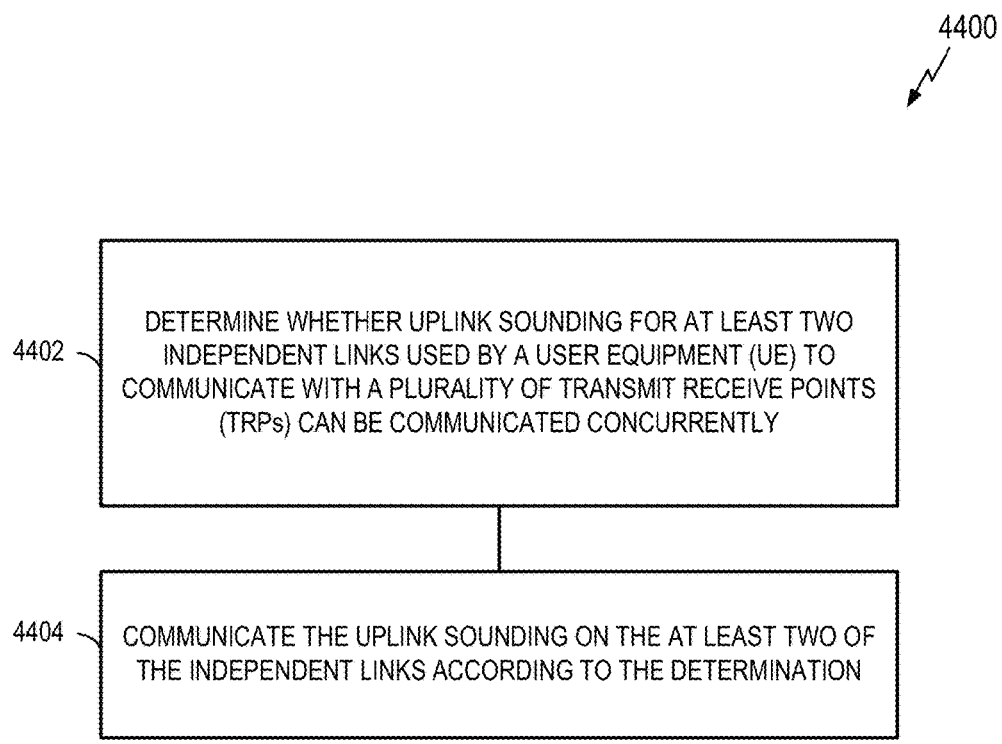
FIG. 44 is flowchart illustrating another example uplink sounding process in accordance with some aspects of the disclosure.

FIGS. 43 and 44 describe processes for uplink sounding.

At block 4302 of FIG. 43, an apparatus (e.g., a UE) establishes connections with a plurality of transmit receive points (TRPs) via a plurality of independent links.

At block 4304, the apparatus determines whether uplink sounding for at least two of the independent links can be communicated concurrently.

At block 4306, the apparatus communicates uplink sounding on the at least two of the independent links according to the determination.

At block 4402 of FIG. 44, an apparatus (e.g., a TRP) determines whether uplink sounding for at least two independent links used by a user equipment (UE) to communicate with a plurality of transmit receive points (TRPs) can be communicated concurrently.

At block 4404, the apparatus communicates the uplink sounding on the at least two of the independent links according to the determination.

Example Channel Status Feedback Processes

Figure 45:
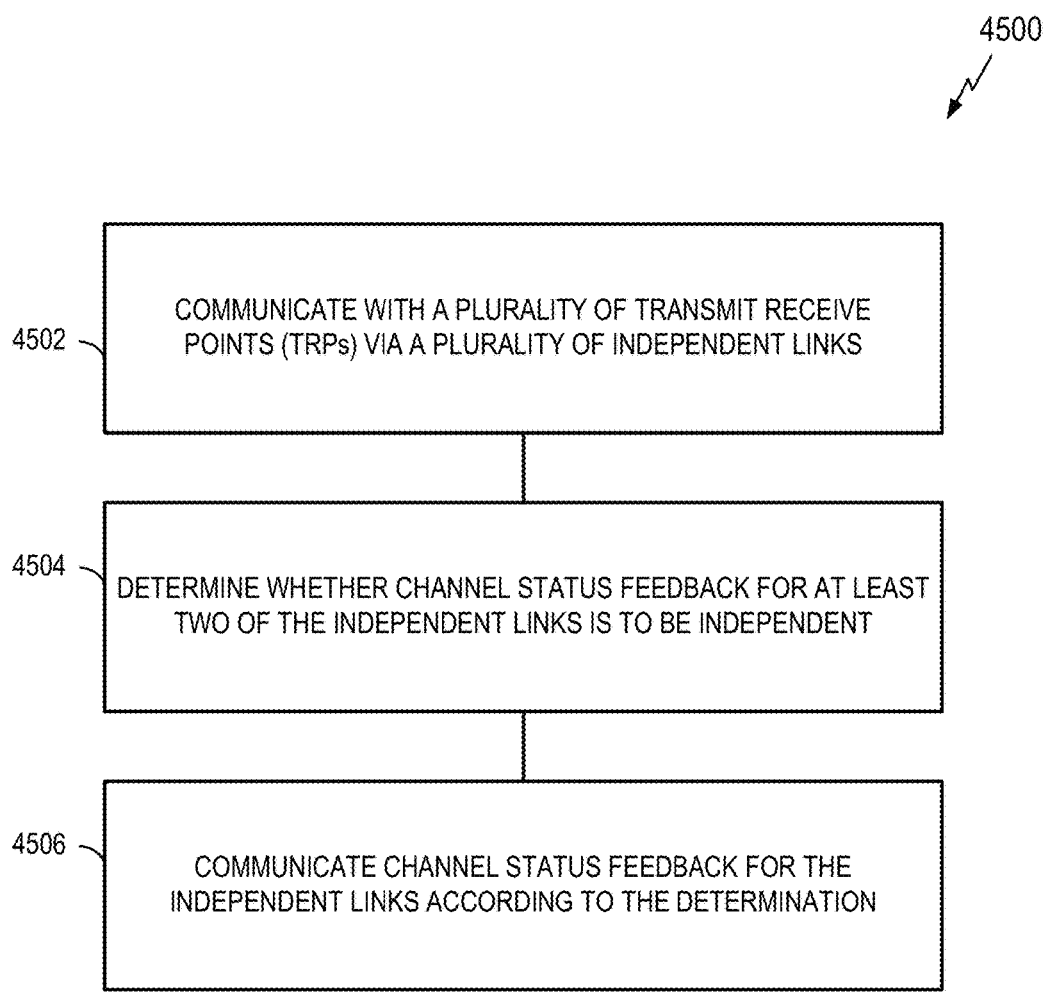
FIG. 45 is flowchart illustrating an example channel status feedback process in accordance with some aspects of the disclosure.

FIG. 45 describes a process for channel status feedback.

At block 4502 of FIG. 45, an apparatus (e.g., a UE) communicates with a plurality of transmit receive points (TRPs) via a plurality of independent links.

At block 4504, the apparatus determines whether channel status feedback for at least two of the independent links is to be independent.

At block 4506, the apparatus communicates channel status feedback for the independent links according to the determination.

Example Beam Switching Processes

Figure 46:
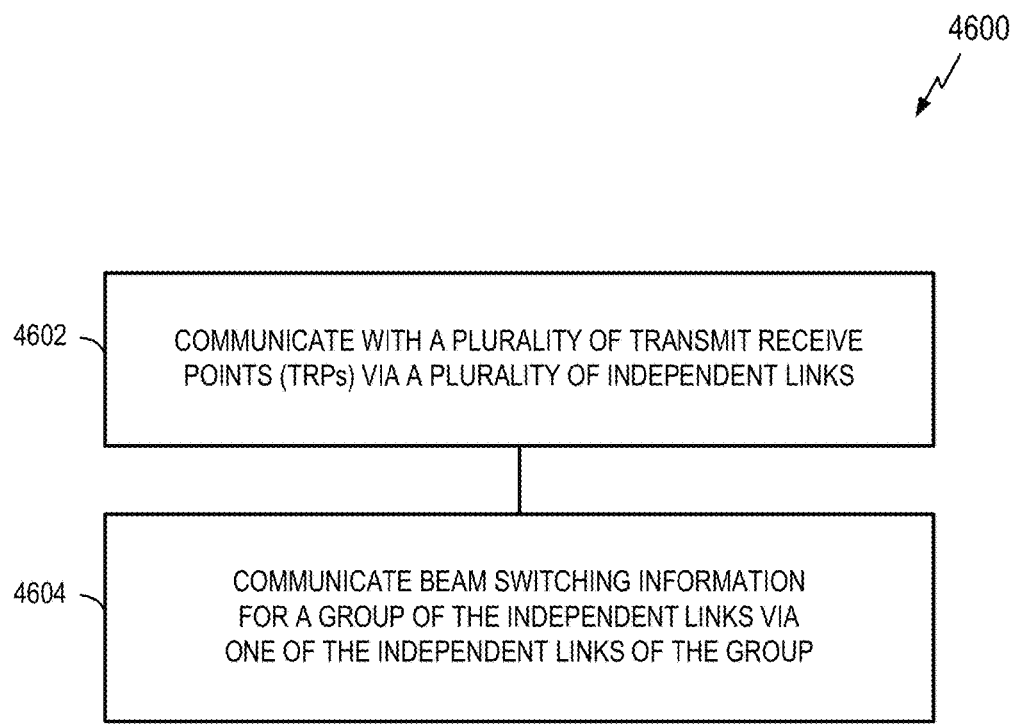
FIG. 46 is flowchart illustrating an example beam switching information process in accordance with some aspects of the disclosure.
Figure 47:
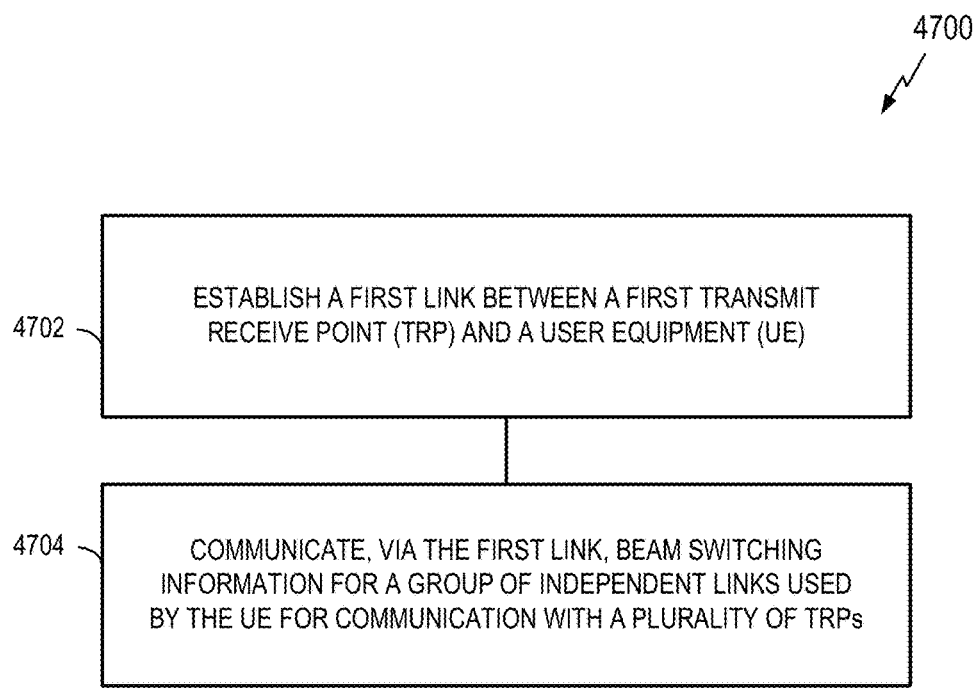
FIG. 47 is flowchart illustrating another example beam switching information process in accordance with some aspects of the disclosure.

FIGS. 46 and 47 describe processes for beam switching.

At block 4602 of FIG. 46, an apparatus (e.g., a UE) communicates with a plurality of transmit receive points (TRPs) via a plurality of independent links.

At block 4604, the apparatus communicates beam switching information for a group of the independent links via one of the independent links of the group.

At block 4702 of FIG. 47, an apparatus (e.g., a TRP) establishes a first link between a first transmit receive point (TRP) and a user equipment (UE).

At block 4704, the apparatus communicates, via the first link, beam switching information for a group of independent links used by the UE for communication with a plurality of TRPs.

Example Beam Recovery Processes

Figure 48:
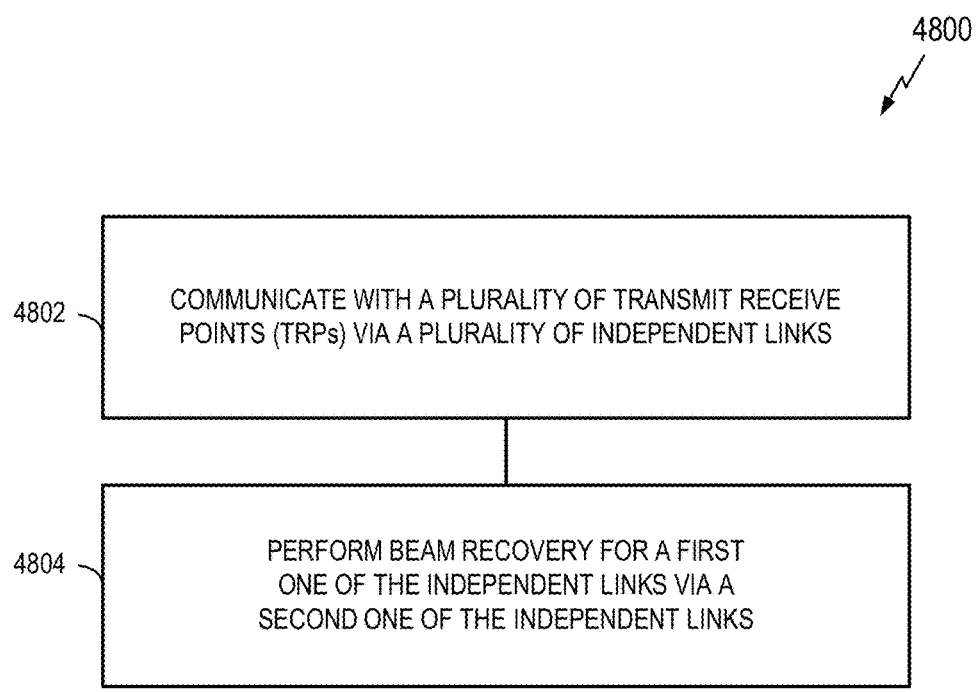
FIG. 48 is flowchart illustrating an example beam recovery process in accordance with some aspects of the disclosure.
Figure 49:
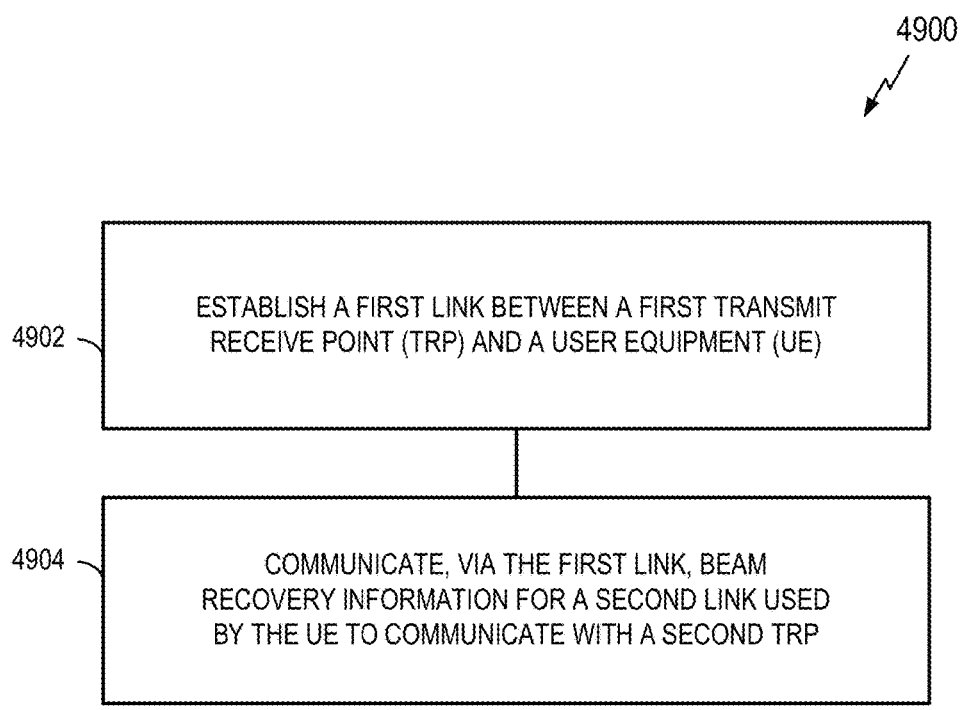
FIG. 49 is flowchart illustrating another example beam recovery process in accordance with some aspects of the disclosure.

FIGS. 48 and 49 describe processes for beam recovery.

At block 4802 of FIG. 48, an apparatus (e.g., a UE) communicates with a plurality of transmit receive points (TRPs) via a plurality of independent links.

At block 4804, the apparatus performs beam recovery for a first one of the independent links via a second one of the independent links.

At block 4902 of FIG. 49, an apparatus (e.g., a TRP) establishes a first link between a first transmit receive point (TRP) and a user equipment (UE).

At block 4904, the apparatus communicates, via the first link, beam recovery information for a second link used by the UE to communicate with a second TRP.

Example Link Measurement Processes

Figure 50:
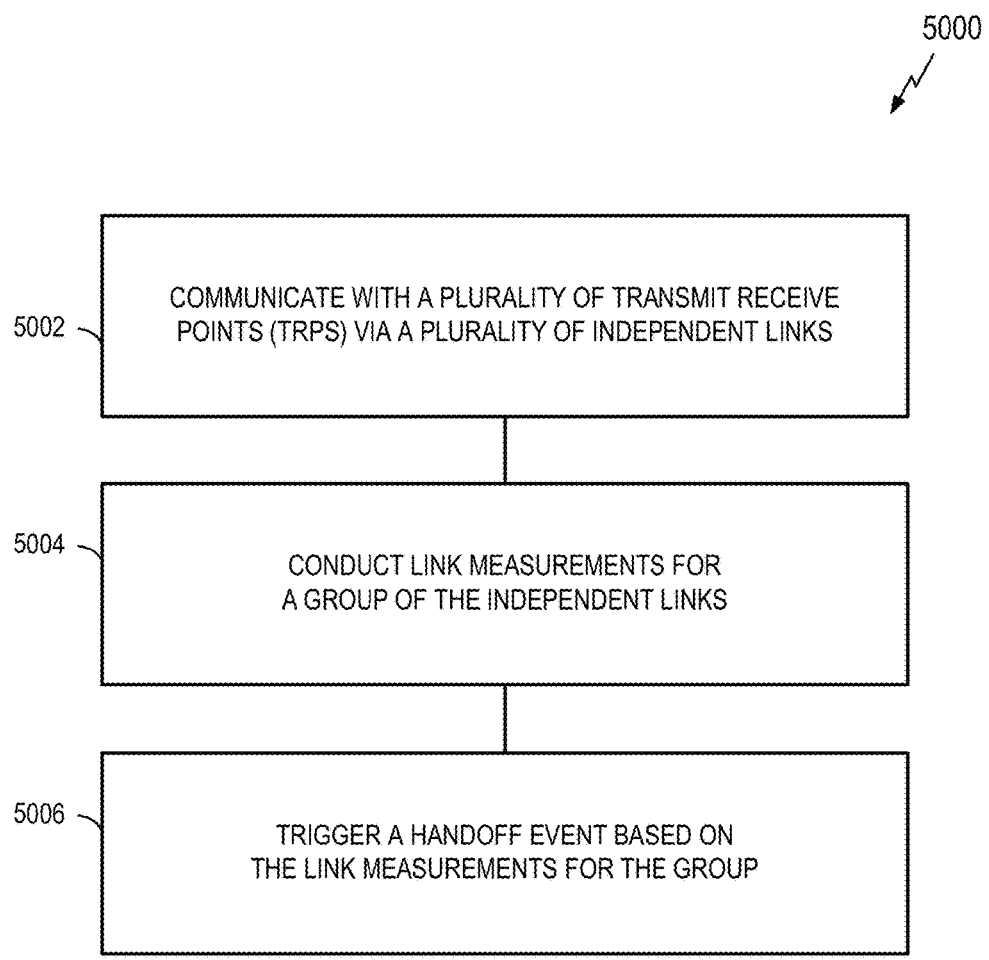
FIG. 50 is flowchart illustrating an example handoff process in accordance with some aspects of the disclosure.
Figure 51:
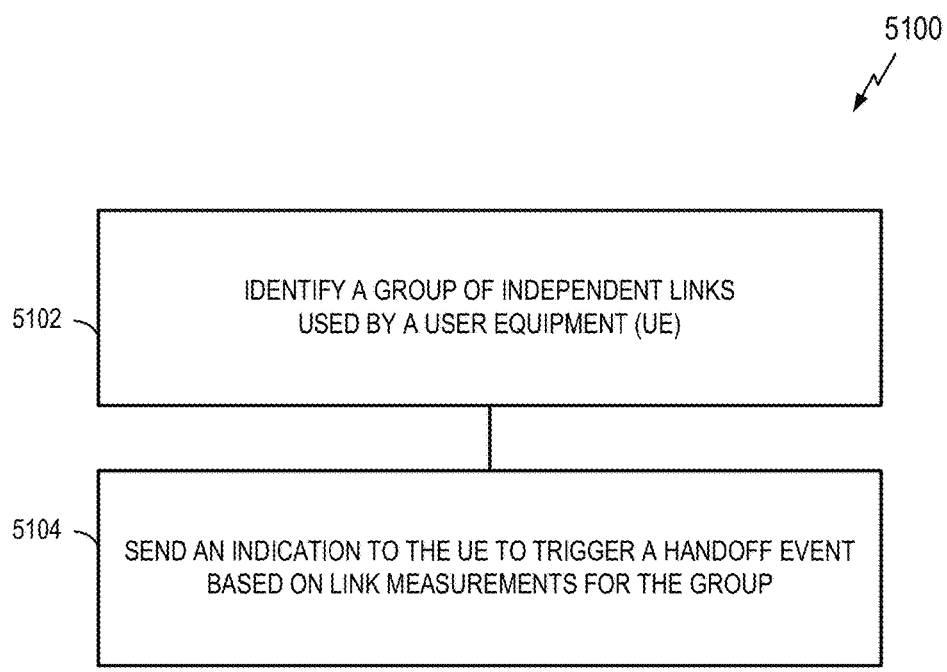
FIG. 51 is flowchart illustrating another example handoff process in accordance with some aspects of the disclosure.

FIGS. 50 and 51 describe processes for link measurements.

At block 5002 of FIG. 50, an apparatus (e.g., a UE) communicates with a plurality of transmit receive points (TRPs) via a plurality of independent links.

At block 5004, the apparatus conducts link measurements for a group of the independent links.

At block 5006, the apparatus triggers a handoff event based on the link measurements for the group.

At block 5102 of FIG. 51, an apparatus (e.g., a TRP) identifies a group of independent links used by a user equipment (UE).

At block 5104, the apparatus sends an indication to the UE to trigger a handoff event based on link measurements for the group.

Example RACH Processes

Figure 52:
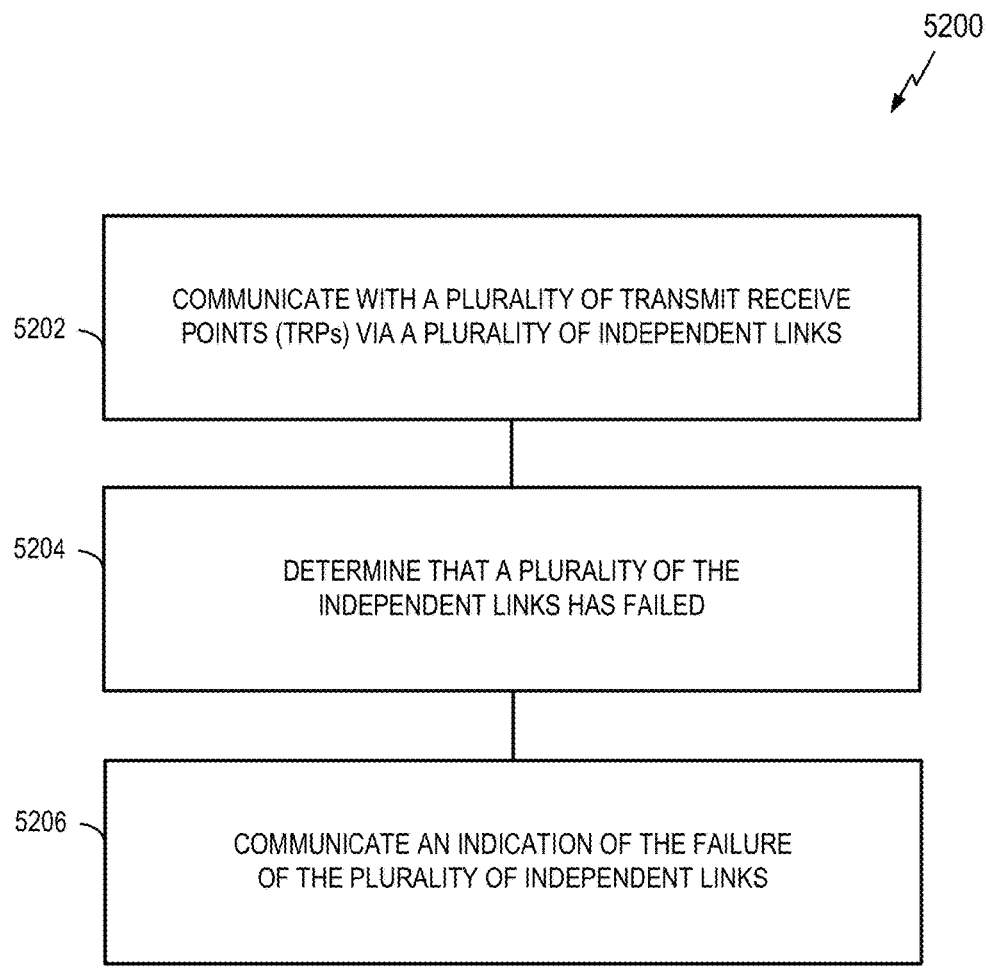
FIG. 52 is flowchart illustrating an example link failure process in accordance with some aspects of the disclosure.
Figure 53:
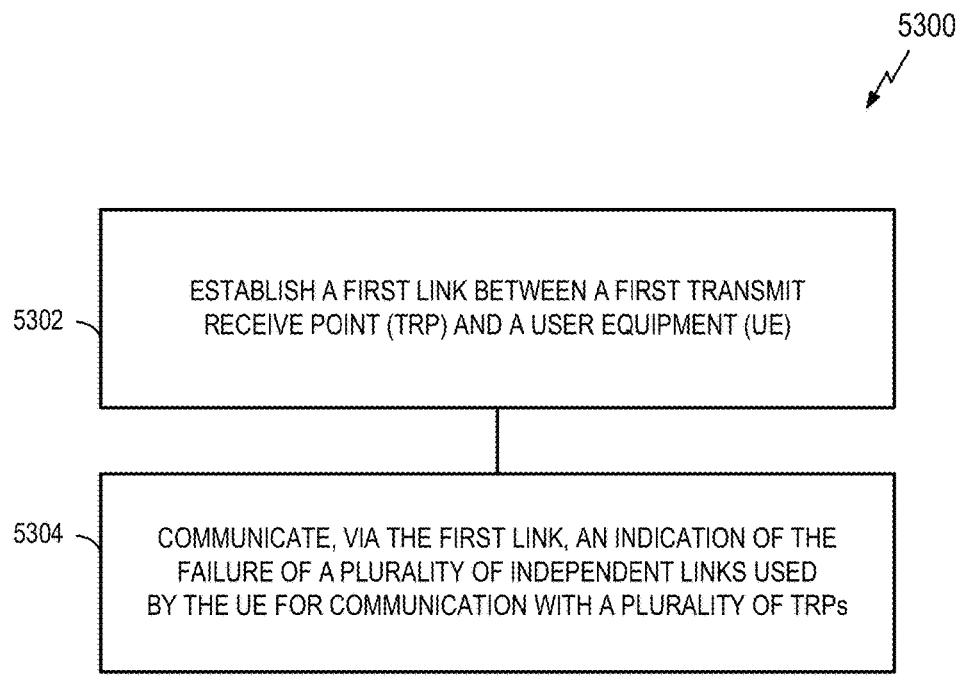
FIG. 53 is flowchart illustrating another example link failure process in accordance with some aspects of the disclosure.

FIGS. 52 and 53 describe processes for RACH signaling.

At block 5202 of FIG. 52, an apparatus (e.g., a UE) communicates with a plurality of transmit receive points (TRPs) via a plurality of independent links.

At block 5204, the apparatus determines that a plurality of the independent links has failed.

At block 5206, the apparatus communicates an indication of the failure of the plurality of independent links.

At block 5302 of FIG. 53, an apparatus (e.g., a TRP) establishes a first link between a first transmit receive point (TRP) and a user equipment (UE).

At block 5304, the apparatus communicates via the first link, an indication of the failure of a plurality of independent links used by the UE for communication with a plurality of TRPs.

Example Restriction Processes

Figure 54:
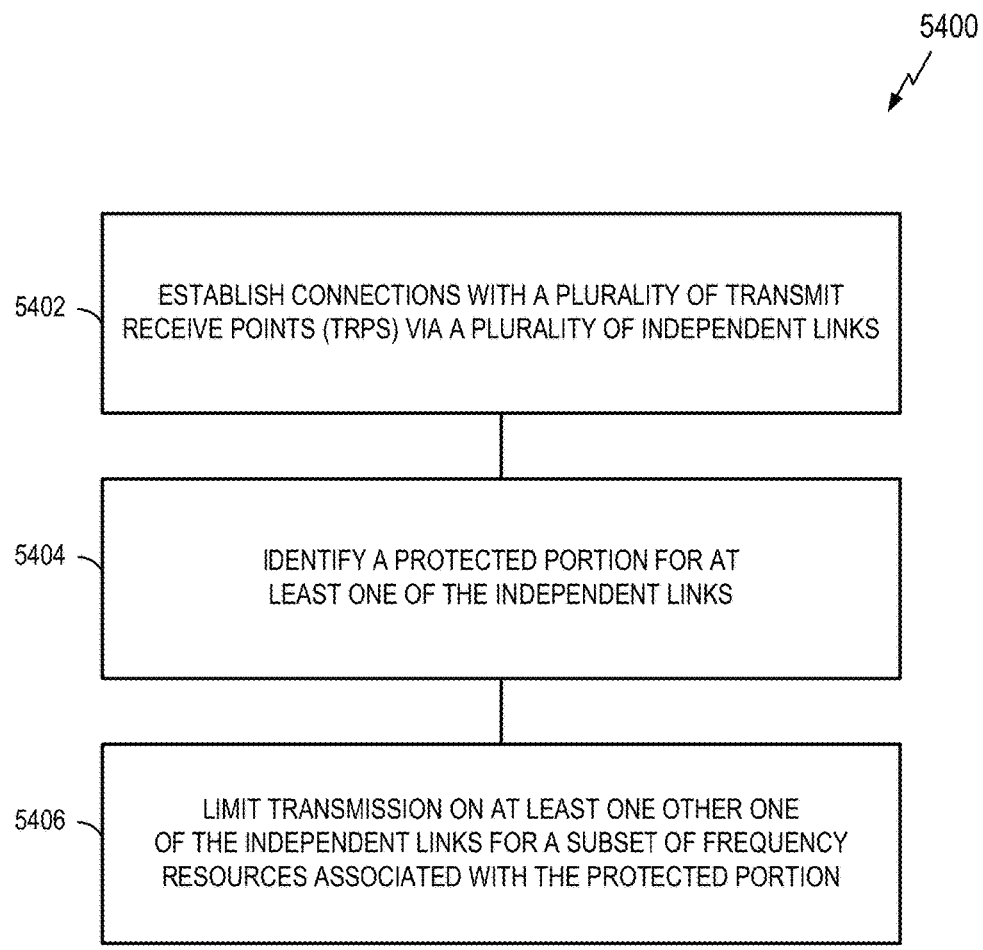
FIG. 54 is flowchart illustrating an example transmission limit process in accordance with some aspects of the disclosure.
Figure 55:
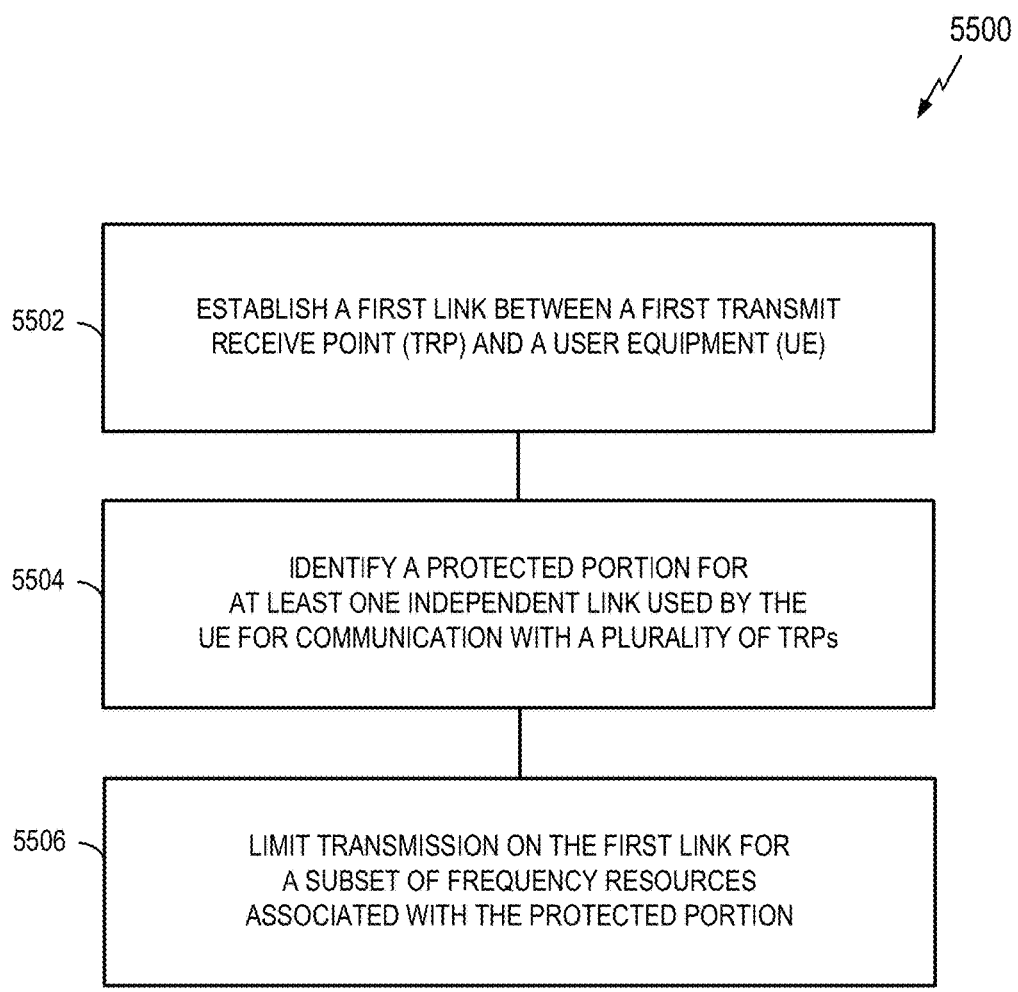
FIG. 55 is flowchart illustrating another example transmission limit process in accordance with some aspects of the disclosure.

FIGS. 54 and 55 describe processes for restricting transmission.

At block 5402 of FIG. 54, an apparatus (e.g., a UE) establishes connections with a plurality of transmit receive points (TRPs) via a plurality of independent links.

At block 5404, the apparatus identifies a protected portion for at least one of the independent links.

At block 5406, the apparatus limits transmission on at least one other one of the independent links for a subset of frequency resources associated with the protected portion.

At block 5502 of FIG. 55, an apparatus (e.g., a TRP) establishes a first link between a first transmit receive point (TRP) and a user equipment (UE).

At block 5504, the apparatus identifies a protected portion for at least one independent link used by the UE for communication with a plurality of TRPs.

At block 5506, the apparatus limits transmission on the first link for a subset of frequency resources associated with the protected portion.

Additional Aspects

In some aspects, the disclosure provides a method for communication including: obtaining first sensing information for a first wireless communication link; obtaining second sensing information for a second wireless communication link; and determining whether to transmit on the first wireless communication link based on the first sensing information and the second sensing information.

Another aspect of the disclosure provides an apparatus configured for communication that includes a memory and a processor coupled to the memory. The processor and the memory are configured to: obtain first sensing information for a first wireless communication link; obtain second sensing information for a second wireless communication link; and determine whether to transmit on the first wireless communication link based on the first sensing information and the second sensing information.

Another aspect of the disclosure provides an apparatus configured for communication. The apparatus including: means for obtaining first sensing information for a first wireless communication link; means for obtaining second sensing information for a second wireless communication link; and means for determining whether to transmit on the first wireless communication link based on the first sensing information and the second sensing information.

Another aspect of the disclosure provides a non-transitory computer-readable medium storing computer-executable code, including code to: obtain first sensing information for a first wireless communication link; obtain second sensing information for a second wireless communication link; and determine whether to transmit on the first wireless communication link based on the first sensing information and the second sensing information.

In some aspects, the disclosure provides a method for communication including: obtaining first sensing information for a first wireless communication link; determining whether to transmit on the first wireless communication link based on the first sensing information; obtaining second sensing information for a second wireless communication link; and determining whether to transmit on the second wireless communication link based on the second sensing information, wherein the determination of whether to transmit on the second wireless communication link is independent of the determination of whether to transmit on the first wireless communication link.

Another aspect of the disclosure provides an apparatus configured for communication that includes a memory and a processor coupled to the memory. The processor and the memory are configured to: obtain first sensing information for a first wireless communication link; determine whether to transmit on the first wireless communication link based on the first sensing information; obtain second sensing information for a second wireless communication link; and determine whether to transmit on the second wireless communication link based on the second sensing information, wherein the determination of whether to transmit on the second wireless communication link is independent of the determination of whether to transmit on the first wireless communication link.

Another aspect of the disclosure provides an apparatus configured for communication. The apparatus including: means for obtaining first sensing information for a first wireless communication link; means for determining whether to transmit on the first wireless communication link based on the first sensing information; means for obtaining second sensing information for a second wireless communication link; and means for determining whether to transmit on the second wireless communication link based on the second sensing information, wherein the determination of whether to transmit on the second wireless communication link is independent of the determination of whether to transmit on the first wireless communication link.

Another aspect of the disclosure provides a non-transitory computer-readable medium storing computer-executable code, including code to: obtain first sensing information for a first wireless communication link; determine whether to transmit on the first wireless communication link based on the first sensing information; obtain second sensing information for a second wireless communication link; and determine whether to transmit on the second wireless communication link based on the second sensing information, wherein the determination of whether to transmit on the second wireless communication link is independent of the determination of whether to transmit on the first wireless communication link.

In some aspects, the disclosure provides a method for communication including: communicating data via a first wireless communication link; and communicating control information for a second wireless communication link via a control channel of the first wireless communication link.

Another aspect of the disclosure provides an apparatus configured for communication that includes a memory and a processor coupled to the memory. The processor and the memory are configured to: communicate data via a first wireless communication link; and communicate control information for a second wireless communication link via a control channel of the first wireless communication link.

Another aspect of the disclosure provides an apparatus configured for communication. The apparatus including: means for communicating data via a first wireless communication link; and means for communicating control information for a second wireless communication link via a control channel of the first wireless communication link.

Another aspect of the disclosure provides a non-transitory computer-readable medium storing computer-executable code, including code to: communicate data via a first wireless communication link; and communicate control information for a second wireless communication link via a control channel of the first wireless communication link.

In some aspects, the disclosure provides a method for communication including: communicating first control information via a first control channel of a first wireless communication link; and communicating second control information via a second control channel of a second wireless communication link, wherein the first control channel is independent of the second control channel.

Another aspect of the disclosure provides an apparatus configured for communication that includes a memory and a processor coupled to the memory. The processor and the memory are configured to: communicate first control information via a first control channel of a first wireless communication link; and communicate second control information via a second control channel of a second wireless communication link, wherein the first control channel is independent of the second control channel.

Another aspect of the disclosure provides an apparatus configured for communication. The apparatus including: means for communicating first control information via a first control channel of a first wireless communication link; and means for communicating second control information via a second control channel of a second wireless communication link, wherein the first control channel is independent of the second control channel.

Another aspect of the disclosure provides a non-transitory computer-readable medium storing computer-executable code, including code to: communicate first control information via a first control channel of a first wireless communication link; and communicate second control information via a second control channel of a second wireless communication link, wherein the first control channel is independent of the second control channel.

In some aspects, the disclosure provides a method for communication including: determining an interaction between a first wireless communication link and a second wireless communication link, wherein communication via the first wireless communication link is independent of communication via the second wireless communication link; and allocating at least one resource for at least one of the first wireless communication link or the second wireless communication link, wherein the allocation is based on the determined interaction.

Another aspect of the disclosure provides an apparatus configured for communication that includes a memory and a processor coupled to the memory. The processor and the memory are configured to: determine an interaction between a first wireless communication link and a second wireless communication link, wherein communication via the first wireless communication link is independent of communication via the second wireless communication link; and allocate at least one resource for at least one of the first wireless communication link or the second wireless communication link, wherein the allocation is based on the determined interaction.

Another aspect of the disclosure provides an apparatus configured for communication. The apparatus including: means for determining an interaction between a first wireless communication link and a second wireless communication link, wherein communication via the first wireless communication link is independent of communication via the second wireless communication link; and means for allocating at least one resource for at least one of the first wireless communication link or the second wireless communication link, wherein the allocation is based on the determined interaction.

Another aspect of the disclosure provides a non-transitory computer-readable medium storing computer-executable code, including code to: determine an interaction between a first wireless communication link and a second wireless communication link, wherein communication via the first wireless communication link is independent of communication via the second wireless communication link; and allocate at least one resource for at least one of the first wireless communication link or the second wireless communication link, wherein the allocation is based on the determined interaction.

In some aspects, the disclosure provides a method for communication including: obtaining first power control information for a first wireless communication link; obtaining second power control information for a second wireless communication link; and generating a power control signal based on the first power control information and the second power control information.

Another aspect of the disclosure provides an apparatus configured for communication that includes a memory and a processor coupled to the memory. The processor and the memory are configured to: obtain first power control information for a first wireless communication link; obtain second power control information for a second wireless communication link; and generate a power control signal based on the first power control information and the second power control information.

Another aspect of the disclosure provides an apparatus configured for communication. The apparatus including: means for obtaining first power control information for a first wireless communication link; means for obtaining second power control information for a second wireless communication link; and means for generating a power control signal based on the first power control information and the second power control information.

Another aspect of the disclosure provides a non-transitory computer-readable medium storing computer-executable code, including code to: obtain first power control information for a first wireless communication link; obtain second power control information for a second wireless communication link; and generate a power control signal based on the first power control information and the second power control information.

In some aspects, the disclosure provides a method for communication including: obtaining first power control information for a first wireless communication link; generating a first power control signal based on the first power control information; obtaining second power control information for a second wireless communication link; and generating a second power control signal based on the second power control information.

Another aspect of the disclosure provides an apparatus configured for communication that includes a memory and a processor coupled to the memory. The processor and the memory are configured to: obtain first power control information for a first wireless communication link; generate a first power control signal based on the first power control information; obtain second power control information for a second wireless communication link; and generate a second power control signal based on the second power control information.

Another aspect of the disclosure provides an apparatus configured for communication. The apparatus including: means for obtaining first power control information for a first wireless communication link; means for generating a first power control signal based on the first power control information; means for obtaining second power control information for a second wireless communication link; and means for generating a second power control signal based on the second power control information.

Another aspect of the disclosure provides a non-transitory computer-readable medium storing computer-executable code, including code to: obtain first power control information for a first wireless communication link; generate a first power control signal based on the first power control information; obtain second power control information for a second wireless communication link; and generate a second power control signal based on the second power control information.

In some aspects, the disclosure provides a method for communication including: obtaining first channel state information for a first wireless communication link; obtaining second channel state information for a second wireless communication link; and generating a feedback signal based on the first channel state information and the second channel state information.

Another aspect of the disclosure provides an apparatus configured for communication that includes a memory and a processor coupled to the memory. The processor and the memory are configured to: obtain first channel state information for a first wireless communication link; obtain second channel state information for a second wireless communication link; and generate a feedback signal based on the first channel state information and the second channel state information.

Another aspect of the disclosure provides an apparatus configured for communication. The apparatus including: means for obtaining first channel state information for a first wireless communication link; means for obtaining second channel state information for a second wireless communication link; and means for generating a feedback signal based on the first channel state information and the second channel state information.

Another aspect of the disclosure provides a non-transitory computer-readable medium storing computer-executable code, including code to: obtain first channel state information for a first wireless communication link; obtain second channel state information for a second wireless communication link; and generate a feedback signal based on the first channel state information and the second channel state information.

In some aspects, the disclosure provides a method for communication including: obtaining first channel state information for a first wireless communication link; generating a first feedback signal based on the first channel state information; obtaining second channel state information for a second wireless communication link; and generating a second feedback signal based on the second channel state information.

Another aspect of the disclosure provides an apparatus configured for communication that includes a memory and a processor coupled to the memory. The processor and the memory are configured to: obtain first channel state information for a first wireless communication link; generate a first feedback signal based on the first channel state information; obtain second channel state information for a second wireless communication link; and generate a second feedback signal based on the second channel state information.

Another aspect of the disclosure provides an apparatus configured for communication. The apparatus including: means for obtaining first channel state information for a first wireless communication link; means for generating a first feedback signal based on the first channel state information; means for obtaining second channel state information for a second wireless communication link; and means for generating a second feedback signal based on the second channel state information.

Another aspect of the disclosure provides a non-transitory computer-readable medium storing computer-executable code, including code to: obtain first channel state information for a first wireless communication link; generate a first feedback signal based on the first channel state information; obtain second channel state information for a second wireless communication link; and generate a second feedback signal based on the second channel state information.

In some aspects, the disclosure provides a method for communication including: communicating data via a first wireless communication link; and communicating beam information for a second wireless communication link via the first wireless communication link.

Another aspect of the disclosure provides an apparatus configured for communication that includes a memory and a processor coupled to the memory. The processor and the memory are configured to: communicate data via a first wireless communication link; and communicate beam information for a second wireless communication link via the first wireless communication link.

Another aspect of the disclosure provides an apparatus configured for communication. The apparatus including: means for communicating data via a first wireless communication link; and means for communicating beam information for a second wireless communication link via the first wireless communication link.

Another aspect of the disclosure provides a non-transitory computer-readable medium storing computer-executable code, including code to: communicate data via a first wireless communication link; and communicate beam information for a second wireless communication link via the first wireless communication link.

In some aspects, the disclosure provides a method for communication including: communicating first beam information via a first control channel of a first wireless communication link; and communicating second beam information via a second control channel of a second wireless communication link, wherein the first control channel is independent of the second control channel.

Another aspect of the disclosure provides an apparatus configured for communication that includes a memory and a processor coupled to the memory. The processor and the memory are configured to: communicate first beam information via a first control channel of a first wireless communication link; and communicate second beam information via a second control channel of a second wireless communication link, wherein the first control channel is independent of the second control channel.

Another aspect of the disclosure provides an apparatus configured for communication. The apparatus including: means for communicating first beam information via a first control channel of a first wireless communication link; and means for communicating second beam information via a second control channel of a second wireless communication link, wherein the first control channel is independent of the second control channel.

Another aspect of the disclosure provides a non-transitory computer-readable medium storing computer-executable code, including code to: communicate first beam information via a first control channel of a first wireless communication link; and communicate second beam information via a second control channel of a second wireless communication link, wherein the first control channel is independent of the second control channel.

In some aspects, the disclosure provides a method for communication including: obtaining first measurement information for a first wireless communication link; obtaining second measurement information for a second wireless communication link; and generating an event trigger based on the first measurement information and the second measurement information.

Another aspect of the disclosure provides an apparatus configured for communication that includes a memory and a processor coupled to the memory. The processor and the memory are configured to: obtain first measurement information for a first wireless communication link; obtain second measurement information for a second wireless communication link; and generate an event trigger based on the first measurement information and the second measurement information.

Another aspect of the disclosure provides an apparatus configured for communication. The apparatus including: means for obtaining first measurement information for a first wireless communication link; means for obtaining second measurement information for a second wireless communication link; and means for generating an event trigger based on the first measurement information and the second measurement information.

Another aspect of the disclosure provides a non-transitory computer-readable medium storing computer-executable code, including code to: obtain first measurement information for a first wireless communication link; obtain second measurement information for a second wireless communication link; and generate an event trigger based on the first measurement information and the second measurement information.

In some aspects, the disclosure provides a method for communication including: obtaining first measurement information for a first wireless communication link; generating a first event trigger based on the first measurement information; obtaining second measurement information for a second wireless communication link; and generating a second event trigger based on the second measurement information.

Another aspect of the disclosure provides an apparatus configured for communication that includes a memory and a processor coupled to the memory. The processor and the memory are configured to: obtain first measurement information for a first wireless communication link; generate a first event trigger based on the first measurement information; obtain second measurement information for a second wireless communication link; and generate a second event trigger based on the second measurement information.

Another aspect of the disclosure provides an apparatus configured for communication. The apparatus including: means for obtaining first measurement information for a first wireless communication link; means for generating a first event trigger based on the first measurement information; means for obtaining second measurement information for a second wireless communication link; and means for generating a second event trigger based on the second measurement information.

Another aspect of the disclosure provides a non-transitory computer-readable medium storing computer-executable code, including code to: obtain first measurement information for a first wireless communication link; generate a first event trigger based on the first measurement information; obtain second measurement information for a second wireless communication link; and generate a second event trigger based on the second measurement information.

In some aspects, the disclosure provides a method for communication including: communicating a first transport block via a first link established with a first transmit receive point (TRP); communicating a second transport block via a second link established with a second TRP; and processing the first transport block independently of the second transport block.

Another aspect of the disclosure provides an apparatus configured for communication that includes a memory and a processor coupled to the memory. The processor and the memory are configured to: communicate a first transport block via a first link established with a first transmit receive point (TRP); communicate a second transport block via a second link established with a second TRP; and process the first transport block independently of the second transport block.

Another aspect of the disclosure provides an apparatus configured for communication. The apparatus including: means for communicating a first transport block via a first link established with a first transmit receive point (TRP); means for communicating a second transport block via a second link established with a second TRP; and means for processing the first transport block independently of the second transport block.

Another aspect of the disclosure provides a non-transitory computer-readable medium storing computer-executable code, including code to: communicate a first transport block via a first link established with a first transmit receive point (TRP); communicate a second transport block via a second link established with a second TRP; and process the first transport block independently of the second transport block.

In some aspects, the disclosure provides a method for communication including: communicating with a plurality of transmit receive points (TRPs) via a plurality of independent links; and performing channel sensing for a group of the independent links by using the same channel sensing parameters for each independent link of the group.

Another aspect of the disclosure provides an apparatus configured for communication that includes a memory and a processor coupled to the memory. The processor and the memory are configured to: communicate with a plurality of transmit receive points (TRPs) via a plurality of independent links; and perform channel sensing for a group of the independent links by using the same channel sensing parameters for each independent link of the group.

Another aspect of the disclosure provides an apparatus configured for communication. The apparatus including: means for communicating with a plurality of transmit receive points (TRPs) via a plurality of independent links; and means for performing channel sensing for a group of the independent links by using the same channel sensing parameters for each independent link of the group.

Another aspect of the disclosure provides a non-transitory computer-readable medium storing computer-executable code, including code to: communicate with a plurality of transmit receive points (TRPs) via a plurality of independent links; and perform channel sensing for a group of the independent links by using the same channel sensing parameters for each independent link of the group.

In some aspects, the disclosure provides a method for communication including: communicating with a plurality of transmit receive points (TRPs) via a plurality of independent links; and performing channel sensing for each of the independent links independently of channel sensing for any of the other independent links.

Another aspect of the disclosure provides an apparatus configured for communication that includes a memory and a processor coupled to the memory. The processor and the memory are configured to: communicate with a plurality of transmit receive points (TRPs) via a plurality of independent links; and perform channel sensing for each of the independent links independently of channel sensing for any of the other independent links.

Another aspect of the disclosure provides an apparatus configured for communication. The apparatus including: means for communicating with a plurality of transmit receive points (TRPs) via a plurality of independent links; and means for performing channel sensing for each of the independent links independently of channel sensing for any of the other independent links.

Another aspect of the disclosure provides a non-transitory computer-readable medium storing computer-executable code, including code to: communicate with a plurality of transmit receive points (TRPs) via a plurality of independent links; and perform channel sensing for each of the independent links independently of channel sensing for any of the other independent links.

In some aspects, the disclosure provides a method for communication including: communicating with a plurality of transmit receive points (TRPs) via a plurality of independent links; and communicating control information for a group of the independent links via a control channel for one of the independent links of the group.

Another aspect of the disclosure provides an apparatus configured for communication that includes a memory and a processor coupled to the memory. The processor and the memory are configured to: communicate with a plurality of transmit receive points (TRPs) via a plurality of independent links; and communicate control information for a group of the independent links via a control channel for one of the independent links of the group.

Another aspect of the disclosure provides an apparatus configured for communication. The apparatus including: means for communicating with a plurality of transmit receive points (TRPs) via a plurality of independent links; and means for communicating control information for a group of the independent links via a control channel for one of the independent links of the group.

Another aspect of the disclosure provides a non-transitory computer-readable medium storing computer-executable code, including code to: communicate with a plurality of transmit receive points (TRPs) via a plurality of independent links; and communicate control information for a group of the independent links via a control channel for one of the independent links of the group.

In some aspects, the disclosure provides a method for communication including: communicating with a plurality of transmit receive points (TRPs) via a plurality of independent links; and for each of the independent links, communicating control information via an independent control channel for the independent link.

Another aspect of the disclosure provides an apparatus configured for communication that includes a memory and a processor coupled to the memory. The processor and the memory are configured to: communicate with a plurality of transmit receive points (TRPs) via a plurality of independent links; and for each of the independent links, communicate control information via an independent control channel for the independent link.

Another aspect of the disclosure provides an apparatus configured for communication. The apparatus including: means for communicating with a plurality of transmit receive points (TRPs) via a plurality of independent links; and means for communicating control information, for each of the independent links, via an independent control channel for the independent link.

Another aspect of the disclosure provides a non-transitory computer-readable medium storing computer-executable code, including code to: communicate with a plurality of transmit receive points (TRPs) via a plurality of independent links; and for each of the independent links, communicate control information via an independent control channel for the independent link.

In some aspects, the disclosure provides a method for communication including: establishing connections with a plurality of transmit receive points (TRPs) via a plurality of independent links; determining whether communication on at least two of the independent links can be in different directions for a particular symbol time; and communicating on the at least two of the independent links according to the determination.

Another aspect of the disclosure provides an apparatus configured for communication that includes a memory and a processor coupled to the memory. The processor and the memory are configured to: establish connections with a plurality of transmit receive points (TRPs) via a plurality of independent links; determine whether communication on at least two of the independent links can be in different directions for a particular symbol time; and communicate on the at least two of the independent links according to the determination.

Another aspect of the disclosure provides an apparatus configured for communication. The apparatus including: means for establishing connections with a plurality of transmit receive points (TRPs) via a plurality of independent links; means for determining whether communication on at least two of the independent links can be in different directions for a particular symbol time; and means for communicating on the at least two of the independent links according to the determination.

Another aspect of the disclosure provides a non-transitory computer-readable medium storing computer-executable code, including code to: establish connections with a plurality of transmit receive points (TRPs) via a plurality of independent links; determine whether communication on at least two of the independent links can be in different directions for a particular symbol time; and communicate on the at least two of the independent links according to the determination.

In some aspects, the disclosure provides a method for communication including: communicating with a first transmit receive point (TRP) via a first independent link; and communicating, via the first independent link, an indication of a second independent link with a second TRP.

Another aspect of the disclosure provides an apparatus configured for communication that includes a memory and a processor coupled to the memory. The processor and the memory are configured to: communicate with a first transmit receive point (TRP) via a first independent link; and communicate, via the first independent link, an indication of a second independent link with a second TRP.

Another aspect of the disclosure provides an apparatus configured for communication. The apparatus including: means for communicating with a first transmit receive point (TRP) via a first independent link; and means for communicating, via the first independent link, an indication of a second independent link with a second TRP.

Another aspect of the disclosure provides a non-transitory computer-readable medium storing computer-executable code, including code to: communicate with a first transmit receive point (TRP) via a first independent link; and communicate, via the first independent link, an indication of a second independent link with a second TRP.

In some aspects, the disclosure provides a method for communication including: communicating with a plurality of transmit receive points (TRPs) via a plurality of independent links; and communicating feedback information for a group of the independent links via a feedback channel for one of the independent links of the group.

Another aspect of the disclosure provides an apparatus configured for communication that includes a memory and a processor coupled to the memory. The processor and the memory are configured to: communicate with a plurality of transmit receive points (TRPs) via a plurality of independent links; and communicate feedback information for a group of the independent links via a feedback channel for one of the independent links of the group.

Another aspect of the disclosure provides an apparatus configured for communication. The apparatus including: means for communicating with a plurality of transmit receive points (TRPs) via a plurality of independent links; and means for communicating feedback information for a group of the independent links via a feedback channel for one of the independent links of the group.

Another aspect of the disclosure provides a non-transitory computer-readable medium storing computer-executable code, including code to: communicate with a plurality of transmit receive points (TRPs) via a plurality of independent links; and communicate feedback information for a group of the independent links via a feedback channel for one of the independent links of the group.

In some aspects, the disclosure provides a method for communication including: communicating with a plurality of transmit receive points (TRPs) via a plurality of independent links; and for each of the independent links, communicating feedback information via an independent feedback channel for the independent link.

Another aspect of the disclosure provides an apparatus configured for communication that includes a memory and a processor coupled to the memory. The processor and the memory are configured to: communicate with a plurality of transmit receive points (TRPs) via a plurality of independent links; and for each of the independent links, communicate feedback information via an independent feedback channel for the independent link.

Another aspect of the disclosure provides an apparatus configured for communication. The apparatus including: means for communicating with a plurality of transmit receive points (TRPs) via a plurality of independent links; and means for communicating, for each of the independent links, feedback information via an independent feedback channel for the independent link.

Another aspect of the disclosure provides a non-transitory computer-readable medium storing computer-executable code, including code to: communicate with a plurality of transmit receive points (TRPs) via a plurality of independent links; and for each of the independent links, communicate feedback information via an independent feedback channel for the independent link.

In some aspects, the disclosure provides a method for communication including: communicating with a plurality of transmit receive points (TRPs) via a plurality of independent links; and communicating power control information for a group of the independent links.

Another aspect of the disclosure provides an apparatus configured for communication that includes a memory and a processor coupled to the memory. The processor and the memory are configured to: communicate with a plurality of transmit receive points (TRPs) via a plurality of independent links; and communicate power control information for a group of the independent links.

Another aspect of the disclosure provides an apparatus configured for communication. The apparatus including: means for communicating with a plurality of transmit receive points (TRPs) via a plurality of independent links; and means for communicating power control information for a group of the independent links Another aspect of the disclosure provides a non-transitory computer-readable medium storing computer-executable code, including code to: communicate with a plurality of transmit receive points (TRPs) via a plurality of independent links; and communicate power control information for a group of the independent links.

In some aspects, the disclosure provides a method for communication including: communicating with a plurality of transmit receive points (TRPs) via a plurality of independent links; and for each of the independent links, communicating respective power control information for the independent link.

Another aspect of the disclosure provides an apparatus configured for communication that includes a memory and a processor coupled to the memory. The processor and the memory are configured to: communicate with a plurality of transmit receive points (TRPs) via a plurality of independent links; and for each of the independent links, communicate respective power control information for the independent link.

Another aspect of the disclosure provides an apparatus configured for communication. The apparatus including: means for communicating with a plurality of transmit receive points (TRPs) via a plurality of independent links; and means for communicating, for each of the independent links, respective power control information for the independent link.

Another aspect of the disclosure provides a non-transitory computer-readable medium storing computer-executable code, including code to: communicate with a plurality of transmit receive points (TRPs) via a plurality of independent links; and for each of the independent links, communicate respective power control information for the independent link.

In some aspects, the disclosure provides a method for communication including: establishing connections with a plurality of transmit receive points (TRPs) via a plurality of independent links; determining whether uplink sounding for at least two of the independent links can be communicated concurrently; and communicating uplink sounding on the at least two of the independent links according to the determination.

Another aspect of the disclosure provides an apparatus configured for communication that includes a memory and a processor coupled to the memory. The processor and the memory are configured to: establish connections with a plurality of transmit receive points (TRPs) via a plurality of independent links; determine whether uplink sounding for at least two of the independent links can be communicated concurrently; and communicate uplink sounding on the at least two of the independent links according to the determination.

Another aspect of the disclosure provides an apparatus configured for communication. The apparatus including: means for establishing connections with a plurality of transmit receive points (TRPs) via a plurality of independent links; means for determining whether uplink sounding for at least two of the independent links can be communicated concurrently; and means for communicating uplink sounding on the at least two of the independent links according to the determination.

Another aspect of the disclosure provides a non-transitory computer-readable medium storing computer-executable code, including code to: establish connections with a plurality of transmit receive points (TRPs) via a plurality of independent links; determine whether uplink sounding for at least two of the independent links can be communicated concurrently; and communicate uplink sounding on the at least two of the independent links according to the determination.

In some aspects, the disclosure provides a method for communication including: communicating with a plurality of transmit receive points (TRPs) via a plurality of independent links; determining whether channel status feedback for at least two of the independent links is to be independent; and communicating channel status feedback for the independent links according to the determination.

Another aspect of the disclosure provides an apparatus configured for communication that includes a memory and a processor coupled to the memory. The processor and the memory are configured to: communicate with a plurality of transmit receive points (TRPs) via a plurality of independent links; determine whether channel status feedback for at least two of the independent links is to be independent; and communicate channel status feedback for the independent links according to the determination.

Another aspect of the disclosure provides an apparatus configured for communication. The apparatus including: means for communicating with a plurality of transmit receive points (TRPs) via a plurality of independent links; means for determining whether channel status feedback for at least two of the independent links is to be independent; and means for communicating channel status feedback for the independent links according to the determination.

Another aspect of the disclosure provides a non-transitory computer-readable medium storing computer-executable code, including code to: communicate with a plurality of transmit receive points (TRPs) via a plurality of independent links; determine whether channel status feedback for at least two of the independent links is to be independent; and communicate channel status feedback for the independent links according to the determination.

In some aspects, the disclosure provides a method for communication including: communicating with a plurality of transmit receive points (TRPs) via a plurality of independent links; and communicating beam switching information for a group of the independent links via one of the independent links of the group.

Another aspect of the disclosure provides an apparatus configured for communication that includes a memory and a processor coupled to the memory. The processor and the memory are configured to: communicate with a plurality of transmit receive points (TRPs) via a plurality of independent links; and communicate beam switching information for a group of the independent links via one of the independent links of the group.

Another aspect of the disclosure provides an apparatus configured for communication. The apparatus including: means for communicating with a plurality of transmit receive points (TRPs) via a plurality of independent links; and means for communicating beam switching information for a group of the independent links via one of the independent links of the group.

Another aspect of the disclosure provides a non-transitory computer-readable medium storing computer-executable code, including code to: communicate with a plurality of transmit receive points (TRPs) via a plurality of independent links; and communicate beam switching information for a group of the independent links via one of the independent links of the group.

In some aspects, the disclosure provides a method for communication including: communicating with a plurality of transmit receive points (TRPs) via a plurality of independent links; and communicating beam switching information independently for each independent link.

Another aspect of the disclosure provides an apparatus configured for communication that includes a memory and a processor coupled to the memory. The processor and the memory are configured to: communicate with a plurality of transmit receive points (TRPs) via a plurality of independent links; and communicate beam switching information independently for each independent link.

Another aspect of the disclosure provides an apparatus configured for communication. The apparatus including: means for communicating with a plurality of transmit receive points (TRPs) via a plurality of independent links; and means for communicating beam switching information independently for each independent link.

Another aspect of the disclosure provides a non-transitory computer-readable medium storing computer-executable code, including code to: communicate with a plurality of transmit receive points (TRPs) via a plurality of independent links; and communicate beam switching information independently for each independent link.

In some aspects, the disclosure provides a method for communication including: communicating with a plurality of transmit receive points (TRPs) via a plurality of independent links; and performing beam recovery for a first one of the independent links via a second one of the independent links.

Another aspect of the disclosure provides an apparatus configured for communication that includes a memory and a processor coupled to the memory. The processor and the memory are configured to: communicate with a plurality of transmit receive points (TRPs) via a plurality of independent links; and perform beam recovery for a first one of the independent links via a second one of the independent links.

Another aspect of the disclosure provides an apparatus configured for communication. The apparatus including: means for communicating with a plurality of transmit receive points (TRPs) via a plurality of independent links; and means for performing beam recovery for a first one of the independent links via a second one of the independent links.

Another aspect of the disclosure provides a non-transitory computer-readable medium storing computer-executable code, including code to: communicate with a plurality of transmit receive points (TRPs) via a plurality of independent links; and perform beam recovery for a first one of the independent links via a second one of the independent links.

In some aspects, the disclosure provides a method for communication including: communicating with a plurality of transmit receive points (TRPs) via a plurality of independent links; and performing beam recovery independently for each independent link.

Another aspect of the disclosure provides an apparatus configured for communication that includes a memory and a processor coupled to the memory. The processor and the memory are configured to: communicate with a plurality of transmit receive points (TRPs) via a plurality of independent links; and perform beam recovery independently for each independent link.

Another aspect of the disclosure provides an apparatus configured for communication. The apparatus including: means for communicating with a plurality of transmit receive points (TRPs) via a plurality of independent links; and means for performing beam recovery independently for each independent link.

Another aspect of the disclosure provides a non-transitory computer-readable medium storing computer-executable code, including code to: communicate with a plurality of transmit receive points (TRPs) via a plurality of independent links; and perform beam recovery independently for each independent link.

In some aspects, the disclosure provides a method for communication including: communicating with a plurality of transmit receive points (TRPs) via a plurality of independent links; conducting link measurements for a group of the independent links; and triggering a handoff event based on the link measurements for the group.

Another aspect of the disclosure provides an apparatus configured for communication that includes a memory and a processor coupled to the memory. The processor and the memory are configured to: communicate with a plurality of transmit receive points (TRPs) via a plurality of independent links; conduct link measurements for a group of the independent links; and trigger a handoff event based on the link measurements for the group.

Another aspect of the disclosure provides an apparatus configured for communication. The apparatus including: means for communicating with a plurality of transmit receive points (TRPs) via a plurality of independent links; means for conducting link measurements for a group of the independent links; and means for triggering a handoff event based on the link measurements for the group.

Another aspect of the disclosure provides a non-transitory computer-readable medium storing computer-executable code, including code to: communicate with a plurality of transmit receive points (TRPs) via a plurality of independent links; conduct link measurements for a group of the independent links; and trigger a handoff event based on the link measurements for the group.

In some aspects, the disclosure provides a method for communication including: communicating with a plurality of transmit receive points (TRPs) via a plurality of independent links; conducting link measurements independently for each independent link; and for each independent link, independently triggering a handoff event for the independent link based on the link measurements for the independent link.

Another aspect of the disclosure provides an apparatus configured for communication that includes a memory and a processor coupled to the memory. The processor and the memory are configured to: communicate with a plurality of transmit receive points (TRPs) via a plurality of independent links; conduct link measurements independently for each independent link; and for each independent link, independently trigger a handoff event for the independent link based on the link measurements for the independent link.

Another aspect of the disclosure provides an apparatus configured for communication. The apparatus including: means for communicating with a plurality of transmit receive points (TRPs) via a plurality of independent links; means for conducting link measurements independently for each independent link; and means for independently triggering, for each independent link, a handoff event for the independent link based on the link measurements for the independent link.

Another aspect of the disclosure provides a non-transitory computer-readable medium storing computer-executable code, including code to: communicate with a plurality of transmit receive points (TRPs) via a plurality of independent links; conduct link measurements independently for each independent link; and for each independent link, independently trigger a handoff event for the independent link based on the link measurements for the independent link.

In some aspects, the disclosure provides a method for communication including: communicating with a plurality of transmit receive points (TRPs) via a plurality of independent links; determining that a plurality of the independent links has failed; and communicate an indication of the failure of the plurality of independent links.

Another aspect of the disclosure provides an apparatus configured for communication that includes a memory and a processor coupled to the memory. The processor and the memory are configured to: communicate with a plurality of transmit receive points (TRPs) via a plurality of independent links; determine that a plurality of the independent links has failed; and communicate an indication of the failure of the plurality of independent links.

Another aspect of the disclosure provides an apparatus configured for communication. The apparatus including: means for communicating with a plurality of transmit receive points (TRPs) via a plurality of independent links; means for determining that a plurality of the independent links has failed; and means for communicating an indication of the failure of the plurality of independent links.

Another aspect of the disclosure provides a non-transitory computer-readable medium storing computer-executable code, including code to: communicate with a plurality of transmit receive points (TRPs) via a plurality of independent links; determine that a plurality of the independent links has failed; and communicate an indication of the failure of the plurality of independent links.

In some aspects, the disclosure provides a method for communication including: establishing connections with a plurality of transmit receive points (TRPs) via a plurality of independent links; identifying a protected portion for at least one of the independent links; and limiting transmission on at least one other one of the independent links for a subset of frequency resources associated with the protected portion.

Another aspect of the disclosure provides an apparatus configured for communication that includes a memory and a processor coupled to the memory. The processor and the memory are configured to: establish connections with a plurality of transmit receive points (TRPs) via a plurality of independent links; identify a protected portion for at least one of the independent links; and limit transmission on at least one other one of the independent links for a subset of frequency resources associated with the protected portion.

Another aspect of the disclosure provides an apparatus configured for communication. The apparatus including: means for establishing connections with a plurality of transmit receive points (TRPs) via a plurality of independent links; means for identifying a protected portion for at least one of the independent links; and means for limiting transmission on at least one other one of the independent links for a subset of frequency resources associated with the protected portion.

Another aspect of the disclosure provides a non-transitory computer-readable medium storing computer-executable code, including code to: establish connections with a plurality of transmit receive points (TRPs) via a plurality of independent links; identify a protected portion for at least one of the independent links; and limit transmission on at least one other one of the independent links for a subset of frequency resources associated with the protected portion.

In some aspects, the disclosure provides a method for communication including: establishing a first link between a first transmit receive point (TRP) and a user equipment (UE); communicating a first transport block via a first link; and communicating, via the first link, information to support communication of a second transport block via a second link established between a second TRP and the UE, wherein the first transport block is independent of the second transport block.

Another aspect of the disclosure provides an apparatus configured for communication that includes a memory and a processor coupled to the memory. The processor and the memory are configured to: establish a first link between a first transmit receive point (TRP) and a user equipment (UE); communicate a first transport block via a first link; and communicate, via the first link, information to support communication of a second transport block via a second link established between a second TRP and the UE, wherein the first transport block is independent of the second transport block.

Another aspect of the disclosure provides an apparatus configured for communication. The apparatus including: means for establishing a first link between a first transmit receive point (TRP) and a user equipment (UE); means for communicating a first transport block via a first link; and means for communicating, via the first link, information to support communication of a second transport block via a second link established between a second TRP and the UE, wherein the first transport block is independent of the second transport block.

Another aspect of the disclosure provides a non-transitory computer-readable medium storing computer-executable code, including code to: establish a first link between a first transmit receive point (TRP) and a user equipment (UE); communicate a first transport block via a first link; and communicate, via the first link, information to support communication of a second transport block via a second link established between a second TRP and the UE, wherein the first transport block is independent of the second transport block.

In some aspects, the disclosure provides a method for communication including: establishing a first link between a first transmit receive point (TRP) and a user equipment (UE); and communicating, via the first link, channel sensing parameters for a group of independent links used by the UE for communication with a plurality of TRPs.

Another aspect of the disclosure provides an apparatus configured for communication that includes a memory and a processor coupled to the memory. The processor and the memory are configured to: establish a first link between a first transmit receive point (TRP) and a user equipment (UE); and communicate, via the first link, channel sensing parameters for a group of independent links used by the UE for communication with a plurality of TRPs.

Another aspect of the disclosure provides an apparatus configured for communication. The apparatus including: means for establishing a first link between a first transmit receive point (TRP) and a user equipment (UE); and means for communicating, via the first link, channel sensing parameters for a group of independent links used by the UE for communication with a plurality of TRPs.

Another aspect of the disclosure provides a non-transitory computer-readable medium storing computer-executable code, including code to: establish a first link between a first transmit receive point (TRP) and a user equipment (UE); and communicate, via the first link, channel sensing parameters for a group of independent links used by the UE for communication with a plurality of TRPs.

In some aspects, the disclosure provides a method for communication including: establishing a first link between a first transmit receive point (TRP) and a user equipment (UE); and communicating, via the first link, control information for a group of independent links used by the UE for communication with a plurality of TRPs.

Another aspect of the disclosure provides an apparatus configured for communication that includes a memory and a processor coupled to the memory. The processor and the memory are configured to: establish a first link between a first transmit receive point (TRP) and a user equipment (UE); and communicate, via the first link, control information for a group of independent links used by the UE for communication with a plurality of TRPs.

Another aspect of the disclosure provides an apparatus configured for communication. The apparatus including: means for establishing a first link between a first transmit receive point (TRP) and a user equipment (UE); and means for communicating, via the first link, control information for a group of independent links used by the UE for communication with a plurality of TRPs.

Another aspect of the disclosure provides a non-transitory computer-readable medium storing computer-executable code, including code to: establish a first link between a first transmit receive point (TRP) and a user equipment (UE); and communicate, via the first link, control information for a group of independent links used by the UE for communication with a plurality of TRPs.

In some aspects, the disclosure provides a method for communication including: determining whether communication on at least two independent links used by a user equipment can be in different directions for a particular symbol time; and communicating on the at least two independent links according to the determination.

Another aspect of the disclosure provides an apparatus configured for communication that includes a memory and a processor coupled to the memory. The processor and the memory are configured to: determine whether communication on at least two independent links used by a user equipment can be in different directions for a particular symbol time; and communicate on the at least two independent links according to the determination.

Another aspect of the disclosure provides an apparatus configured for communication. The apparatus including: means for determining whether communication on at least two independent links used by a user equipment can be in different directions for a particular symbol time; and means for communicating on the at least two independent links according to the determination.

Another aspect of the disclosure provides a non-transitory computer-readable medium storing computer-executable code, including code to: determine whether communication on at least two independent links used by a user equipment can be in different directions for a particular symbol time; and communicate on the at least two independent links according to the determination In some aspects, the disclosure provides a method for communication including: communicating with a user equipment (UE) via a first link; and communicating, via the first link, an indication of a second link with which the UE may communicate with a second TRP, wherein the first link is independent of the second link.

Another aspect of the disclosure provides an apparatus configured for communication that includes a memory and a processor coupled to the memory. The processor and the memory are configured to: communicate with a user equipment (UE) via a first link; and communicate, via the first link, an indication of a second link with which the UE may communicate with a second TRP, wherein the first link is independent of the second link.

Another aspect of the disclosure provides an apparatus configured for communication. The apparatus including: means for communicating with a user equipment (UE) via a first link; and means for communicating, via the first link, an indication of a second link with which the UE may communicate with a second TRP, wherein the first link is independent of the second link.

Another aspect of the disclosure provides a non-transitory computer-readable medium storing computer-executable code, including code to: communicate with a user equipment (UE) via a first link; and communicate, via the first link, an indication of a second link with which the UE may communicate with a second TRP, wherein the first link is independent of the second link.

In some aspects, the disclosure provides a method for communication including: establishing a first link between a first transmit receive point (TRP) and a user equipment (UE); and communicating, via a feedback channel for the first link, feedback information for a group of independent links used by the UE for communication with a plurality of TRPs.

Another aspect of the disclosure provides an apparatus configured for communication that includes a memory and a processor coupled to the memory. The processor and the memory are configured to: establish a first link between a first transmit receive point (TRP) and a user equipment (UE); and communicate, via a feedback channel for the first link, feedback information for a group of independent links used by the UE for communication with a plurality of TRPs.

Another aspect of the disclosure provides an apparatus configured for communication. The apparatus including: means for establishing a first link between a first transmit receive point (TRP) and a user equipment (UE); and means for communicating, via a feedback channel for the first link, feedback information for a group of independent links used by the UE for communication with a plurality of TRPs.

Another aspect of the disclosure provides a non-transitory computer-readable medium storing computer-executable code, including code to: establish a first link between a first transmit receive point (TRP) and a user equipment (UE); and communicate, via a feedback channel for the first link, feedback information for a group of independent links used by the UE for communication with a plurality of TRPs.

In some aspects, the disclosure provides a method for communication including: establishing a first link between a first transmit receive point (TRP) and a user equipment (UE); and communicating, via the first link, power control information for a group of independent links used by the UE for communication with a plurality of TRPs.

Another aspect of the disclosure provides an apparatus configured for communication that includes a memory and a processor coupled to the memory. The processor and the memory are configured to: establish a first link between a first transmit receive point (TRP) and a user equipment (UE); and communicate, via the first link, power control information for a group of independent links used by the UE for communication with a plurality of TRPs.

Another aspect of the disclosure provides an apparatus configured for communication. The apparatus including: means for establishing a first link between a first transmit receive point (TRP) and a user equipment (UE); and means for communicating, via the first link, power control information for a group of independent links used by the UE for communication with a plurality of TRPs.

Another aspect of the disclosure provides a non-transitory computer-readable medium storing computer-executable code, including code to: establish a first link between a first transmit receive point (TRP) and a user equipment (UE); and communicate, via the first link, power control information for a group of independent links used by the UE for communication with a plurality of TRPs.

In some aspects, the disclosure provides a method for communication including: determining whether uplink sounding for at least two independent links used by a user equipment (UE) to communicate with a plurality of transmit receive points (TRPs) can be communicated concurrently; and communicating the uplink sounding on the at least two of the independent links according to the determination.

Another aspect of the disclosure provides an apparatus configured for communication that includes a memory and a processor coupled to the memory. The processor and the memory are configured to: determine whether uplink sounding for at least two independent links used by a user equipment (UE) to communicate with a plurality of transmit receive points (TRPs) can be communicated concurrently; and communicate the uplink sounding on the at least two of the independent links according to the determination.

Another aspect of the disclosure provides an apparatus configured for communication. The apparatus including: means for determining whether uplink sounding for at least two independent links used by a user equipment (UE) to communicate with a plurality of transmit receive points (TRPs) can be communicated concurrently; and means for communicating the uplink sounding on the at least two of the independent links according to the determination.

Another aspect of the disclosure provides a non-transitory computer-readable medium storing computer-executable code, including code to: determine whether uplink sounding for at least two independent links used by a user equipment (UE) to communicate with a plurality of transmit receive points (TRPs) can be communicated concurrently; and communicate the uplink sounding on the at least two of the independent links according to the determination.

In some aspects, the disclosure provides a method for communication including: establishing a first link between a first transmit receive point (TRP) and a user equipment (UE); and communicating, via the first link, beam switching information for a group of independent links used by the UE for communication with a plurality of TRPs.

Another aspect of the disclosure provides an apparatus configured for communication that includes a memory and a processor coupled to the memory. The processor and the memory are configured to: establish a first link between a first transmit receive point (TRP) and a user equipment (UE); and communicate, via the first link, beam switching information for a group of independent links used by the UE for communication with a plurality of TRPs.

Another aspect of the disclosure provides an apparatus configured for communication. The apparatus including: means for establishing a first link between a first transmit receive point (TRP) and a user equipment (UE); and means for communicating, via the first link, beam switching information for a group of independent links used by the UE for communication with a plurality of TRPs.

Another aspect of the disclosure provides a non-transitory computer-readable medium storing computer-executable code, including code to: establish a first link between a first transmit receive point (TRP) and a user equipment (UE); and communicate, via the first link, beam switching information for a group of independent links used by the UE for communication with a plurality of TRPs.

In some aspects, the disclosure provides a method for communication including: establishing a first link between a first transmit receive point (TRP) and a user equipment (UE); and communicating, via the first link, beam recovery information for a second link used by the UE to communicate with a second TRP.

Another aspect of the disclosure provides an apparatus configured for communication that includes a memory and a processor coupled to the memory. The processor and the memory are configured to: establish a first link between a first transmit receive point (TRP) and a user equipment (UE); and communicate, via the first link, beam recovery information for a second link used by the UE to communicate with a second TRP.

Another aspect of the disclosure provides an apparatus configured for communication. The apparatus including: means for establishing a first link between a first transmit receive point (TRP) and a user equipment (UE); and means for communicating, via the first link, beam recovery information for a second link used by the UE to communicate with a second TRP.

Another aspect of the disclosure provides a non-transitory computer-readable medium storing computer-executable code, including code to: establish a first link between a first transmit receive point (TRP) and a user equipment (UE); and communicate, via the first link, beam recovery information for a second link used by the UE to communicate with a second TRP.

In some aspects, the disclosure provides a method for communication including: identifying a group of independent links used by a user equipment (UE); and sending an indication to the UE to trigger a handoff event based on link measurements for the group.

Another aspect of the disclosure provides an apparatus configured for communication that includes a memory and a processor coupled to the memory. The processor and the memory are configured to: identify a group of independent links used by a user equipment (UE); and send an indication to the UE to trigger a handoff event based on link measurements for the group.

Another aspect of the disclosure provides an apparatus configured for communication. The apparatus including: means for identifying a group of independent links used by a user equipment (UE); and means for sending an indication to the UE to trigger a handoff event based on link measurements for the group.

Another aspect of the disclosure provides a non-transitory computer-readable medium storing computer-executable code, including code to: identify a group of independent links used by a user equipment (UE); and send an indication to the UE to trigger a handoff event based on link measurements for the group.

In some aspects, the disclosure provides a method for communication including: establishing a first link between a first transmit receive point (TRP) and a user equipment (UE); and communicating, via the first link, an indication of the failure of a plurality of independent links used by the UE for communication with a plurality of TRPs.

Another aspect of the disclosure provides an apparatus configured for communication that includes a memory and a processor coupled to the memory. The processor and the memory are configured to: establish a first link between a first transmit receive point (TRP) and a user equipment (UE); and communicate, via the first link, an indication of the failure of a plurality of independent links used by the UE for communication with a plurality of TRPs.

Another aspect of the disclosure provides an apparatus configured for communication. The apparatus including: means for establishing a first link between a first transmit receive point (TRP) and a user equipment (UE); and means for communicating, via the first link, an indication of the failure of a plurality of independent links used by the UE for communication with a plurality of TRPs.

Another aspect of the disclosure provides a non-transitory computer-readable medium storing computer-executable code, including code to: establish a first link between a first transmit receive point (TRP) and a user equipment (UE); and communicate, via the first link, an indication of the failure of a plurality of independent links used by the UE for communication with a plurality of TRPs.

In some aspects, the disclosure provides a method for communication including: establishing a first link between a first transmit receive point (TRP) and a user equipment (UE); identifying a protected portion for at least one independent link used by the UE for communication with a plurality of TRPs; and limiting transmission on the first link for a subset of frequency resources associated with the protected portion.

Another aspect of the disclosure provides an apparatus configured for communication that includes a memory and a processor coupled to the memory. The processor and the memory are configured to: establish a first link between a first transmit receive point (TRP) and a user equipment (UE); identify a protected portion for at least one independent link used by the UE for communication with a plurality of TRPs; and limit transmission on the first link for a subset of frequency resources associated with the protected portion.

Another aspect of the disclosure provides an apparatus configured for communication. The apparatus including: means for establishing a first link between a first transmit receive point (TRP) and a user equipment (UE); means for identifying a protected portion for at least one independent link used by the UE for communication with a plurality of TRPs; and means for limiting transmission on the first link for a subset of frequency resources associated with the protected portion.

Another aspect of the disclosure provides a non-transitory computer-readable medium storing computer-executable code, including code to: establish a first link between a first transmit receive point (TRP) and a user equipment (UE); identify a protected portion for at least one independent link used by the UE for communication with a plurality of TRPs; and limit transmission on the first link for a subset of frequency resources associated with the protected portion.

Other Aspects

The examples set forth herein are provided to illustrate certain concepts of the disclosure. Those of ordinary skill in the art will comprehend that these are merely illustrative in nature, and other examples may fall within the scope of the disclosure and the appended claims. Based on the teachings herein those skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein.

As those skilled in the art will readily appreciate, various aspects described throughout this disclosure may be extended to any suitable telecommunication system, network architecture, and communication standard. By way of example, various aspects may be applied to wide area networks, peer-to-peer network, local area network, other suitable systems, or any combination thereof, including those described by yet-to-be defined standards.

Many aspects are described in terms of sequences of actions to be performed by, for example, elements of a computing device. It will be recognized that various actions described herein can be performed by specific circuits, for example, central processing units (CPUs), graphic processing units (GPUs), digital signal processors (DSPs), application specific integrated circuits (ASICs), field programmable gate arrays (FPGAs), or various other types of general purpose or special purpose processors or circuits, by program instructions being executed by one or more processors, or by a combination of both. Additionally, these sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter. In addition, for each of the aspects described herein, the corresponding form of any such aspects may be described herein as, for example, "logic configured to" perform the described action.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

One or more of the components, steps, features and/or functions illustrated in above may be rearranged and/or combined into a single component, step, feature or function or embodied in several components, steps, or functions. Additional elements, components, steps, and/or functions may also be added without departing from novel features disclosed herein. The apparatus, devices, and/or components illustrated above may be configured to perform one or more of the methods, features, or steps described herein. The novel algorithms described herein may also be efficiently implemented in software and/or embedded in hardware.

It is to be understood that the specific order or hierarchy of steps in the methods disclosed is an illustration of example processes. Based upon design preferences, it is understood that the specific order or hierarchy of steps in the methods may be rearranged. The accompanying method claims present elements of the various steps in a sample order, and are not meant to be limited to the specific order or hierarchy presented unless specifically recited therein.

The methods, sequences or algorithms described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An example of a storage medium is coupled to the processor such that the processor can read information from, and write information to, the storage medium. In the alternative, the storage medium may be integral to the processor.

The word "exemplary" is used herein to mean "serving as an example, instance, or illustration." Any aspect described herein as "exemplary" is not necessarily to be construed as preferred or advantageous over other aspects. Likewise, the term "aspects" does not require that all aspects include the discussed feature, advantage or mode of operation.

The terminology used herein is for the purpose of describing particular aspects only and is not intended to be limiting of the aspects. As used herein, the singular forms "a," "an" and "the" are intended to include the plural forms as well, unless the context clearly indicates otherwise. It will be further understood that the terms "comprises," "comprising," "includes" or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise. It is also understood that the symbol "I" between two adjacent words has the same meaning as "or" unless expressly stated otherwise. Moreover, phrases such as "connected to," "coupled to" or "in communication with" are not limited to direct connections unless expressly stated otherwise.

Any reference to an element herein using a designation such as "first," "second," and so forth does not generally limit the quantity or order of those elements. Rather, these designations may be used herein as a convenient method of distinguishing between two or more elements or instances of an element. Thus, a reference to first and second elements does not mean that only two elements may be used there or that the first element must precede the second element in some manner. Also, unless stated otherwise a set of elements may comprise one or more elements. In addition, terminology of the form "at least one of a, b, or c" or "a, b, c, or any combination thereof" used in the description or the claims means "a or b or c or any combination of these elements." For example, this terminology may include a, or b, or c, or a and b, or a and c, or a and b and c, or 2a, or 2b, or 2c, or 2a and b, and so on.

As used herein, the term "determining" encompasses a wide variety of actions. For example, "determining" may include calculating, computing, processing, deriving, investigating, looking up (e.g., looking up in a table, a database or another data structure), ascertaining, and the like. Also, "determining" may include receiving (e.g., receiving information), accessing (e.g., accessing data in a memory), and the like. Also, "determining" may include resolving, selecting, choosing, establishing, and the like.

While the foregoing disclosure shows illustrative aspects, it should be noted that various changes and modifications could be made herein without departing from the scope of the appended claims. The functions, steps or actions of the method claims in accordance with aspects described herein need not be performed in any particular order unless expressly stated otherwise. Furthermore, although elements may be described or claimed in the singular, the plural is contemplated unless limitation to the singular is explicitly stated.

What is claimed is:

1. A method of communication for an apparatus, comprising:
    determining an interaction between a first wireless communication link and a second wireless communication link,
        wherein the interaction is characterized by an amount of radio frequency (RF) isolation between the first wireless communication link and the second wireless communication link;
        wherein communication via the first wireless communication link is independent of communication via the second wireless communication link; and
    allocating at least one resource for at least one of the first wireless communication link or the second wireless communication link, wherein the allocation is based on the determined interaction;
        wherein, if the RF isolation is greater than an RF isolation threshold, the allocation comprises:
            designating the communication via the first wireless communication link to be in a first direction for a particular symbol time; and
            designating the communication via the second wireless communication link to be in the first direction for the particular symbol time.

2. A method of communication for an apparatus, comprising:
    determining an interaction between a first wireless communication link and a second wireless communication link,
        wherein the interaction is characterized by an amount of radio frequency (RF) isolation between the first wireless communication link and the second wireless communication link;
        wherein communication via the first wireless communication link is independent of communication via the second wireless communication link; and
    allocating at least one resource for at least one of the first wireless communication link or the second wireless communication link, wherein the allocation is based on the determined interaction:
        wherein, if the RF isolation is less than an RF isolation threshold, the allocation comprises:
            designating uplink sounding for the first wireless communication link to be time division multiplexed within a sub-frame.

3. A method of communication for an apparatus, comprising:
    determining an interaction between a first wireless communication link and a second wireless communication link,
        wherein communication via the first wireless communication link is independent of communication via the second wireless communication link; and
    allocating at least one resource for at least one of the first wireless communication link or the second wireless communication link, wherein the allocation is based on the determined interaction;
        wherein the allocation comprises:
            identifying a protected portion for the first wireless communication link; and
            limiting transmission on the second wireless communication link for a subset of frequency resources associated with the protected portion.

4. The method of claim 3, wherein the limiting of transmission comprises reducing transmit power or temporarily ceasing transmission.

5. The method of claim 3, further comprising:
    coordinating the protected portion with at least one other apparatus.

6. An apparatus comprising:
    a memory; and
    a processor coupled to the memory, the processor and the memory configured to:
        determine an amount of radio frequency (RF) isolation between a first wireless communication link and a second wireless communication link, wherein communication via the first wireless communication link is independent of communication via the second wireless communication link; and
        allocate at least one resource for at least one of the first wireless communication link or the second wireless communication link, the allocation comprising:
            based on the RF isolation satisfying an RF isolation threshold, at least one one of:
                designating the communication via the first wireless communication link to be in a first direction for a particular symbol time and designating the communication via the second wireless communication link to be in the first direction for the particular symbol time; or
                designating uplink sounding for the first wireless communication link to be time division multiplexed within a sub-frame.

7. The apparatus of claim 6, wherein the RF isolation satisfies the RF isolation threshold when the RF isolation is greater than an RF isolation threshold; and wherein the allocation comprises:
    designating the communication via the first wireless communication link to be in a first direction for a particular symbol time and designating the communication via the second wireless communication link to be in the first direction for the particular symbol time.

8. The apparatus of claim 6, wherein the RF isolation satisfies the RF isolation threshold when the RF isolation is less than an RF isolation threshold; and wherein the allocation comprises:
    designating uplink sounding for the first wireless communication link to be time division multiplexed within a sub-frame.

* * * * *